US012735597B2

(12) United States Patent
Huang et al.

(10) Patent No.: US 12,735,597 B2
(45) Date of Patent: Sep. 15, 2026

(54) PEROVSKITE INK FOR SCALABLE FABRICATION OF EFFICIENT AND STABLE PEROVSKITE MODULES

(71) Applicant: The University of North Carolina at Chapel Hill, Chapel Hill, NC (US)

(72) Inventors: Jinsong Huang, Chapel Hill, NC (US); Yehao Deng, Chapel Hill, NC (US)

(73) Assignee: THE UNIVERSITY OF NORTH CAROLINA AT CHAPEL HILL, Chapel Hill, NC (US)

(*) Notice: Subject to any disclaimer, the term of this patent is extended or adjusted under 35 U.S.C. 154(b) by 0 days.

(21) Appl. No.: 19/068,600

(22) Filed: Mar. 3, 2025

(65) Prior Publication Data

US 2025/0277127 A1 Sep. 4, 2025

Related U.S. Application Data

(62) Division of application No. 18/019,385, filed as application No. PCT/US2021/044380 on Aug. 3, 2021, now Pat. No. 12,264,253.

(Continued)

(51) Int. Cl.

| | |
|---|---|
| ***H10K 85/50*** | (2023.01) |
| ***C09D 11/033*** | (2014.01) |
| ***C09D 11/037*** | (2014.01) |
| ***C09D 11/52*** | (2014.01) |
| ***H01G 9/20*** | (2006.01) |

(Continued)

(52) U.S. Cl.

CPC ............ *C09D 11/52* (2013.01); *C09D 11/033* (2013.01); *C09D 11/037* (2013.01); *H01G 9/2068* (2013.01); *H10K 30/40* (2023.02); *H10K 85/50* (2023.02); *H10K 30/20* (2023.02); *H10K 30/50* (2023.02)

(58) Field of Classification Search

CPC ..... C09D 11/52; C09D 11/033; C09D 11/037; H01G 9/2068; H10K 30/40; H10K 85/50; H10K 30/20; H10K 30/50; H10K 85/30; H10F 10/19; H10F 19/40; Y02E 10/549

See application file for complete search history.

(56) References Cited

U.S. PATENT DOCUMENTS

| | | | |
|---|---|---|---|
| 9,880,458 B1 * | 1/2018 | Irwin .................... | C09D 11/52 |
| 12,264,253 B2 | 4/2025 | Huang et al. | |

FOREIGN PATENT DOCUMENTS

WO WO 2019/195194 A1 10/2019

OTHER PUBLICATIONS

Ma ("The Effect of Stoichiometry on the Stability of Inorganic Cesium Lead Mixed-Halide Perovskites Solar Cells") J. Phys. Chem. C 2017, 121, 19642-19649 (Year: 2017).*

(Continued)

*Primary Examiner* — Angelo Trivisonno

(74) *Attorney, Agent, or Firm* — ALSTON & BIRD LLP

(57) ABSTRACT

Described herein are non-stoichiometric perovskite ink solutions, comprising: a first composition of formula $FA_{1-x}Cs_xBX_3$; a second composition of CsX, FAX, $REX_3$, or $REX_2$; and one or more solvents; wherein x, X, RE, and B are as defined herein. Methods for preparing polycrystalline perovskite films using the non-stoichiometric ink solutions and the use of the films in large-size solar modules are additionally described.

17 Claims, 28 Drawing Sheets

Related U.S. Application Data

(60) Provisional application No. 63/060,451, filed on Aug. 3, 2020.

(51) Int. Cl.
*H10K 30/40* (2023.01)
*H10K 30/20* (2023.01)
*H10K 30/50* (2023.01)

(56) References Cited

OTHER PUBLICATIONS

Almora, O. et al., "Capacitive dark currents, hysteresis, and electrode polarization in lead halide perovskite solar cells," J. Phys. Chem. Lett., 6:1645-1652, (2015).

Bertoluzzi, L. et al., "Mobile ion concentration measurement and open-access band diagram simulation platform for halide perovskite solar cells," Joule, 4:109-127, (2020).

Bi, E. et al., "Efficient perovskite solar cell modules with high stability enabled by iodide diffusion barriers," Joule, 3:2748-2760, (2019).

Brivio, F. et al., "Thermodynamic origin of photoinstability in the CH3NH3Pb (I1—xBrx)3 hybrid halide perovskite alloy," J. Phys. Chem. Lett., 7:1083-1087, (2016).

Chen, B. et al., "Grain engineering for perovskite/silicon monolithic tandem solar cells with efficiency of 25.4%," Joule, 3:177-190, (2019).

Chen, Y. et al., "Interfacial contact passivation for efficient and stable cesium-formamidinium double-cation lead halide perovskite solar cells," Iscience, 23(100762):1-10, (Jan. 24, 2020).

De Wolf, S. et al., "Organometallic halide perovskites: sharp optical absorption edge and its relation to photovoltaic performance," J. Phys. Chem. Lett., 5:1035-1039, (2014).

Deng, Y. et al., "Reduced self-doping of perovskites induced by short annealing for efficient solar modules," Joule, 4:1949-160, (2020).

Deng, Y. et al., "Reduced Self-doping of Perovskites Induced by Short Annealing for Efficient Solar Modules," Joule, In press, (2020).

Deng, Y. et al., "Tailoring solvent coordination for high-speed, room-temperature blading of perovskite photovoltaic films," Science Advances, 5:eaax7537, (2019).

Di Girolamo, D. et al., "Ion migration-induced amorphization and phase segregation as a degradation mechanism in planar perovskite solar cells," Adv. Energy Mater., 10:2000310, (2020).

Domanski, K. et al., "Migration of cations induces reversible performance losses over day/night cycling in perovskite solar cells," Energy Environ. Sci., 10:604-613, (2017).

Draguta, S. et al., "Rationalizing the light-induced phase separation of mixed halide organic-inorganic perovskites," Nat. Commun., 8:200, (2017).

Du, M.-H., "Density functional calculations of native defects in CH3NH3PbI3: effects of spin-orbit coupling and self-interaction error," J. Phys. Chem. Lett., 6:1461-1466, (2015).

Eames, C. et al., "Ionic transport in hybrid lead iodide perovskite solar cells," Nat. Commun., 6:7497, (2015).

Eperon, G. E. et al., "Formamidinium lead trihalide: a broadly tunable perovskite for efficient planar heterojunction solar cells," Energy & Environmental Science, 7:982-988, (2014).

Fu, F. et al., "I2 vapor-induced degradation of formamidinium lead iodide based perovskite solar cells under heat-light soaking conditions," Energy Environ. Sci., 12:3074-3088, (2019).

Game, O. S. et al., "Ions matter: description of the anomalous electronic behavior in methylammonium lead halide perovskite devices," Adv. Funct. Mater., 27:1606584, (2017).

Hong, Z. et al., "Utilization of copper phthalocyanine and bathocuproine as an electron transport layer in photovoltaic cells with copper phthalocyanine/buckminsterfullerene heterojunctions: Thickness effects on photovoltaic performances," Thin Solid Films, 515:3019-3023, (2007).

Jahandar, M. et al., "High-performance CH3NH3PbI3-inverted planar perovskite solar cells with fill factor over 83% via excess organic/inorganic halide," ACS Appl. Mater. Interfaces, 9:35871-35879, (2017).

Jiang, Q. et al., "Surface passivation of perovskite film for efficient solar cells," Nat. Photon., 13:460-466, (2019).

Jung, E. H. et al., "Efficient, stable and scalable perovskite solar cells using poly (3-hexylthiophene)," Nature, 567:511-515, (2019).

Khenkin, M. V. et al., "Consensus statement for stability assessment and reporting for perovskite photovoltaics based on ISOS procedures," Nature Energy, 5:35-49 (2020).

Kim, G. Y. et al., "Large tunable photoeffect on ion conduction in halide perovskites and implications for photodecomposition," Nat. Mater., 17:445-449, (2018).

Lee, J. W. et al., "Formamidinium and cesium hybridization for photo- and moisture-stable perovskite solar cell," Adv. Energy Mater., 5:1501310, (2015).

Lee, J.-W. et al., "2D Perovskite stabilized phase-pure formamidinium perovskite solar cells," Nat. Commun., 9:3021, (2018).

Lee, M. M. et al., Efficient hybrid solar cells based on meso-superstructured organometal halideperovskites, Science, 338:643-647, (2012).

Li, Z. et al., "Stabilizing perovskite structures by tuning tolerance factor: formation of formamidinium and cesium lead iodide solid-state alloys," Chem. Mater., 28:284-292, (2016).

Lin, Y. et al., "Excess charge-carrier induced instability of hybrid perovskites," Nat. Commun., 9:4981, (2018).

Motti, S. G. et al., "Controlling competing photochemical reactions stabilizes perovskite solar cells," Nat. Photon., 13:532-539, (2019).

Rong, Y. et al., "Challenges for commercializing perovskite solar cells," Science 361:eaat8235 (2018).

Slotcavage, D. J. et al., "Light-induced phase segregation in halide-perovskite absorbers," ACS Energy Lett., 1:1199-1205, (2016).

Son, D.-Y. et al., "Self-formed grain boundary healing layer for highly efficient CH3NH3PbI3 perovskite solar cells," Nat. Energy, 1:1-8, (2016).

Tao, S. et al., "Absolute energy level positions in tin- and lead-based halide perovskites," Nat. Commun., 10:2560, (2019).

Troughton, J. et al., "Cs0.15FA0.85PbI3 perovskite solar cells for concentrator photovoltaic applications," Journal of Materials Chemistry A, 6(44):21913-21917, (2018).

Turren-Cruz, S.-H. et al., "Methylammonium-free, high-performance, and stable perovskite solar cells on a planar architecture," Science 362: 449-453 (2018).

Van Brackle, C.H., "Understanding and controlling the optoelectronic properties of hybrid perovskites for photovoltaics," PhD Thesis, The University of North Carolina Chapel Hill, pp. 19-20, 24, abstract, (Aug. 17, 2020).

Wang, L. et al., "A Eu3+-Eu2+ ion redox shuttle imparts operation durability to Pb—I perovskite solar cells," Science, 363:265-270, (2019).

Wang, Y. et al., "Stabilizing heterostructures of soft perovskite semiconductors," Science, 365:687-691,(2019).

Wu, W. Q. et al., "Blading Phase-Pure Formamidinium-Alloyed Perovskites for High-Efficiency Solar Cells with Low Photovoltage Deficit and Improved Stability," Advanced Materials, 2000995, (2020).

Xiao, Z. et al., "Unraveling the hidden function of a stabilizer in a precursor in improving hybrid perovskite film morphology for high efficiency solar cells," Energy & Environmental Science, 9:867-872, (2016).

Yang, S.. et al., "Stabilizing halide perovskite surfaces for solar cell operation with wide-bandgap lead oxysalts," Science, 365:473-478, (2019).

Zheng, X. et al., "Managing grains and interfaces via ligand anchoring enables 22.3%-efficiency inverted perovskite solar cells," Nature Energy, 5:131-140, (2020).

Zhou, Y. et al., "Defect activity in lead halide perovskites," Adv. Mater., 31:1901183, (2019).

(56) References Cited

OTHER PUBLICATIONS

U.S. Appl. No. 18/019,385, Non-Final Office Action mailed May 8, 2024.
U.S. Appl. No. 18/019,385, Notice of Allowance and Fee(s) Due mailed Mar. 4, 2025.
WIPO Application No. PCT/US2021/044380, PCT International Preliminary Report on Patentability mailed Feb. 16, 2023.
WIPO Application No. PCT/US2021/044380, PCT International Search Report and Written Opinion of the International Searching Authority mailed Nov. 22, 2021.

* cited by examiner

A
Current (mA)
Voltage (V)
29.5 cm$^2$
44.4 cm$^2$
NREL

B
Quantum efficiency (%)
Wavelength (nm)
NREL

C

D
Norm. PCE
85 °C/85% humidity
Time (h)

Norm. PCE
One sun illumination, near MPP
Time (h)

Perovskite submodule

Device ID: #4 Device temperature: 25.1 ± 0.2 °C

11:58 AM 6/1/2020 Device area: 29.539 $cm^2$ ± 0.0%

Spectrum: ASTM G173 global Irradiance: 1000.0 $W/m^2$ $V_{oc}$ = 8.715 ± 0.021 V $I_{sc}$ = 83.59 ± 0.98 mA $J_{sc}$ = 2.830 ± 0.033 $mA/cm^2$ Fill Factor = (75.41 ± 0.97) %

$I_{max}$ = 77.92 ± 0.91 mA $V_{max}$ = 7.050 ± 0.024 V $P_{max}$ = 0.5493 ± 0.0066 W Efficiency = (18.60 ± 0.22) %

'K' Thermocouple at edge of glass under Al foil

Elapsed time: 690 s. Cool gun blowing across top. Asymptotic IV

Perovskite submodule

Device ID: #2
1:56 PM 5/29/2020
Spectrum: ASTM G173 global

Device temperature: 24.6 ± 0.2 °C
Device area: 44.378 $cm^2$ ± 0.0%
Irradiance: 1000.0 $W/m^2$ $V_{oc}$ = 12.908 ± 0.043 V
$I_{sc}$ = 81.20 ± 0.44 mA
$J_{sc}$ = 1.8297 ± 0.0100 $mA/cm^2$
Fill Factor = (76.20 ± 0.73) %

$I_{max}$ = 75.70 ± 0.42 mA
$V_{max}$ = 10.551 ± 0.098 V
$P_{max}$ = 0.7987 ± 0.0058 W
Efficiency = (18.00 ± 0.13) %

K-type thermocouple at edge of glass under Al foil
Elapsed time: 924 s.

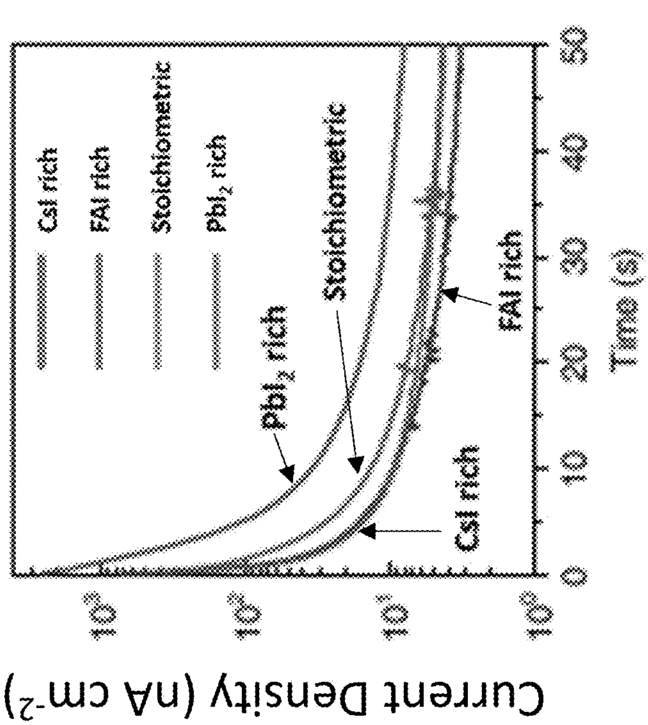
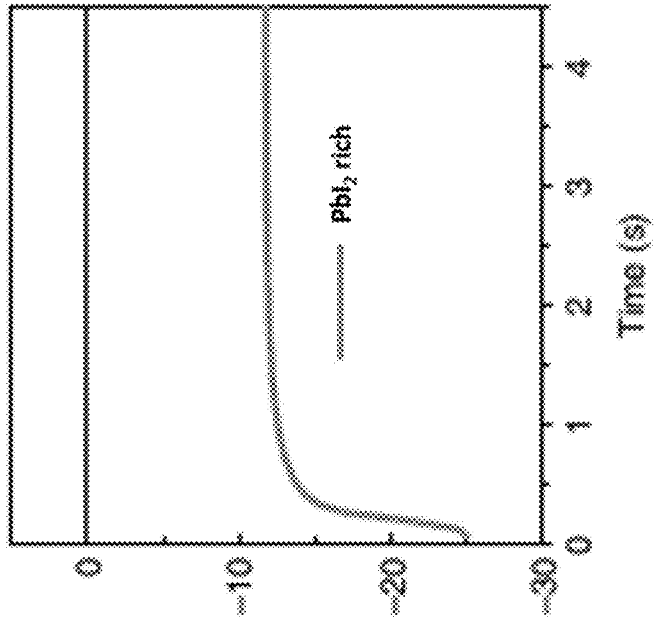
Fig. 13

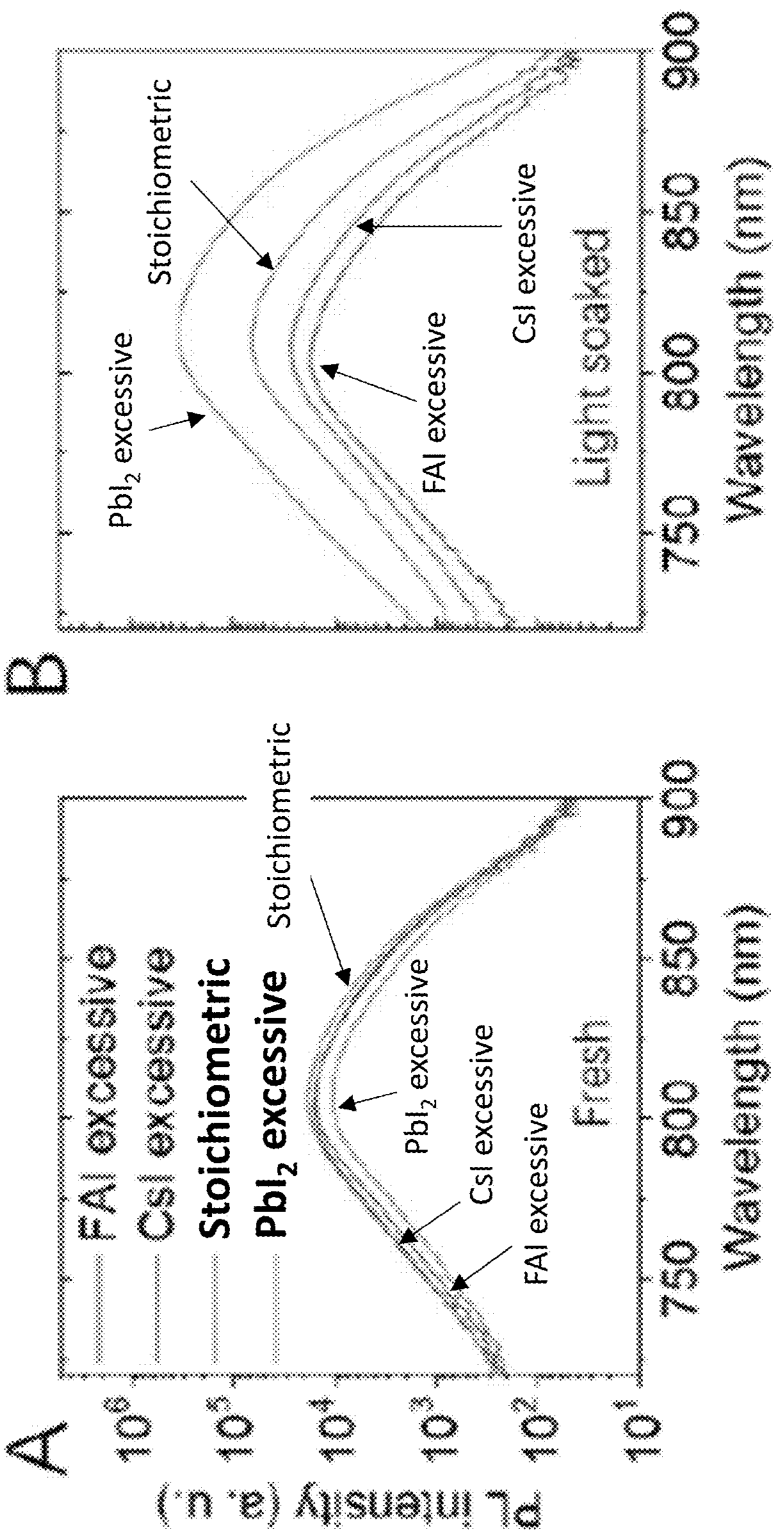
Figs. 21A-B

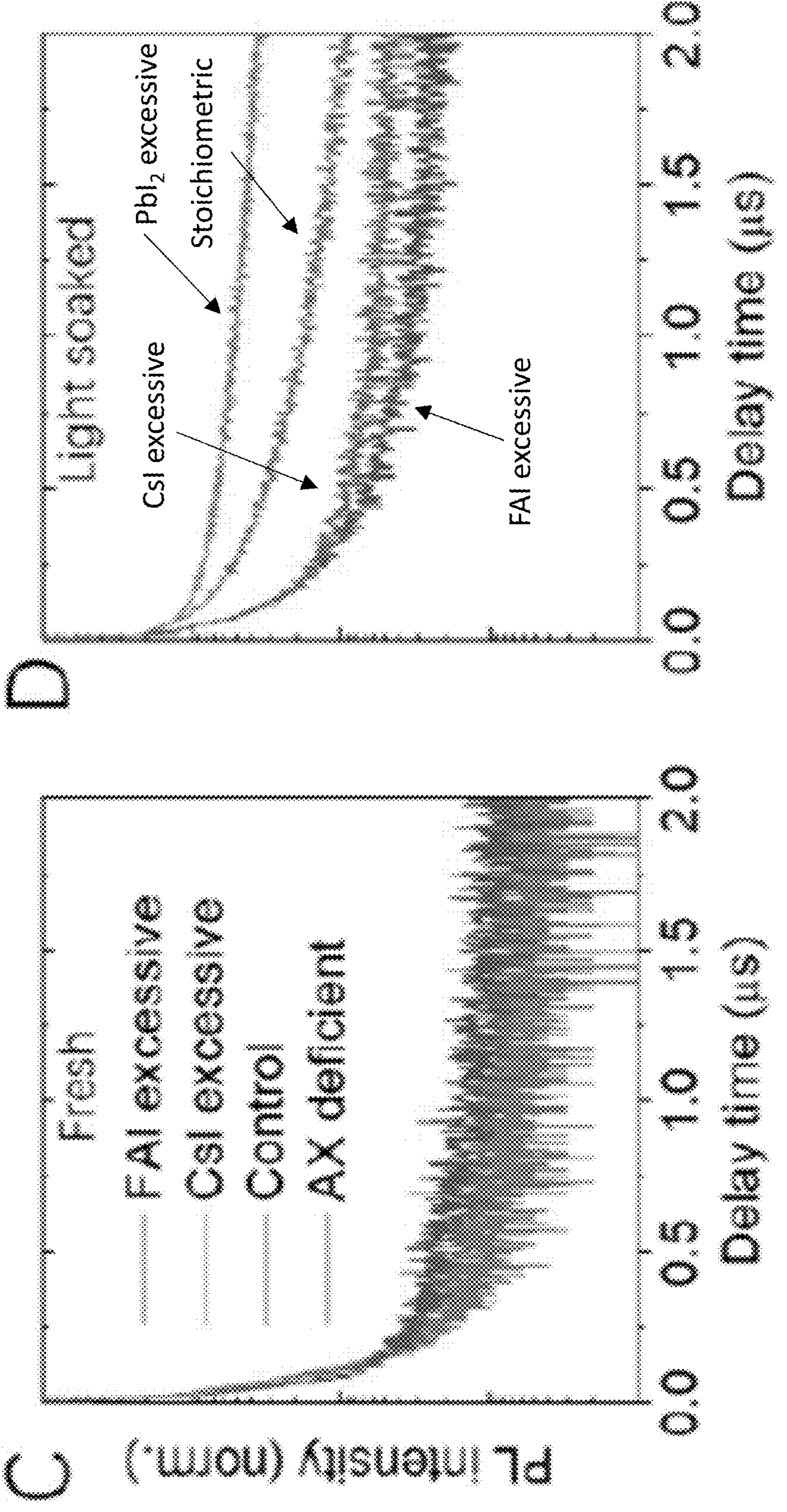
Figs. 21C-D

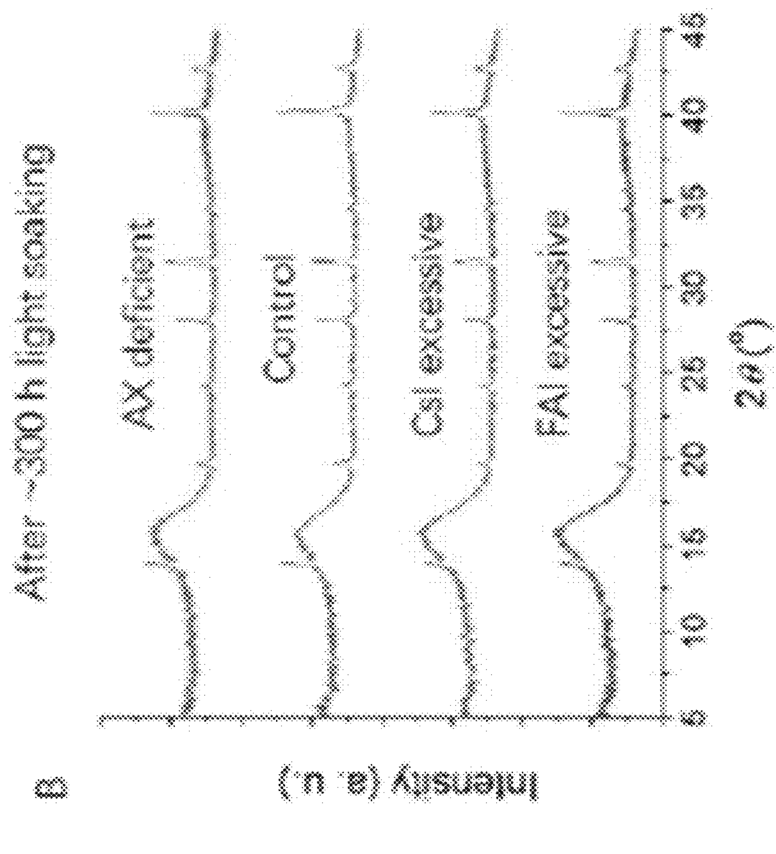
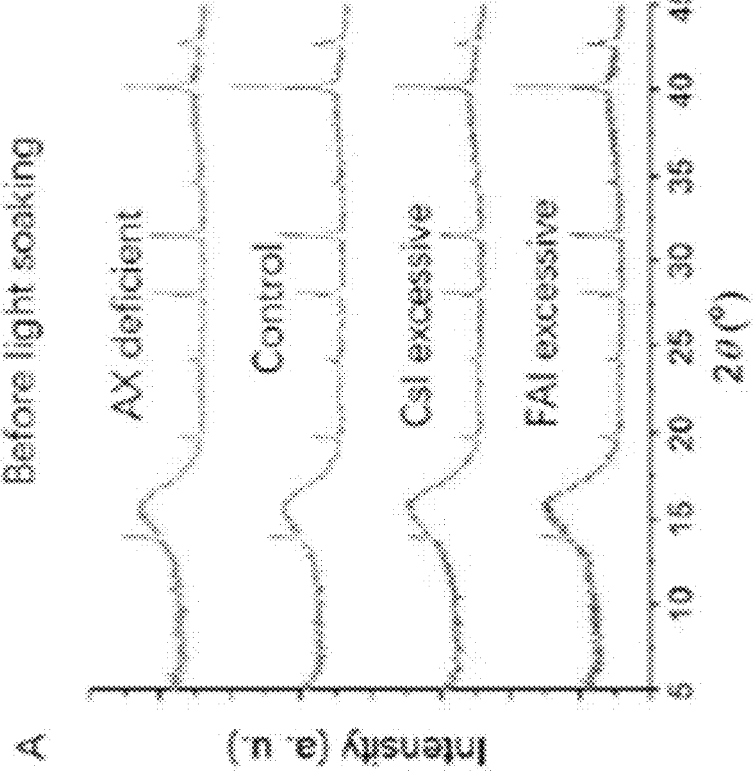
Fig. 23

PEROVSKITE INK FOR SCALABLE FABRICATION OF EFFICIENT AND STABLE PEROVSKITE MODULES

CROSS-REFERENCE TO RELATED APPLICATIONS

This application is a division of U.S. patent application Ser. No. 18/019,385, filed Feb. 2, 2023, which is a national phase entry of International Application No. PCT/US2021/044380, filed Aug. 3, 2021, which claims the benefit of priority to U.S. Provisional Application No. 63/060,451, filed Aug. 3, 2020, each of which is herein incorporated by reference in its entirety for all purposes.

FIELD OF THE INVENTION

The presently disclosed subject matter relates generally to non-stoichiometric perovskite ink solutions. The non-stoichiometric ink solutions can be used in the fabrication of polycrystalline films for use in photovoltaic or photoactive devices.

BACKGROUND

The efficiency of small area single junction metal halide perovskite (MHP) solar cells has surpassed 25% and that of tandem junction solar cells incorporating silicon has surpassed 29%.[1] However, the stability of perovskite photovoltaics is still the bottle neck that slows down their pace to commercialization.[2,3] Though studies report small area perovskite solar cells with promising long-term stability, ways to improve the stability of large area solar modules by scalable fabrication remains the greater challenge.[4-8] It is desirable to enhance the intrinsic stability of perovskite films for improving fabrication reproducibility in a high throughput solar panel manufacturing line without increasing the cost.

The composition of the perovskite film in the device influences the thermodynamic stability upper limit. However, the film formation dynamics also play a role, as defect formation is sensitive to the film growth process. Several investigations have been conducted to tune the composition of $ABX_3$ MHP for both enhanced efficiency and stability in photovoltaic devices, many with little success. There exists a need in the art for the economic and scalable application of stable perovskite compositions to large area solar modules. The subject matter described herein addresses this unmet need.

BRIEF SUMMARY

In one aspect, the presently disclosed subject matter is directed to a non-stoichiometric perovskite ink solution comprising:

a) a first composition of formula $FA_{1-x}Cs_xBX_3$,
  wherein,
  FA is formamidinium;
  x is between 0 and 1;
  B is at least one metal cation;

b) a second composition of CsX, FAX, $REX_3$, or $REX_2$;
  wherein RE is a rare earth ion; and
  X, in each instance, is at least one halide;

and;

c) two or more solvents selected from the group consisting of dimethyl sulfoxide, dimethylformamide, N,N-dimethylpropyleneurea, N-methyl-2-pyrrolidone, dimethylacetamide, formamide, γ-butyrolactone, 2-methoxyethanol, and acetonitrile In another aspect, the presently disclosed subject matter is directed to a non-stoichiometric perovskite ink solution comprising:

a) a first composition of formula $FA_{1-x}Cs_xBX_3$,
  wherein,
  FA is formamidinium;
  x is between 0 and 1;
  B is at least one metal cation;

b) a second composition of CsX, FAX, $REX_3$, or $REX_2$; wherein said second composition is present in a molar ratio of about 0.01 mol % to about 10 mol % relative to said first composition;
  X, in each instance, is at least one halide; and
  RE is a rare earth ion;

and c) one or more solvents.

In another aspect, the presently disclosed subject matter is directed to a method of preparing a non-stoichiometric perovskite ink solution comprising, contacting a first precursor ink solution with a second precursor ink solution, wherein:

said first precursor ink solution comprises:
  a) a first composition of $CsBX_3$;
  b) at least one solvent selected from the group consisting of dimethyl sulfoxide, N,N-dimethylpropyleneurea, N-methyl-2-pyrrolidone, dimethylacetamide, formamide, and dimethylformamide; and
  c) optionally, a second composition of CsX, FAX, $REX_3$, or $REX_2$;

said second precursor ink solution comprises:
  d) a third composition of $FABX_3$;
  e) at least one solvent selected from the group consisting of γ-butyrolactone, 2-methoxyethanol, and acetonitrile; and
  f) optionally, a fourth composition of FAX, CsX, $REX_3$, or $REX_2$;
    wherein,
    FA is formamidinium;
    B, in each instance, is at least one metal cation;
    X, in each instance, is at least one halide; and
    RE is a rare earth ion;

wherein:

i. said first precursor ink solution comprises said second composition; or ii. said second precursor ink solution comprises said fourth composition;

or, iii. wherein said first precursor ink solution does not comprise said second composition and said second precursor ink solution does not comprise said fourth composition, and prior to preparing said non-stoichiometric perovskite ink solution, a mixed precursor ink solution is prepared, comprising:
  contacting said first precursor ink solution with said second precursor ink solution to prepare said mixed precursor ink solution, and contacting a fifth composition of FAX, CsX, $REX_3$, or $REX_2$ with said mixed precursor ink solution to prepare said non-stoichiometric perovskite ink solution.

In another aspect, the subject matter described herein is directed to methods for producing polycrystalline films using the non-stoichiometric ink solutions described herein.

In another aspect, the subject matter described herein is directed to a non-stoichiometric polycrystalline film comprising:

a) a first composition of formula $FA_{1-x}Cs_xBX_3$;

wherein,

FA is formamidinium;

x is between 0 and 1.0;

B is at least one metal cation; and b) a second composition of CsX, FAX, $REX_3$, or $REX_2$;

wherein RE is a rare earth ion; and

X, in each instance is at least one halide, and, wherein said film comprises said second composition of CsX, FAX, $REX_3$, or $REX_2$ in about a 0.01 mol % to about 10 mol % ratio relative to said first composition of formula $FA_{1-x}Cs_xBX_3$.

In another aspect, the subject matter described herein is directed to solar cells and solar modules comprising the films prepared using the non-stoichiometric ink solutions described herein.

In certain embodiments, the subject matter described herein is directed to a kit, comprising:

a) a first vial comprising a first precursor solution comprising:

a composition of formula $CsBX_3$;

at least one solvent selected from the group consisting of dimethyl sulfoxide, dimethylformamide, N,N-dimethylpropyleneurea, N-methyl-2-pyrrolidone, dimethylacetamide, formamide; and optionally, a composition of CsX, FAX, $REX_3$, or $REX_2$;

b) a second vial comprising a second precursor solution comprising:

a composition of formula $FABX_3$;

at least one solvent selected from the group consisting of γ-butyrolactone, 2-methoxyethanol, and acetonitrile; and optionally, a composition of CsX, FAX, $REX_3$, or $REX_2$;

wherein, FA is formamidinium;

RE is a rare earth ion;

B is at least one metal cation; and

X, in each instance is at least one halide;

wherein said first vial or said second vial comprises said composition of CsX, FAX, $REX_3$, or $REX_2$; and c) instructions for use.

These and other aspects are described herein.

BRIEF DESCRIPTION OF THE DRAWINGS

FIG. 1A shows an illustration of a scalable fabrication of non-stoichiometric, methylammonium free perovskite thin film.

FIG. 1B shows a photo of an as-deposited perovskite film and the illustration of the film's chemical composition and crystal structure.

FIG. 1C shows scanning electron microscopy images of perovskite films with different compositions.

FIG. 1D shows X-ray diffraction patterns of perovskite films with different compositions. The indices indicate that these diffraction peaks belong to a pure perovskite phase without yellow phases of $CsPbI_3$ and $FaPbI_3$.

FIG. 13 shows transient JSC of the degraded $PbI_2$ excessive device, which was preilluminated at VOC conditions for several seconds before the measurement started (left). Also shown are transient ion-migration currents of fresh devices before long-term light soaking after a 30 s, 1.5 V forward bias applied to the devices was removed (right).

FIG. 21 shows plots of photoluminescence studies of FACs-perovskite solar cells before and after light soaking. Photoluminescence (A-B) and time resolved photoluminescence spectra (C-D) of FACs-perovskite devices with different compositions before and after light soaking. The devices were kept at open circuit conditions during the measurements.

FIG. 23 shows XRD patterns of FACs-perovskites with different compositions before (left-hand image, A) and after (right-hand image, B) light-soaking. The bump at around 150 is due to scattering of polymer used for encapsulation.

DETAILED DESCRIPTION

Figure 2:
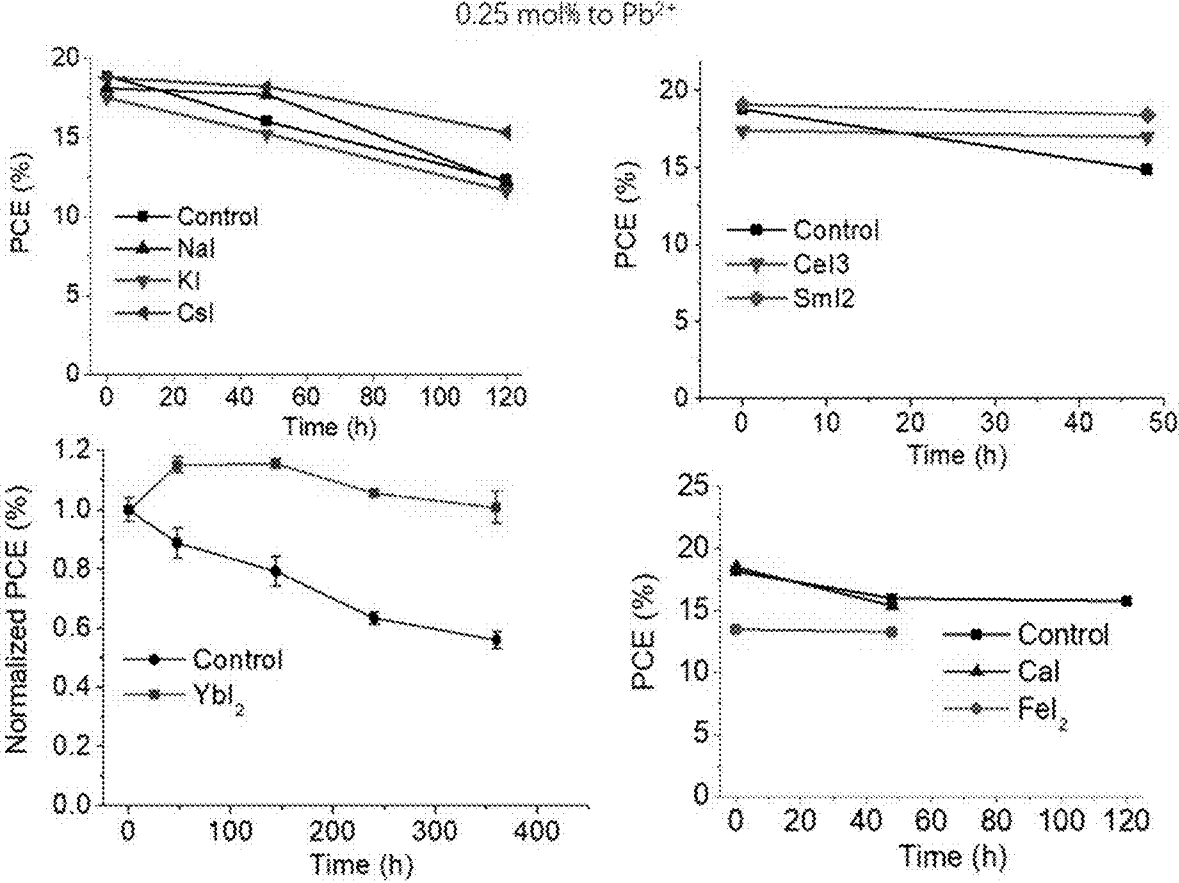
FIG. 2 shows the light stability of FAC-based perovskites with different metal ion additives.

The subject matter described herein relates to ink solutions comprising non-stoichiometric perovskite compositions and strategies for their deposition through scalable blading to enhance the efficiency and stability of perovskite-based solar cells and modules. It is generally known in the art that MA-containing perovskites can experience instability issues due to their volatile nature; conversely, CsFA (FA: Formamidinium; Cs: Cesium (FACs)) perovskites are more stable under heat and illumination.[4] Additionally, mixed CsFA perovskites offer further efficiency for solar cell applications due to their tunable bandgaps for single-junction solar cells. However, FACs perovskite devices with enhanced photostability have not been achieved. Without wishing to be bound by theory, it is understood that iodide migration can occur in these devices. Light-induced phase segregation of FACs perovskites has been observed, which is similar to phase segregation in mixed-halide perovskites[12a,13a]. Blade coating FACs perovskites using established methods for $MAPbI_3$ present many challenges due to the low solubility of cesium-containing precursors and complicated crystallization dynamics, which can generate $FAPbI_3$ and $CsPbI_3$ yellow phases[14a,15a].

The methods described herein overcome the FACs fabrication challenges found in the art. The methods described herein are directed to high-throughput blading methylammonium-free perovskites, which contain both formamidinium (FA) and cesium (Cs) cations, without the introduction of additional fabrication steps. By adding extra A site ions through the addition of CsX, FAX, $REX_3$, or $REX_2$ (RE is rare earth, X is halide) to the precursor perovskite ink, the stability of the perovskite films under illumination improves. The perovskite films exhibit no photoluminescence deterioration after being illuminated under one sun light intensity for over 600 h, and a module with an aperture area of about 50 $cm^2$ maintained 92% of its initial efficiency after continuous operation for over 1100 h at elevated temperature of 45-50° C. Addition of AX also enhances the efficiency of perovskite cells and modules. As shown herein, the efficiency of perovskite modules reached a value of 18.6% certified by NREL (National Renewable Energy Laboratory) for an aperture area of about 30 $cm^2$. Furthermore, the methods described herein enable large area MA-free perovskite films without resorting to complicated heating or other processes. The methods described herein are fully compatible with industrial sheet-to-sheet or roll-to-roll manufacturing, thereby allowing for reliable fabrication of stable perovskite solar modules for commercialization.

The presently disclosed subject matter will now be described more fully hereinafter. However, many modifications and other embodiments of the presently disclosed subject matter set forth herein will come to mind to one skilled in the art to which the presently disclosed subject matter pertains having the benefit of the teachings presented in the foregoing descriptions. Therefore, it is to be understood that the presently disclosed subject matter is not to be limited to the specific embodiments disclosed and that modifications and other embodiments are intended to be included within the scope of the appended claims. In other words, the subject matter described herein covers all alternatives, modifications, and equivalents. Unless otherwise defined, all technical and scientific terms used herein have the same meaning as commonly understood by one of ordinary skill in this field. All publications, patent applications, patents, and other references mentioned herein are incorporated by reference in their entirety. In the event that one or more of the incorporated literature, patents, and similar materials differs from or contradicts this application, including but not limited to defined terms, term usage, described techniques, or the like, this application controls.

I. Definitions

As used herein, "and/or" refers to and encompasses any and all possible combinations of one or more of the associated listed items, as well as the lack of combinations when interpreted in the alternative ("or").

As used herein, the term "about," when referring to a measurable value such as an amount of a compound or agent of the current subject matter, dose, time, temperature, and the like, is meant to encompass variations of ±20%, ±10%, ±5%, ±1%, ±0.5%, or even ±0.1% of the specified amount.

The terms "approximately," "about," "essentially," and "substantially" as used herein represent an amount close to the stated amount that still performs a desired function or achieves a desired result. For example, in some embodiments, as the context may dictate, the terms "approximately", "about", and "substantially" may refer to an amount that is within less than or equal to 10% of the stated amount. The term "generally" as used herein represents a value, amount, or characteristic that predominantly includes or tends toward a particular value, amount, or characteristic.

As used herein, the terms "power conversion efficiency," "PCE," "photovoltaic efficiency", and "solar cell efficiency," may be used interchangeably and refer to the ratio of energy output from the photovoltaic device to the energy input to the photovoltaic device. The energy output is in the form of electrical energy and energy input is in the form of electromagnetic radiation (e.g., sunlight). Unless otherwise indicated, the photovoltaic efficiency refers to terrestrial photovoltaic efficiency, corresponding to AM1.5 conditions, where AM is Air Mass. PCE may be measured by one or more techniques conventionally known to one of ordinary skill in the art.

As used herein, the term "illumination equivalent to 1 sun" refers to an illumination (radiation) intensity and/or electromagnetic spectrum of illumination that substantially approximates or is substantially equivalent to terrestrial solar intensity and/or electromagnetic spectrum.

As used herein, conditional language used herein, such as, among others, "can," "could," "might," "may," "e.g.," and the like, unless specifically stated otherwise or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

In certain embodiments, "contacting" refers to allowing one precursor solution to be contacted with another precursor solution. The contact may or may not be facilitated by mixing, agitating, stirring, and the like. In other embodiments, "contacting" refers to allowing a perovskite ink solution to contact a substrate so as to form a film.

As used herein, "FA" refers to the formamidinium ion, having the structure formula, $[H_2NCHNH_2]^+$.

As used herein, "non-stoichiometric" refers to a compound, or ink solution comprising a compound having an elemental composition whose properties cannot be represented by a ratio of numbers, such that a percentage of atoms are either missing or too many atoms are packed into the otherwise ideal lattice structure.

As used herein, "AX deficient" refers to a perovskite composition comprising excess $PbI_2$. "AX deficient" and "$PbI_2$ excessive" are used interchangeably herein when referring to perovskite compositions.

As used herein, "control" perovskite compositions refer to compositions that do not comprise excessive AX, or are not "AX deficient". "Control" and "stoichiometric" are used interchangeably herein.

As used herein, "AX excess" or "AX excessive" refers to a perovskite composition comprising excess CsI, $REI_2$, $REI_3$, or FAI. In embodiments, such compositions are interchangeably referred to as "CsI rich" or "FAI rich" compositions.

As used herein, "active layer" refers to a photoactive layer in a device, such as a solar cell, and/or it may include a photoactive material. Furthermore, it should be noted that the use of the term "active layer" is in no way meant to restrict or otherwise define, explicitly or implicitly, the properties of any other layer in the device.

As used herein, when an element such as a layer, a film, a region, or a substrate is referred to as being "on" another element, it can be directly on the other element, or an intervening element may also be present. In contrast, when an element is referred to as being "directly on" another element, there are no intervening elements present.

II. Non-Stoichiometric Polycrystalline Perovskite Films

In one aspect, the subject matter described herein is directed to a polycrystalline perovskite film, wherein the films comprises:

a) a first composition of formula $FA_{1-x}Cs_xBX_3$;
   wherein,
   FA is formamidinium;
   x is between 0 and 1.0;
   B is at least one metal cation; and
b) a second composition of CsX, FAX, $REX_3$, or $REX_2$;
   wherein, RE is a rare earth ion; and
   X, in each instance is at least one halide;

and, wherein said film comprises said second composition of CsX, FAX, $REX_3$, or $REX_2$ in about a 0.01 mol % to about 10 mol % ratio relative to said first composition of formula $FA_{1-x}Cs_xBX_3$.

In certain embodiments of the non-stoichiometric polycrystalline film, B comprises at least one divalent ($B^{+2}$) metal atom. The divalent metal (B) can be, for example, one or more divalent elements from Group 14 of the Periodic Table (e.g., divalent lead, tin, or germanium), one or more divalent transition metal elements from Groups 3-12 of the Periodic Table (e.g., divalent titanium, vanadium, chromium, manganese, iron, cobalt, nickel, copper, zinc, palladium, platinum, and cadmium), and/or one or more divalent alkaline earth elements (e.g., divalent magnesium, calcium, strontium, and barium). In certain embodiments, B is selected from the group consisting of lead, tin, cadmium, germanium, zinc, nickel, platinum, palladium, mercury, titanium, silicon, and a mixture thereof. In a preferred embodiment, B is lead.

In certain embodiments of the non-stoichiometric polycrystalline film, x is between 0.01 and 0.50, 0.35 and 0.75, 0.25 and 0.85, 0.01 and 0.10, 0.05 and 0.15, 0.07 and 0.35, 0.05 and 0.45, 0.15 and 0.50, 0.25 and 0.35, 0.20 and 0.30, 0.01 and 0.08, or 0.07 and 0.10. In certain embodiments, x is about 0.01, 0.02, 0.03, 0.04, 0.05, 0.06, 0.07, 0.08, 0.09, 0.10, 0.11, 0.12. 0.13, 0.14, or 0.15.

In certain embodiments of the non-stoichiometric polycrystalline film, the rare earth ion is selected from the group consisting of samarium, europium, terbium, cerium, and ytterbium. In certain embodiments, the rare earth ion is samarium or ytterbium.

In certain embodiments of the non-stoichiometric polycrystalline film, the variable X, in each instance, is independently selected from one or a combination of halide atoms, wherein the halide atom (X) may be, for example, fluoride ($F^-$), chloride ($Cl^-$), bromide ($Br^-$), and/or iodide ($I^-$). In certain embodiments of the non-stoichiometric polycrystalline film, X in said composition of $FA_{1-x}Cs_xBX_3$ is $I^-$. In certain embodiments of the non-stoichiometric polycrystalline film, X in said composition of CsX is I. In certain embodiments of the non-stoichiometric polycrystalline film, X in said composition of FAX is $I^-$. In a preferred embodiment, X, in each instance, is $I^-$. In certain embodiments, X in said composition of $REX_3$ or $REX_2$ is $I^-$. Non-limiting examples of $REX_2$ and $REX_3$ are $SmI_2$, $CeI_3$, or $YbI_2$.

In certain embodiments of the non-stoichiometric polycrystalline film, x is between 0.01 and 0.10, 0.05 and 0.15, 0.07 and 0.35, 0.05 and 0.45, 0.15 and 0.50, 0.25 and 0.35, 0.20 and 0.30, 0.01 and 0.08, or 0.07 and 0.10. In certain embodiments, x is about 0.01, 0.02, 0.03, 0.04, 0.05, 0.06, 0.07, 0.08, 0.09, 0.10, 0.11, 0.12. 0.13, 0.14, or 0.15.

In certain embodiments of the non-stoichiometric polycrystalline film, the composition of $FA_{1-x}Cs_xBX_3$ is $FA_{0.92}Cs_{0.08}PbI_3$.

In certain embodiments of the non-stoichiometric polycrystalline film, the second composition is FAX or CsX. In certain embodiments of the non-stoichiometric polycrystalline film, the second composition is FAI or CsI.

In certain embodiments of the non-stoichiometric polycrystalline film, the film has an area of at least 25 $cm^2$. In certain embodiments of the non-stoichiometric polycrystalline films, the film has an area of at least 1 $cm^2$, 2 $cm^2$, 3 $cm^2$, 4 $cm^2$, 5 $cm^2$, 7 $cm^2$, 10 $cm^2$, 12 $cm^2$, 15 $cm^2$, 17 $cm^2$, 20 $cm^2$, 22 $cm^2$, 25 $cm^2$, 26 $cm^2$, 27 $cm^2$, 28 $cm^2$, 29 $cm^2$, 30 $cm^2$, 31 $cm^2$, 32 $cm^2$, 33 $cm^2$, 34 $cm^2$, 35 $cm^2$, 36 $cm^2$, 37 $cm^2$, 38 $cm^2$, 39 $cm^2$, 40 $cm^2$, 41 $cm^2$, 42 $cm^2$, 43 $cm^2$, 44 $cm^2$, 45 $cm^2$ 50 $cm^2$, 55 $cm^2$, 60 $cm^2$, 75 $cm^2$, 80 $cm^2$, 81 $cm^2$, 82 $cm^2$, 83 $cm^2$, 84 $cm^2$, 85 $cm^2$, 86 $cm^2$, 87 $cm^2$, 88 $cm^2$, 89 $cm^2$, 90 $cm^2$, 95 $cm^2$, 100 $cm^2$, 125 $cm^2$, 150 $cm^2$, 200 $cm^2$, 225 $cm^2$, 250 $cm^2$, 275 $cm^2$, 300 $cm^2$, 325 $cm^2$, or 350 $cm^2$.

In certain embodiments of the non-stoichiometric polycrystalline film, said second composition is added to said ink solution at about a 0.01 mol % to about 10 mol % relative to said first composition. In certain embodiments of the non-stoichiometric ink solution, said second composition is added to said ink solution at about a 0.01 mol % to about 2 mol %, about 0.10 mol % to about 5 mol %, about 0.5 mol % to about 3 mol %, about 1 mol % to about 9 mol %, about 0.01 mol % to about 0.10 mol %, about 0.01 mol % to about 0.50 mol %, about 0.10 mol % to about 0.25 mol %, about 0.15 mol % to about 1.0 mol %, about 0.50 mol % to about 2.0 mol %, about 0.50 mol % to about 1.0 mol %, about 0.35 mol % to about 0.75 mol %, about 0.50 mol % to about 1.50 mol %, about 0.80 mol % to about 1.25 mol %, about 1.0 mol % to about 2.0 mol %, about 0.65 mol % to about 2.0 mol %, or about 0.75 mol % to about 1.75 mol % relative to said first composition. In certain embodiments, the second composition is added to said ink solution at about a 0.05 mol %, 0.10 mol %, 0.15 mol %, 0.16 mol %, 0.17 mol %, 0.18 mol %, 0.19 mol %, 0.20 mol %, 0.21 mol %, 0.22 mol %, 0.23 mol %, 0.24 mol %, 0.25 mol %, 0.26 mol %, 0.27 mol %, 0.28 mol %, 0.29 mol %, 0.30 mol %, 0.31 mol %, 0.32 mol %, 0.33 mol %, 0.34 mol %, 0.35 mol %, 0.36 mol %, 0.37 mol %, 0.38 mol %, 0.39 mol %, 0.40 mol %, 0.41 mol %, 0.42 mol %, 0.43 mol %, 0.44 mol %, 0.45 mol %, 0.50 mol %, 0.6 mol %, 0.65 mol %, 0.7 mol %, 0.75 mol %, 0.8 mol %, 0.85 mol %, 0.9. mol %, 0.95 mol %, 1.0 mol %, 1.05 mol %, 1.10 mol %, 1.15 mol %, 1.20 mol %, 1.25 mol %, 1.30 mol %, 1.35 mol %, 1.40 mol %, 1.45 mol %, 1.50 mol %, 1.55 mol %, 1.60 mol %, 1.65 mol %, 1.70 mol %, 1.75 mol %, 1.80 mol %, 1.85 mol %, 1.90 mol %, 1.95 mol %, 2.0 mol %, 2.5 mol %, 3 mol %, 3.5 mol %, 4 mol %, 4.5 mol %, 5.0 mol %, 5.5 mol %, 6.0 mol %, 6.5 mol %, 7.0 mol %, 7.5 mol %, 8.0 mol %, 8.5 mol %, 9.0 mol %, 9.5 mol %, or 10.0 mol % relative to said first composition.

In certain embodiments, the non-stoichiometric polycrystalline films described herein have a film thickness in the range of about 10 nm to about 1 cm. In certain embodiments, the non-stoichiometric polycrystalline films have a thickness of about 300 nm to about 1000 nm. In certain embodiments, the non-stoichiometric polycrystalline films have a thickness in the range of about 80 nm to about 300 nm. In certain embodiments, the non-stoichiometric polycrystalline films have a thickness in the range of about 0.1 mm to about 50 mm. In certain embodiments, the non-stoichiometric polycrystalline films have a thickness in the range of about 100 nm to about 1000 nm. In certain embodiments, the non-stoichiometric polycrystalline films have a film thickness of about, at least, above, up to, or less than, for example, 200 nm, 300 nm, 400 nm, 500 nm, 600 nm, 700 nm, 800 nm, 900 nm, 1000 nm (1 μm), 2 μm, 3 μm, 4 μm, 5 μm, 6 μm, 7 μm, 8 μm, 9 μm, or 10 km.

The non-stoichiometric polycrystalline films described herein have an average grain size of about 10 nm to about 1 mm. In certain embodiments, the non-stoichiometric polycrystalline films have an average grain size of about, at least, or above 0.01 μm, 10 μm, 20 μm, 30 μm, 40 μm, 50 μm, 60 μm, 70 μm, 80 μm, 90 μm, 100 μm, 120 μm, 150 μm, 180 μm, 200 μm, 220 μm, 250 μm, 280 μm, 300 μm, 350 μm, 400 μm, 450 μm, 500 μm, 550 μm, 600 μm, 650 μm, 700 μm, 800 μm, 850 μm, 900 μm, 1000 μm, or an average grain size within a range bounded by any two of the foregoing exemplary values. It is generally known in the art that large grain sizes are suitable for films in photoactive or photovoltaic applications.

In certain embodiments, the perovskite film further comprises one or more additives selected from the group consisting of formamidinium chloride, phenylethylammonium chloride, and formamidinium hypophosphite. In certain embodiments, the perovskite film further comprises all three additives. In certain embodiments, the perovskite film further comprises formamidinium chloride in a molar percentage of about 1-2% relative to the first composition. In certain embodiments, the perovskite film further comprises formamidinium chloride in a molar percentage of about 1.5% relative to the first composition. In certain embodiments, the perovskite film further comprises phenylethylammonium chloride in a molar percentage of about 0.10-0.20% relative to the first composition. In certain embodiments, the perovskite film further comprises phenylethylammonium chloride in a molar percentage of about 0.15% relative to the first composition. In certain embodiments, the perovskite film further comprises formamidinium hypophosphite in a molar percentage of about 0.5-1.5% relative to the first composition. In certain embodiments, the perovskite film further comprises formamidinium hypophosphite in a molar percentage of about 1% relative to the first composition. In certain embodiments, the perovskite film further comprises formamidinium chloride, phenylethylammonium chloride, and formamidinium hypophosphite at molar percentages of about 1.5%, 0.15% and 1.0% relative to the first composition.

III. Non-stoichiometric Perovskite Ink Solution

In another aspect, the subject matter described herein is directed to a non-stoichiometric perovskite ink solution comprising:

a) a first composition of formula $FA_{1-x}Cs_xBX_3$,
  wherein,
  FA is formamidinium;
  x is between 0 and 1;
  B is at least one metal cation;

b) a second composition of CsX, FAX, $REX_3$, or $REX_2$; wherein X, in each instance, is at least one halide; and
  RE is a rare earth ion;

and;

c) two or more solvents selected from the group consisting of dimethyl sulfoxide, dimethylformamide, N,N-dimethylpropyleneurea, N-methyl-2-pyrrolidone, dimethylacetamide, formamide, γ-butyrolactone, 2-methoxyethanol, and acetonitrile In certain embodiments of the non-stoichiometric ink solution, B comprises at least one divalent ($B^{+2}$) metal atom. The divalent metal (B) can be, for example, one or more divalent elements from Group 14 of the Periodic Table (e.g., divalent lead, tin, or germanium), one or more divalent transition metal elements from Groups 3-12 of the Periodic Table (e.g., divalent titanium, vanadium, chromium, manganese, iron, cobalt, nickel, copper, zinc, palladium, platinum, and cadmium), and/or one or more divalent alkaline earth elements (e.g., divalent magnesium, calcium, strontium, and barium). In certain embodiments, B is selected from the group consisting of lead, tin, cadmium, germanium, zinc, nickel, platinum, palladium, mercury, titanium, silicon, and a mixture thereof. In a preferred embodiment, B is lead.

In certain embodiments of the ink solution, the rare earth ion is selected from samarium, europium, terbium, cerium, and ytterbium. In certain embodiments, the rare earth ion is samarium or ytterbium. In certain embodiments of the ink solution, the second composition is CsX or FAX. In certain embodiments of the ink solution, the second composition is CsI or FAI.

In certain embodiments of the non-stoichiometric ink solution, the variable X, in each instance, is independently selected from one or a combination of halide atoms, wherein the halide atom (X) may be, for example, fluoride ($F^-$), chloride ($Cl^-$), bromide ($Br^-$), and/or iodide ($I^-$). In certain embodiments of the non-stoichiometric ink solution, X in said composition of $FA_{1-x}Cs_xBX_3$ is $I^-$. In certain embodiments of the non-stoichiometric ink solution, X in said composition of CsX is $I^-$. In certain embodiments of the non-stoichiometric ink solution, X in said composition of FAX is $I^-$. In certain embodiments of the non-stoichiometric ink solution, X in $REX_2$ or $REX_3$ is $I^-$. Non-limiting examples of $REX_2$ and $REX_3$ are $YbI_2$, $CeI_3$, and $SmI_2$. In a preferred embodiment, X, in each instance, is $I^-$.

In certain embodiments of the non-stoichiometric ink solution, x is between 0.01 and 0.50, 0.35 and 0.65, 0.45 and 0.85, 0.01 and 0.10, 0.05 and 0.15, 0.07 and 0.35, 0.05 and 0.45, 0.15 and 0.50, 0.25 and 0.35, 0.20 and 0.30, 0.01 and 0.08, or 0.07 and 0.10. In certain embodiments, x is about 0.01, 0.02, 0.03, 0.04, 0.05, 0.06, 0.07, 0.08, 0.09, 0.10, 0.11, 0.12. 0.13, 0.14, or 0.15.

In certain embodiments of the non-stoichiometric ink solution, the composition of $FA_{1-x}Cs_xBX_3$ is $FA_{0.92}Cs_{0.08}PbI_3$.

In certain embodiments of the non-stoichiometric ink solution, said second composition is present in a molar ratio of about 0.01 mol % to about 10 mol % relative to said first composition. In certain embodiments of the non-stoichiometric ink solution, said second composition is present in a molar ratio of about 0.01 mol % to about 2 mol %, about 0.10 mol % to about 5 mol %, about 0.5 mol % to about 3 mol %, about 1 mol % to about 9 mol %, about 0.01 mol % to about 0.10 mol %, about 0.01 mol % to about 0.50 mol %, about 0.10 mol % to about 0.25 mol %, about 0.15 mol % to about 1.0 mol %, about 0.50 mol % to about 2.0 mol %, about 0.50 mol % to about 1.0 mol %, about 0.35 mol % to about 0.75 mol %, about 0.50 mol % to about 1.50 mol %, about 0.80 mol % to about 1.25 mol %, about 1.0 mol % to about 2.0 mol %, about 0.65 mol % to about 2.0 mol %, or about 0.75 mol % to about 1.75 mol % relative to said first composition. In certain embodiments, the second composition is present in a molar ratio of about 0.05 mol %, 0.10 mol %, 0.15 mol %, 0.16 mol %, 0.17 mol %, 0.18 mol %, 0.19 mol %, 0.20 mol %, 0.21 mol %, 0.22 mol %, 0.23 mol %, 0.24 mol %, 0.25 mol %, 0.26 mol %, 0.27 mol %, 0.28 mol %, 0.29 mol %, 0.30 mol %, 0.31 mol %, 0.32 mol %, 0.33 mol %, 0.34 mol %, 0.35 mol %, 0.36 mol %, 0.37 mol %, 0.38 mol %, 0.39 mol %, 0.40 mol %, 0.41 mol %, 0.42 mol %, 0.43 mol %, 0.44 mol %, 0.45 mol %, 0.50 mol %, 0.6 mol %, 0.65 mol %, 0.7 mol %, 0.75 mol %, 0.8 mol %, 0.85 mol %, 0.9. mol %, 0.95 mol %, 1.0 mol %, 1.05 mol %, 1.10 mol %, 1.15 mol %, 1.20 mol %, 1.25 mol %, 1.30 mol %, 1.35 mol %, 1.40 mol %, 1.45 mol %, 1.50 mol %, 1.55 mol %, 1.60 mol %, 1.65 mol %, 1.70 mol %, 1.75 mol %, 1.80 mol %, 1.85 mol %, 1.90 mol %, 1.95 mol %, 2.0 mol %, 2.5 mol %, 3 mol %, 3.5 mol %, 4 mol %, 4.5 mol %, 5.0 mol %, 5.5 mol %, 6.0 mol %, 6.5 mol %, 7.0 mol %, 7.5 mol %, 8.0 mol %, 8.5 mol %, 9.0 mol %, 9.5 mol %, or 10.0 mol % relative to said first composition.

In certain embodiments of the non-stoichiometric ink solution, the ink solution comprises two or more solvents selected from the group consisting of dimethylformamide, dimethyl sulfoxide, acetonitrile, propionitrile, acetone, ethylacetate, methylene chloride, chloroform, methanol, ethanol, propanol, butanol, isopropanol, ethylene glycol, diethyl ether, glyme, diglyme, propylene carbonate, N-methyl-2-pyrrolidinone, γ-Butyrolactone (gamma-butyrolactone), tetrahydrofuran, benzene, toluene, decalin, hexamethylphosphoramide, pyridine, alkylpyridine, pyrrolidine, chlorobenzene, dichlorobenzene, dichloromethane, chloroform, water, carbon disulfide, supercritical carbon dioxide, carbon tetrachloride, 2-Methoxyethanol, and sulfuryl chloride fluoride. In certain embodiments, the ink solution comprises one or more solvents selected from the group consisting of dimethyl sulfoxide, dimethylformamide, γ-Butyrolactone, 2-Methoxyethanol, acetonitrile, methanol, ethanol, propanol, butanol, tetrahydrofuran, pyridine, alkylpyridine, water, pyrrolidine, chlorobenzene, dichlorobenzene, dichloromethane, and chloroform. In certain embodiments, the ink solution comprises two or more solvents selected from the group consisting of dimethyl sulfoxide, dimethylformamide, γ-Butyrolactone, 2-Methoxyethanol, and acetonitrile. In certain embodiments, the ink comprises three or more solvents selected from the group consisting of dimethyl sulfoxide, dimethylformamide, γ-Butyrolactone, 2-Methoxyethanol, and acetonitrile. In certain embodiments, the ink solution comprises three or more solvents. In certain embodiments, the ink solution comprises one or more solvents selected from the group consisting of dimethyl sulfoxide, dimethylformamide, N,N-dimethylpropyleneurea, N-methyl-2-pyrrolidone, dimethylacetamide, formamide, γ-butyrolactone, 2-methoxyethanol, and acetonitrile.

The two or more solvents comprising the non-stoichiometric ink solution may be classified as coordinating or non-coordinating solvents. The coordinating ability of a solvent, in one aspect, may refer to its strength as a Lewis base. As defined herein, a Lewis base is a compound or ionic species that can donate an electron pair to an acceptor compound. A Lewis acid is a substance that can accept a pair of nonbonding electrons. In one aspect, a "coordinating solvent" is a strong Lewis base, while a "non-coordinating solvent" is a weak Lewis base.

In another aspect, the coordinating ability of a solvent may refer to how well it coordinates or bonds to a metal ion. In certain embodiments described herein, the coordinating ability of a solvent is related to how well it coordinates or bonds to $Pb^{2+}$ or $Sn^{2+}$. In certain embodiments, a coordinating solvent exhibits strong bonding to $Pb^{2+}$ or $Sn^{2+}$. In certain embodiments, a non-coordinating solvent exhibits weak bonding to $Pb^{2+}$ or $Sn^{2+}$. The donor number ($D_N$) is often used to quantify a solvent's coordination ability. Donor number is defined as the negative enthalpy value for the 1:1 adduct formation between a Lewis base and the standard Lewis acid $SbCl_5$ (antimony pentachloride), in dilute solution in the non-coordinating solvent 1,2-dichloroethane, which has a donor number of zero. The donor number is typically reported in units of kcal/mol. In certain embodiments, a coordinating solvent has a donor number of at least 20 kcal/mol. In certain embodiments, a coordinating solvent has a donor number in the range of 20 kcal/mol to 25 kcal/mol. In certain embodiments, a coordinating solvent has a donor number greater than 25 kcal/mol. In some embodiments, a non-coordinating solvent has a donor number less than 20 kcal/mol. Acetonitrile, for example, has a donor number of 14.1 kcal/mol. Acetonitrile is therefore classified as a non-coordinating solvent. Dimethyl sulfoxide has a donor number of 29.8 kcal/mol, and is referred to herein as a coordinating solvent.

In certain embodiments, the non-stoichiometric ink solution comprises two or more solvents selected from the group consisting of volatile coordinating solvents, non-volatile coordinating solvents, volatile non-coordinating solvents, and non-volatile non-coordinating solvents. In certain embodiments, the non-stoichiometric ink solution comprises two volatile, non-coordinating solvents. In certain embodiments, the non-stoichiometric ink solution comprises three or more solvents selected from the group consisting of volatile coordinating solvents, non-volatile coordinating solvents, volatile non-coordinating solvents, and non-volatile non-coordinating solvents. In certain embodiments, the non-stoichiometric ink solution is a ternary solvent system comprising two volatile non-coordinating solvents and one non-volatile coordinating solvent. In certain embodiments, the non-stoichiometric ink solution is a ternary solvent system comprising two volatile non-coordinating solvents and one volatile coordinating solvent.

In certain embodiments, the ink solutions, the arrays that contain the ink solutions and methods utilize an ink solution comprising about 58.8% by volume of one volatile non-coordinating solvent, about 39.2% by volume of a second volatile, non-coordinating solvent, and about 2% by volume of a coordinating solvent. In certain embodiments, the percent of the coordinating solvent is about 0.01-10.0%, about 0.01-5%, about 0.01-1%, about 0.1-5% by volume, about 0.5-4% by volume, about 1.0-3% by volume, or about 2-2.5% by volume. The coordinating solvent can be a volatile or non-volatile solvent. In certain embodiments, the coordinating solvent is a non-volatile solvent. In certain embodiments, the coordinating solvent is dimethyl sulfoxide.

In certain embodiments, the non-stoichiometric ink solution comprising two volatile, non-coordinating solvents can be mixed in a volume ratio in a range of about 1:100 to 100:1. In certain embodiments, the two volatile, non-coordinating solvents are acetonitrile and 2-methoxyethanol. In certain embodiments, the non-stoichiometric ink solution comprises a volume ratio of acetonitrile to 2-methoxyethanol of 2:1. In certain embodiments, the volume ratio of acetonitrile to 2-methoxyethanol is 3:2. In certain embodiments, the ratio is about 4:3, 1:1, 1:2, 2:3, or 3:4. In some embodiments, the volume ratio of acetonitrile to 2-methoxyethanol is from about 1:100 to about 100:1.

In certain embodiments, the non-stoichiometric ink solution is a ternary mixed solvent system comprising two volatile, non-coordinating solvents and one coordinating solvent, the solvent system comprises 95 to 99.9% by volume of a mixture of two volatile, non-coordinating solvents in any volume ratio ranging from 1:100 to 100:1 and 0.1 to 5% by volume of one coordinating solvent. The coordinating solvent may be volatile or non-volatile. In certain embodiments, the two volatile, non-coordinating solvents are acetonitrile and 2-methoxyethanol and the one coordinating solvent is dimethyl sulfoxide. In certain embodiments, the non-stoichiometric ink solution comprises about 95-99.9% by volume acetonitrile and 2-methoxyethanol and about 0.1-5% by volume dimethyl sulfoxide. In certain embodiments, the non-stoichiometric ink solution comprises about 97% by volume acetonitrile and 2-Methoxyethanol and about 3% by volume dimethyl sulfoxide. In certain embodiments, the non-stoichiometric ink solution comprises about 97.5% by volume acetonitrile and 2-methoxyethanol and about 2.5% by volume dimethyl sulfoxide. In certain embodiments, the non-stoichiometric ink solution comprises about 98% by volume acetonitrile and 2-methoxyethanol and about 2% by volume dimethyl sulfoxide. In certain embodiments, the ink solution comprises 80-99.9% by volume acetonitrile and 2-methoxyethanol and about 0.1-20% by volume dimethyl sulfoxide.

In certain embodiments, of the non-stoichiometric perovskite ink solution, the first composition is $FA_{0.92}Cs_{0.08}PbI_3$, the second composition is FAI or CsI, and the second composition is added to the perovskite ink at about a 0.25 mol % relative to the first composition, and the two or more solvents are 2-methoxyethanol, acetonitrile, and dimethyl sulfoxide. In another aspect, the subject matter described herein is directed to a non-stoichiometric perovskite ink solution comprising:

c) a first composition of formula $FA_{1-x}Cs_xBX_3$,
 wherein,
 FA is formamidinium;
 x is between 0 and 1;
 B is at least one metal cation;
d) a second composition of CsX, FAX, $REX_3$, or $REX_2$;
 wherein said second composition is present in a molar ratio of about 0.01 mol % to about 10 mol % relative to said first composition;
 X, in each instance, is at least one halide; and
 RE is a rare earth ion;

and c) one or more solvents.

In certain embodiments of the above embodiment, the one or more solvents are selected from the group consisting of dimethyl sulfoxide, dimethylformamide, N,N-dimethylpropyleneurea, N-methyl-2-pyrrolidone, dimethylacetamide, formamide, γ-butyrolactone, 2-methoxyethanol, and acetonitrile.

In certain embodiments of the above embodiment, the ink solution comprises two or more solvents. In certain embodiments of the above embodiment, the ink solution comprises three or more solvents. In certain embodiments of the above embodiment, the ink solution comprises three solvents. In certain embodiments, the three or more solvents are 2-methoxyethanol, acetonitrile, and dimethyl sulfoxide. In certain embodiments of the above embodiment, the ink solution comprises 80-99.9% by volume acetonitrile and 2-methoxyethanol and about 0.1-20% by volume dimethyl sulfoxide. In certain embodiments of the above embodiment, B is selected from the group consisting of lead, tin, cadmium, germanium, zinc, nickel, platinum, palladium, mercury, titanium, silicon, and a mixture thereof. In certain embodiments of the above embodiment, B is lead. In certain embodiments of the above embodiment, x is between 0.01 and 0.50. In certain embodiments of the above embodiment, x is between 0.01 and 0.10. In certain embodiments of the above embodiment, x is between 0.05 and 0.15. In certain embodiments of the above embodiment, x is 0.08. In certain embodiments of the above embodiment, the second composition of CsX, FAX, $REX_3$, or $REX_2$ is present in a molar ratio of about 0.01 mol % to about 1 mol % relative to said first composition. In certain embodiments of the above embodiment, the second composition of CsX, FAX, $REX_3$, or $REX_2$ is present in a molar ratio of about 0.01 mol % to about 2 mol % relative to said first composition. In certain embodiments of the above embodiment, the second composition of CsX, FAX, $REX_3$, or $REX_2$ is present in a molar ratio of about 0.01 mol % to about 2 mol %, about 0.10 mol % to about 5 mol %, about 0.5 mol % to about 3 mol %, about 1 mol % to about 9 mol %, about 0.01 mol % to about 0.10 mol %, about 0.01 mol % to about 0.50 mol %, about 0.10 mol % to about 0.25 mol %, about 0.15 mol % to about 1.0 mol %, about 0.50 mol % to about 2.0 mol %, about 0.50 mol % to about 1.0 mol %, about 0.35 mol % to about 0.75 mol %, about 0.50 mol % to about 1.50 mol %, about 0.80 mol % to about 1.25 mol %, about 1.0 mol % to about 2.0 mol %, about 0.65 mol % to about 2.0 mol %, or about 0.75 mol % to about 1.75 mol % relative to said first composition. In certain embodiments of the above embodiment, the second composition of CsX, FAX, $REX_3$, or $REX_2$ is present in a molar ratio of about 0.05 mol %, 0.10 mol %, 0.15 mol %, 0.16 mol %, 0.17 mol %, 0.18 mol %, 0.19 mol %, 0.20 mol %, 0.21 mol %, 0.22 mol %, 0.23 mol %, 0.24 mol %, 0.25 mol %, 0.26 mol %, 0.27 mol %, 0.28 mol %, 0.29 mol %, 0.30 mol %, 0.31 mol %, 0.32 mol %, 0.33 mol %, 0.34 mol %, 0.35 mol %, 0.36 mol %, 0.37 mol %, 0.38 mol %, 0.39 mol %, 0.40 mol %, 0.41 mol %, 0.42 mol %, 0.43 mol %, 0.44 mol %, 0.45 mol %, 0.50 mol %, 0.6 mol %, 0.65 mol %, 0.7 mol %, 0.75 mol %, 0.8 mol %, 0.85 mol %, 0.9. mol %, 0.95 mol %, 1.0 mol %, 1.05 mol %, 1.10 mol %, 1.15 mol %, 1.20 mol %, 1.25 mol %, 1.30 mol %, 1.35 mol %, 1.40 mol %, 1.45 mol %, 1.50 mol %, 1.55 mol %, 1.60 mol %, 1.65 mol %, 1.70 mol %, 1.75 mol %, 1.80 mol %, 1.85 mol %, 1.90 mol %, 1.95 mol %, 2.0 mol %, 2.5 mol %, 3 mol %, 3.5 mol %, 4 mol %, 4.5 mol %, 5.0 mol %, 5.5 mol %, 6.0 mol %, 6.5 mol %, 7.0 mol %, 7.5 mol %, 8.0 mol %, 8.5 mol %, 9.0 mol %, 9.5 mol %, or 10.0 mol % relative to said first composition. In certain embodiments of the above embodiments, the second composition of CsX, FAX, $REX_3$, or $REX_2$ is present in a molar ratio of about 0.25 mol % relative to said first composition. In certain embodiments of the above embodiment, the rare earth ion is selected from the group consisting of samarium, europium, terbium, cerium, and ytterbium. In certain embodiments of the above embodiment, the earth ion is samarium or ytterbium. In certain embodiments of the above embodiments, the second composition is CsX or FAX. In certain embodiments of the above embodiment, X, in each instance, is $I^-$.

In certain embodiments of the non-stoichiometric ink solution, the ink solution further comprises one or more additives selected from the group consisting of formamidinium chloride, phenylethylammonium chloride, and formamidinium hypophosphite. In certain embodiments, the ink solution further comprises all three additives. In certain embodiments, the ink solution further comprises formamidinium chloride in a molar percentage of about 1-2% relative to the first composition. In certain embodiments, the ink solution further comprises formamidinium chloride in a molar percentage of about 1.5% relative to the first composition. In certain embodiments, the ink solution further comprises phenylethylammonium chloride in a molar percentage of about 0.10-0.20% relative to the first composition. In certain embodiments, the ink solution further comprises phenylethylammonium chloride in a molar percentage of about 0.15% relative to the first composition. In certain embodiments, the ink solution further comprises formamidinium hypophosphite in a molar percentage of about 0.5-1.5% relative to the first composition. In certain embodiments, the ink solution further comprises formamidinium hypophosphite in a molar percentage of about 1% relative to the first composition. In certain embodiments, the ink solution further comprises formamidinium chloride, phenylethylammonium chloride, and formamidinium hypophosphite at molar percentages of about 1.5%, 0.15% and 1.0% relative to the first composition.

In certain embodiments, the non-stoichiometric perovskite ink solution has a vapor pressure in a range of about 5 to 100 kPa. In certain embodiments, the non-stoichiometric perovskite ink solution has a vapor pressure in a range of about 2 to 80 kPa, about 5 to 70 kPa, about 10 to 60 kPa, about 15 to 50 kPa, about 20 to 40 kPa, about 25 to 40 kPa, about 5 to 15 kPa, about 7 to 10 kPa, about 10 to 20 kPa, or about 8 to 9 kPa.

IV. Methods for Preparing the Ink Solutions

In certain embodiments, the subject matter described herein is directed to a method of preparing a non-stoichiometric perovskite ink solution comprising, contacting a first precursor ink solution with a second precursor ink solution, wherein:

said first precursor ink solution comprises:

a) a first composition of $CsBX_3$;

b) at least one solvent selected from the group consisting of dimethyl sulfoxide, N,N-dimethylpropyleneurea, N-methyl-2-pyrrolidone, dimethylacetamide, formamide, and dimethylformamide; and c) optionally, a second composition of CsX, FAX, $REX_3$, or $REX_2$;

said second precursor ink solution comprises:

d) a third composition of $FABX_3$;

e) at least one solvent selected from the group consisting of γ-butyrolactone, 2-methoxyethanol, and acetonitrile; and f) optionally, a fourth composition of FAX, CsX, $REX_3$, or $REX_2$;

wherein,

FA is formamidinium;

B, in each instance, is at least one metal cation;

RE is a rare earth ion; and

X, in each instance, is at least one halide;

wherein:

i. said first precursor ink solution comprises said second composition; or ii. said second precursor ink solution comprises said fourth composition;

or, iii. wherein said first precursor ink solution does not comprise said second composition and said second precursor ink solution does not comprise said fourth composition, and prior to preparing said non-stoichiometric perovskite ink solution, a mixed precursor ink solution is prepared, comprising:

contacting said first precursor ink solution with said second precursor ink solution to prepare said mixed precursor ink solution, and contacting a fifth composition of FAX, CsX, $REX_3$, or $REX_2$ with said mixed precursor ink solution to prepare said non-stoichiometric perovskite ink solution.

In certain embodiments of the method, B is selected from the group consisting of lead, tin, cadmium, germanium, zinc, nickel, platinum, palladium, mercury, titanium, silicon, and a mixture thereof. In a preferred embodiment, B is lead.

In certain embodiments of the method, the rare earth ion is selected from samarium, europium, terbium, cerium, and ytterbium. In certain embodiments, the rare earth ion is samarium or ytterbium.

In certain embodiments of the method, the variable X, in each instance, is independently selected from one or a combination of halide atoms, wherein the halide atom (X) may be, for example, fluoride ($F^-$), chloride ($Cl^-$), bromide ($Br^-$), and/or iodide ($I^-$). In certain embodiments of the non-stoichiometric ink solution, X in said composition of $FA_{1-x}Cs_xBX_3$ is $I^-$. In certain embodiments of the method, X is said composition of CsX is $I^-$. In certain embodiments of the method, X is said composition of FAX is $I^-$. In certain embodiments of the methods for preparing the non-stoichiometric ink solutions, X in $REX_2$ or $REX_3$ is $I^-$. Non-limiting examples of $REI_2$ and $REI_3$ are $YbI_2$, $CeI_3$, and $SmI_2$. In a preferred embodiment, X, in each instance, is $I^-$.

In certain embodiments, the first precursor ink comprises dimethyl sulfoxide. In certain embodiments, the second precursor ink comprises at least two solvents. In certain embodiments, the at least two solvents are 2-methoxyethanol and acetonitrile. In certain embodiments, the 2-methoxyethanol and acetonitrile are mixed in a volume ratio of 1:1 ratio. In certain embodiments, the non-stoichiometric ink solution comprises a volume ratio of acetonitrile to 2-methoxyethanol of 2:1. In certain embodiments, the volume ratio of acetonitrile to 2-methoxyethanol is 3:2. In certain embodiments, the ratio is about 4:3, 1:1, 1:2, 2:3, or 3:4. In some embodiments, the volume ratio of acetonitrile to 2-methoxyethanol is from about 1:100 to about 100:1. In certain embodiments, the 2-methoxyethanol and acetonitrile are mixed in a volume ratio of 1:0 to 1:5.

In certain embodiments, the second precursor solution is mixed with the first precursor solution in a volume ratio of about 2:1 to about 35:1, about 5:1 to about 50:1, about 10:1 to about 20:1, about 15:1 to about 15:1, or about 15:1 to about 60:1. In certain embodiments, the second precursor solution is contacted with said first precursor solution in a volume ratio of about 1:1 to about 100:1. In certain embodiments, the second precursor solution is mixed with the first precursor solution in a volume ratio of about 15:1, 16:1, 17:1, 18:1, 19:1, 20:1, 21:1, 22:1, 23:1, 24:1, 25:1, 26:1, 27:1, 28:1, 29:1, or 30:1.

In certain embodiments of the method, the $REX_3$, REX2, CsX, or FAX is added to the first or second precursor solution in about a 0.01 mol % to about 10 mol % relative to the $CsBX_3$ or $FABX_3$. In certain embodiments of the method, the $REX_3$, $REX_2$, CsX, or FAX is added to the first or second precursor solution in about a 0.01 mol % to about 2 mol %, about 0.10 mol % to about 5 mol %, about 0.5 mol % to about 3 mol %, about 1 mol % to about 9 mol %, about 0.01 mol % to about 0.10 mol %, about 0.01 mol % to about 0.50 mol %, about 0.10 mol % to about 0.25 mol %, about 0.15 mol % to about 1.0 mol %, about 0.50 mol % to about 2.0 mol %, about 0.50 mol % to about 1.0 mol %, about 0.35 mol % to about 0.75 mol %, about 0.50 mol % to about 1.50 mol %, about 0.80 mol % to about 1.25 mol %, about 1.0 mol % to about 2.0 mol %, about 0.65 mol % to about 2.0 mol %, or about 0.75 mol % to about 1.75 mol % relative to the $CsBX_3$ or $FABX_3$. In certain embodiments, the $REX_3$, $REX_2$, CsX, or FAX is added to the first or second precursor solution in about a 0.05 mol %, 0.10 mol %, 0.15 mol %, 0.16 mol %, 0.17 mol %, 0.18 mol %, 0.19 mol %, 0.20 mol %, 0.21 mol %, 0.22 mol %, 0.23 mol %, 0.24 mol %, 0.25 mol %, 0.26 mol %, 0.27 mol %, 0.28 mol %, 0.29 mol %, 0.30 mol %, 0.31 mol %, 0.32 mol %, 0.33 mol %, 0.34 mol %, 0.35 mol %, 0.36 mol %, 0.37 mol %, 0.38 mol %, 0.39 mol %, 0.40 mol %, 0.41 mol %, 0.42 mol %, 0.43 mol %, 0.44 mol %, 0.45 mol %, 0.50 mol %, 0.6 mol %, 0.65 mol %, 0.7 mol %, 0.75 mol %, 0.8 mol %, 0.85 mol %, 0.9. mol %, 0.95 mol %, 1.0 mol %, 1.05 mol %, 1.10 mol %, 1.15 mol %, 1.20 mol %, 1.25 mol %, 1.30 mol %, 1.35 mol %, 1.40 mol %, 1.45 mol %, 1.50 mol %, 1.55 mol %, 1.60 mol %, 1.65 mol %, 1.70 mol %, 1.75 mol %, 1.80 mol %, 1.85 mol %, 1.90 mol %, 1.95 mol %, 2.0 mol %, 2.5 mol %, 3 mol %, 3.5 mol %, 4 mol %, 4.5 mol %, 5.0 mol %, 5.5 mol %, 6.0 mol %, 6.5 mol %, 7.0 mol %, 7.5 mol %, 8.0 mol %, 8.5 mol %, 9.0 mol %, 9.5 mol %, or 10.0 mol % relative to the $CsBX_3$ or $FABX_3$.

In certain embodiments, the first precursor ink solution comprises said second composition of CsX, FAX, $REX_3$, or $REX_2$ or said second precursor ink solution comprises said fourth composition of CsX, FAX, $REX_3$, or $REX_2$.

In certain embodiments, said CsX, FAX, $REX_3$, or $REX_2$ is added to said first precursor ink solution or said second precursor ink solution in about a 0.01 mol % to 10 mol % ratio relative to said $CsBX_3$ or $FABX_3$. In certain embodiments, said CsX, FAX, $REX_3$, or $REX_2$ is added to said first precursor ink solution or said second precursor ink solution in about a 0.01 mol % to 2 mol % ratio relative to said $CsBX_3$ or $FABX_3$.

In certain embodiments, said CsX, FAX, $REX_3$, or $REX_2$ is added to said first precursor ink solution or said second precursor ink solution in about a 0.25 mol % ratio relative to said $CsBX_3$ or $FABX_3$.

In certain embodiments, CsX is added to said first precursor ink solution or FAX is added to said second precursor ink solution.

In certain embodiments of the method for preparing the nonstoichiometric ink solution, the method further comprises adding one or more additives to the ink solution selected from the group consisting of formamidinium chloride, phenylethylammonium chloride, and formamidinium hypophosphite. In certain embodiments, the ink solution further comprises all three additives. In certain embodiments, the ink solution further comprises formamidinium chloride in a molar percentage of about 1-2% relative to the first composition. In certain embodiments, the ink solution further comprises formamidinium chloride in a molar percentage of about 1.5% relative to the first composition. In certain embodiments, the ink solution further comprises phenylethylammonium chloride in a molar percentage of about 0.10-0.20% relative to the first composition. In certain embodiments, the ink solution further comprises phenylethylammonium chloride in a molar percentage of about 0.15% relative to the first composition. In certain embodiments, the ink solution further comprises formamidinium hypophosphite in a molar percentage of about 0.5-1.5% relative to the first composition. In certain embodiments, the ink solution further comprises formamidinium hypophosphite in a molar percentage of about 1% relative to the first composition. In certain embodiments, the ink solution further comprises formamidinium chloride, phenylethylammonium chloride, and formamidinium hypophosphite at molar percentages of about 1.5%, 0.15% and 1.0% relative to the first composition.

V. Methods for Producing Films

In certain embodiments, the subject matter disclosed herein is directed to a method for producing a polycrystalline perovskite film using the non-stoichiometric ink solutions described herein. In certain embodiments, the method comprises: contacting the ink solution using a fast coating process onto a substrate to form a film, wherein the fast coating process is selected from the group consisting of blade coating, slot die coating, shear coating, gravure coating, brush coating, syringe coating, and screen printing.

Utilizing a fast coating process is advantageous because of increased scalability for perovskite device roll-to-roll production, simplicity, and cost effectiveness. Furthermore, fast coating processes also provide advantages due to high-throughput deposition, high material usage, and application onto flexible substrates. In particular, perovskite films and devices fabricated using a fast coating process, such as blade coating, can have advantageously long carrier diffusion lengths (e.g., up to 3 μm thick) due to the dramatically higher carrier mobility in the blade-coated films. Such doctor-blade deposition can be utilized for large area perovskite cells fabricated with high volume roll-to-roll production.

In certain embodiments, a device is used in the fast coating process for contacting the ink solution onto the substrate. In the blade coating process, a "blade coater" may be used. As used herein, "blade coater" is synonymous with "doctor blade." In certain embodiments, doctor blade coating techniques are used to facilitate formation of the polycrystalline perovskite film during the fabrication process.

In certain embodiments, the method for producing a polycrystalline perovskite film using the fast coating process can take place at a temperature between about 25° C. to about 250° C. In certain embodiments, the process takes place at about room temperature (about 25° C.).

In certain embodiments of the fast coating process, the substrate is moving and the device is stationary. In certain embodiments, the device is a doctor blade. In certain aspects, the substrate is moving at a rate of about 2 mm/s relative to the device. In certain aspects, the substrate is moving at a rate of about 20 mm/s relative to the device. In certain aspects, the substrate is moving at a rate of about 40 mm/s relative to the device. In certain aspects, the substrate is moving at a rate of about 99 mm/s relative to the device. In certain aspects, the substrate is stationary and the device moves relative to the substrate. In certain aspects, the device is moving at a rate of about 2 mm/s relative to the substrate. In certain aspects, the device is moving at a rate of about 20 mm/s relative to the substrate. In certain aspects, the device is moving at a rate of about 40 mm/s relative to the substrate. In certain aspects, the device is moving at a rate of about 99 mm/s relative to the substrate.

In certain embodiments, the fast coating process described herein takes place at about 2 to about 15,000 mm/s. In certain embodiments, the fast coating process described herein takes place at about 2 to about 10,000 mm/s. In certain embodiments, the fast coating process described herein takes place at about 2 to about 99 mm/s. In certain embodiments, the fast coating process takes place at least or at about 2 mm/s, 20 mm/s, 40 mm/s, 60 mm/s, 80 mm/s, 99 mm/s, 150 mm/s, 275 mm/s, 500 mm/s, 700 mm/s, 800 mm/s, 900 mm/s, 1000 mm/s, 2000 mm/s, 3000 mm/s, 4000 mm/s, 5000 mm/s, 6000 mm/s, 7000 mm/s, 8000 mm/s, 9000 mm/s, 10,000 mm/s, 11,000 mm/s, 12,000 mm/s, 13,000 mm/s, 14,000 mm/s, or 15,000 mm/s.

In certain embodiments, the distance between the device used in the fast coating process for contacting the ink solution onto the substrate is between about 10 μm and 1 cm. In certain embodiments, the distance between the device and the substrate is between about 150 and about 350 μm. In certain embodiments, the distance between the device and the substrate is between about 200 and about 300 μm. In certain embodiments, the distance between the device and the substrate is about 200 μm, 225 μm, about 250 μm, about 275 μm, or about 300 μm.

In certain embodiments, the methods described herein to produce polycrystalline perovskite films further comprise knife-assisted drying. Knife drying comprises applying a high velocity, low pressure gas to the ink solution to form a perovskite film on the substrate. An advantage of knife drying in the polycrystalline perovskite film production process is that it helps produces uniform and smooth films. As used herein, an "air knife," "$N_2$ knife," or "air doctor" may be used to describe the device that performs knife-assisted drying in the perovskite film production process. The knife may have a gas manifold with a plurality of nozzles that direct a high velocity stream of air or other gas at the perovskite ink on the substrate. The gas used in the knife-assisted drying process may be air, nitrogen, argon, helium, oxygen, neon, hydrogen, and a combination thereof.

In certain embodiments, the knife-assisted drying takes place at a temperature of about 25° C. to about 250° C. In certain embodiments, the knife-assisted drying takes place at room temperature (about 25° C.). In certain embodiments, the knife-assisted drying takes place at a temperature of about 50° C. to about 100° C.

In certain embodiments, the knife-assisted drying takes place at a pressure in a range of about 0 to 500 psi. In certain embodiments, the knife-assisted drying takes place at a pressure in a range of about 5 to 400 psi, about 20 to 300 psi, about 50 to 200 psi, about 100 to 150 psi, about 5 to 25 psi, about 5 to 20 psi, about 10 to 20 psi, about 10 to 19 psi, about 12 to 18 psi, about 12-16 psi, or about 13-16 psi. In certain embodiments, the knife-assisted drying takes place at about 14 psi, about 15, psi, about 16 psi, at about 17 psi, at about 18 psi, or at about 19 psi.

In certain embodiments, the knife is angled against the device used in the fast coating process and the substrate to create a unidirectional air flow over the as-coated film for enhanced blowing uniformity. In certain embodiments, the knife is angled 0°, 5°, 10°, 15°, 20°, 25°, 30°, 35°, 40°, 45°, 50°, 55°, 60°, 65°, 70°, 75°, 80°, 90°, 100°, 120°, 150°, 155°, 170°, or 180° against the device or the substrate.

In certain embodiments, after fast coating and/or knife-assisted drying, the film created from the ink solution (while on the substrate) may undergo annealing. The film is annealed at a temperature of at least or above 30° C. for a time period effective to convert the perovskite precursor components in the ink solution to a film of a crystalline halide perovskite within the scope of Formula (I) above. In certain embodiments, annealing employs a temperature of about, at least, above, up to, or less than 40° C., 50° C., 60° C., 70° C., 80° C., 90° C., 100° C., 110° C., 120° C., 130° C., 140° C., 150° C., 160° C., 170° C., 180° C., 190° C., or 200° C., or a temperature within a range bounded by any two of the foregoing values. In various embodiments, annealing may take place in a range of, for example, 30-200° C., 50-150° C., 30-180° C., 30-150° C., 30-140° C., 30-130° C., 30-120° C., 30-110° C., or 30-100° C.

Annealing may take place for a period of time, for example, in a range of about 0 seconds to 400 minutes, about 5 seconds to 30 seconds, about 5 minutes to about 10 minutes, about 10 minutes to 20 minutes, or about 20 minutes to 30 minutes. Annealing can take place for a period of time, for example, of at least 5 seconds, 10 seconds, 20 seconds, 30 seconds, 1, minute, 5 minutes, 10 minutes, 20 minutes, 30 minutes, 60 minutes, 90 minutes, 120 minutes, 180 minutes, 240 minutes, or 360 minutes.

In certain embodiments, the methods described herein produce polycrystalline perovskite films having a film thickness in a range of about 10 nm to about 1 cm. In certain embodiments, the methods described herein produce polycrystalline perovskite films having a film thickness in a range of about 300 nm to about 1000 nm. In certain embodiments, the methods described herein produce polycrystalline perovskite films having a film thickness in a range of about 80 nm to about 300 nm. In certain embodiments, the methods described herein produce polycrystalline perovskite films having a film thickness in a range of about 0.1 mm to about 50 mm. In certain embodiments, the methods described herein produce polycrystalline perovskite films having a film thickness in a range of about 100 nm to about 1000 nm. In certain embodiments, the methods described herein produce polycrystalline perovskite films having a film thickness in a range of about, at least, above, up to, or less than, for example, 200 nm, 300 nm, 400 nm, 500 nm, 600 nm, 700 nm, 800 nm, 900 nm, 1000 nm (1 μm), 2 μm, 3 μm, 4 μm, 5 μm, 6 μm, 7 μm, 8 μm, 9 μm, or 10 μm.

The methods described herein produce polycrystalline perovskite films having an average grain size of about 10 nm to about 1 mm. In certain embodiments, the methods described herein produce polycrystalline perovskite films having an average grain size of about, at least, or above 0.01 μm, 10 μm, 20 μm, 30 μm, 40 μm, 50 μm, 60 μm, 70 μm, 80 μm, 90 μm, 100 μm, 120 μm, 150 μm, 180 μm, 200 μm, 220 μm, 250 μm, 280 μm, 300 μm, 350 μm, 400 μm, 450 μm, 500 μm, 550 μm, 600 μm, 650 μm, 700 μm, 800 μm, 850 μm, 900 μm, 1000 μm, or an average grain size within a range bounded by any two of the foregoing exemplary values. It is generally known in the art that large grain sizes are suitable for films in photoactive or photovoltaic applications.

In certain embodiments, the methods described herein produce polycrystalline perovskite films capable of achieving compact, pin-hole free, and uniform structures with an area of at least 25 $cm^2$. In certain embodiments, methods described herein produce polycrystalline perovskite films having an area of at least 1 $cm^2$, 2 $cm^2$, 3 $cm^2$, 4 $cm^2$, 5 $cm^2$, 6 $cm^2$, 7 $cm^2$, 8 $cm^2$, 9 $cm^2$, 10 $cm^2$, 11 $cm^2$, 12 $cm^2$, 13 $cm^2$, 14 $cm^2$, 15 $cm^2$, 17 $cm^2$, 20 $cm^2$, 22 $cm^2$, 25 $cm^2$, 26 $cm^2$, 27 $cm^2$, 28 $cm^2$, 29 $cm^2$, 30 $cm^2$, 31 $cm^2$, 32 $cm^2$, 33 $cm^2$, 34 $cm^2$, 35 $cm^2$, 36 $cm^2$, 37 $cm^2$, 38 $cm^2$, 39 $cm^2$, 40 $cm^2$, 41 $cm^2$, 42 $cm^2$, 43 $cm^2$, 44 $cm^2$, 45 $cm^2$ 50 $cm^2$, 55 $cm^2$, 60 $cm^2$, 75 $cm^2$, 80 $cm^2$, 85 $cm^2$, 100 $cm^2$, 125 $cm^2$, 150 $cm^2$, 200 $cm^2$, 225 $cm^2$, 250 $cm^2$, 275 $cm^2$, 300 $cm^2$, 325 $cm^2$, or 350 $cm^2$.

VI. Devices

The non-stoichiometric polycrystalline perovskite films described herein are useful in a variety of photoactive and photovoltaic applications. The perovskite films can be integrated into, for example, photoluminescent devices, photoelectrochemical devices, thermoelectric devices, and photocatalytic devices. Some non-limiting examples in which the polycrystalline perovskite films can be applied include solar cells, solar panels, solar modules, light-emitting diodes, lasers, photodetectors, x-ray detectors, batteries, hybrid PV batteries, field effect transistors, memristors, or synapses.

In certain embodiments, the subject matter described herein is directed to semiconductor device comprising:

one or more anode layers;

one or more cathode layers; and one or more active layers, wherein at least one of said one or more active layers comprises the non-stoichiometric polycrystalline film described herein.

In certain embodiments of the semiconductor device, the device is selected from the group consisting of solar cell, light emitting diode, photodiode, photoelectrochemical cell, photoresistor, phototransistor, photomultiplier, photoelectric cell, electrochromic cell, and radiation detector. In certain embodiments, the solar cell is a single junction solar cell. In certain embodiments the solar cell is a tandem solar cell, such as a perovskite-perovskite or perovskite-silicon tandem solar cell.

In certain embodiments, the subject matter described herein is directed to a solar cell, comprising:

one or more transparent conductive oxide layers;

one or more conductive electrode layers;

one or more hole transport layers;

one or more electron transport layers; and one or more active layers, wherein at least one of said one or more active layers comprises the non-stoichiometric polycrystalline film described herein.

In certain embodiments of the above solar cell, the solar cell comprises:

one transparent conductive oxide layer;

one conductive electrode layer;

one hole transport layer;

one electron transport layer; and one active layer, wherein said active layer comprises the non-stoichiometric polycrystalline film described herein.

In certain embodiments of the above solar cell, said hole transport layer is disposed directly on said transparent conductive oxide layer;

said active layer comprising said non-stoichiometric polycrystalline film is disposed directly on said hole transport layer;

said electron transport layer is disposed directly on said active layer; and said conductive electrode layer is disposed on said electron transport layer.

In certain embodiments of the above solar cell, said electron transport layer is disposed directly on said transparent conductive oxide layer;

said active layer comprising said non-stoichiometric polycrystalline film is disposed directly on said electron transport layer;

said hole transport layer is disposed directly on said active layer; and said conductive electrode layer is disposed directly on said hole transport layer.

The transparent conductive oxide layer and the conductive electrode layer comprise the anode and cathode (or vice versa) in the solar cell. In certain embodiments, the cathode and anode each comprise at least one of lithium, sodium, potassium, rubidium, cesium, francium, beryllium, magnesium, calcium, strontium, barium, radium, boron, aluminum, gallium, indium, thallium, tin, lead, flerovium, bismuth, antimony, tellurium, polonium, scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, dubnium, seaborgium, bohrium, hassium, copernicium, samarium, neodymium, ytterbium, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, carbon nanowire, carbon nanosheet, carbon nanorod, carbon nanotube, graphite, indium tin oxide (ITO), fluorine-doped tin oxide (FTO), aluminum doped zinc oxide (AZO), antimony-tin mixed oxide (ATO), network of metal/alloy nanowire, or a combination of two or more of the above materials. In certain embodiments, the transparent conductive oxide layer is selected from the group consisting of ITO, FTO, ZITO, and AZO. In certain embodiments, the metal electrode is selected from the group consisting of Al, Au, Cu, Cr, Ca, Mg, Bi, Ag, and Ti. In certain embodiments, both the anode and cathode consist of transparent conductive oxide layers.

The transport layers in the solar cell are each a hole transport layer or an electron transport layer.

In certain embodiments, the charge transport layer between the perovskite composition and the cathode comprises at least one of poly(3,4-ethylene dioxithiophene) (PEDOT) doped with poly(styrene sulfonic acid) (PSS), Spiro-OMeTAD, pm-spiro-OMeTAD, po-spiro-OMeTAD, dopants in spiro-OMeTAD, 4,4'-biskptrichlorosilylpropylphenyl)phenylaminoThiphenyl (TPD-Si2), poly(3-hexyl-2,5-thienylene vinylene) (P3HTV), C60, carbon, carbon nanotube, graphene quantum dot, graphene oxide, copper phthalocyanine (CuPc), Polythiophene, poly(3,4-(lhydroxymethyl)ethylenedioxythiophene (PHMEDOT), n-dodecylbenzenesulfonic acid/hydrochloric acid doped poly(aniline) nanotubes (a-PANIN)s, poly(styrene sulfonic acid)-graft-poly(aniline) (PSSA-g-PANI), poly(9.9-dioctylfluorene)-co-N-(4-(1-methylpropyl)phenyl) diphenylamine (PFT), 4,4'-bis(p-trichlorosilylpropylphenyl) phenylaminobiphenyl (TSPP), 5,5'-bis(p-trichlorosilylpropylphenyl) phenylamino-2,20 bithiophene (TSPT), N-propyltriethoxysilane, 3,3,3-trifluo ropropyltrichlorosilane or 3-aminopropyltriethoxysilane, Poly(bis(4-phenyl)(2,4,6-trimethylphenyl)amine) (PTAA), (Poly[[(2,4-dimethylphenyl)imino]-1,4-phenylene(9,9-dioctyl-9H-fluorene-2,7-diyl)-1,4phenylene], (PF8-TAA)), (Poly [[(2,4-dimethylphenyl)imino]-1,4-phenylene (6,12-dihydro-6,6,12,12tetraoctylindeno[1,2-b]fluorene-2,8-diyl)-1,4-phenylene]) (PIF8-TAA), poly[j[4,8-bis[(2-ethylhexyl)oxy]benzo[1,2-b:4,5-b]dithiophene-2,6-diyl][3-fluoro-2-[(2-ethylhexyl)carbonyl]thieno[3,4-b]thiophenediyl]](PTB7), poly [N-90-heptadecanyl-2,7-carbazole-alt-5,5-(40,70-di-2-thienyl-20,10,30-benzothiadiazole)](PCDTBT), Poly[2,5-bis(2-decyldodecyl)pyrrolo[3,4-c]pyrrole-1,4(2H,5H)-dione-(E)-1,2-di(2,20-bithiophen-5-yl) ethene](PDPPDBTE), 4,8-dithien-2-yl-benzo[1,2-d;4,5-d ']bistriazole-alt-benzo[1,2-b:4,5b']dithiophenes (pBBTa-BDTs), pBBTa-BDT1, pBBTa-BDT2 polymers, poly(3-hexylthiophene) (P3HT), poly(4,4'-bis(N-carbazolyl)-1,1'-biphenyl) (PPN), triarylamine (TAA) and/or thiophene moieties, Paracyclophane, Triptycene, and Bimesitylene, Thiophene and Furan-based hole transport materials, Dendrimer-like and star-type hole transport materials, VO, VOX, MoC, WO, ReO, NiOx, AgOx, CuO, Cu2O, V2O5, CuI, CuS, CuInS2, colloidal quantum dots, lead sulphide (PbS), CuSCN, Cu2ZnSnS4, Au nanoparticles and their derivatives. Thiophene derivatives, Triptycene derivatives, Triazine derivatives, Porphyrin derivatives, Triphenylamine derivatives, Tetrathiafulvalene derivatives, Carbazole derivatives and Phthalocyanine derivatives. As used herein, when a material is referred to a "derivate" or as "derivatives," such as Triphenylamine derivatives, the material contains Triphenylamine in its backbone structure. In certain embodiments, the charge transport layer between the perovskite composition and the cathode (hole transport layer) is selected from the group consisting of PTAA, Poly-TPD, Spiro-OMeTAD, PEDOT:PSS, NiO, MoO3, V2O5, EH44, and a combination thereof.

In certain embodiments, the charge transport layer between perovskite composition and the anode comprises at least one of LiF, CsP, LiCoO, CsCO, TiOx, TiO, nanorods (NRs), ZnO, ZnO nanorods (NRs), ZnO nanoparticles (NPs), ZnO, Al—O, CaO, bathocuproine (BCP), copper phthalocyanine (CuPc), pentacene, pyronin B, pentadecafluorooctyl phenyl-C60-butyrate (F-PCBM), C60, C60/LiF, ZnO NRS/PCBM, ZnO/cross-linked fullerene derivative (C-PCBSD), single walled carbon nanotubes (SWCNT), poly(ethylene glycol) (PEG), poly(dimethyl siloxane-block-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr DBT15), fluorene alternating and random copolymer bearing cationic groups in the alkyl side chains (PFPNBr), poly (ethylene oxide) (PEO), and fullerene derivatives. In certain embodiments, the charge transport layer between perovskite composition and the anode (electron transport layer) is selected from the group consisting of C60, BCP, TiO2, $SnO_2$, PCBM, ICBA, ICMA, ZnO, ZrAcac, LiF, TPBI, PFN, $Nb_2O_5$, and a combination thereof.

An element can include more than one sublayer, for example, the ETL or HTL can include sublayers known in the art and containing different materials, such as a buffer sublayer or coating sublayer, that are described herein as part of the same element. Each element, however, is a distinct section having a discrete function from other elements in the perovskite solar cell or solar module. For example, in certain embodiments, the ETL can comprise PCBM/BCP, PCBM/$TiO_2$, PCBM/LiF, C60/BCP, PCBM/PFN, or PCBM/ZnO. In certain other embodiments, the ETL can comprise a material selected from the group consisting of C60, BCP, $TiO_2$, $SnO_2$, PCBM, ICBA, ICMA, ZnO, ZrAcac, LiF, TPBI, PFN; and, a buffer sublayer disposed on the ETL material selected from the group consisting of PDI, PDINO, PFN, PFN—Br, $SnO_2$, ZnO, ZrAcac, $TiO_2$, BCP, LiF, PPDIN6, and TPBi. In certain embodiments, the HTL can comprise one or more materials selected from the group consisting of PTAA, Poly-TPD, Spiro-OMeTAD, PEDOT:PSS, NiO, $MoO_3$, $V_2O_5$, and EH44. In certain other embodiments, the perovskite solar cells or perovskite tandem cells may comprise a coating sublayer, such as an antireflective coating material. Nonlimiting examples of antireflective coating materials include $MgF_2$ and LiF.

In certain embodiments of the above solar cells, said hole transport layer is disposed directly on said transparent conductive oxide layer;

- said active layer comprising said non-stoichiometric polycrystalline film is disposed directly on said hole transport layer;
- said electron transport layer is disposed directly on said active layer; and
- said conductive electrode layer is disposed on said electron transport layer; wherein:
- said transparent conductive oxide layer is indium tin oxide;
- said hole transport layer is PTAA;
- said electron transport layer is $C_{60}$; and
- said conductive electrode layer is Cu.

In any of the embodiments above wherein the first transport layer is a hole transport layer and the second transport layer is an electron transport layer, the solar cell further comprises a buffer layer disposed directly on the electron transport layer, wherein the conductive electrode is disposed directly on the buffer layer. In certain embodiments, the buffer layer is selected from the group consisting of PDI, PDINO, PFN, PFN—Br, $SnO_2$, ZnO, ZrAcac, $TiO_2$, BCP, LiF, PPDIN6, and TPBi In certain embodiments, the buffer layer is BCP.

In certain embodiments of the above solar cells, the solar cell further comprises a glass layer, wherein the transparent conductive oxide layer is disposed directly on the glass layer. In certain embodiments, the glass is used to encapsulate the solar cell. The glass layer comprises silica ($SiO_2$). In certain aspects, the solar cells comprise a first glass layer and a second glass layer, wherein the conductive oxide layer is disposed on said first glass layer and said second glass layer is disposed on said conductive electrode. In certain embodiments, the glass layer has a thickness of about 1.1 mm. In certain embodiment, the glass layer has a thickness of about 0.5, 0.6, 0.7, 0.8, 0.9, 1.0, 1.1, 1.2, 1.3. 1.4, or 1.5 mm. In certain embodiments, the glass encapsulates the solar cell or solar module by coating the edges of the glass with epoxy and contacting them with the cell or module.

In certain embodiments, the subject matter described herein is directed to a solar module, comprising a plurality of any one of the solar cells described above.

In certain embodiments, the back of the solar cell or solar module is encapsulated with a polymer. The polymer can be any polymer sheet sealed by encapsulant, or ethylene-vinyl acetate copolymer (EVA), polypropylene, polyolefin (POE), ethylene-propylene-diene monomer (EPDM), or cross-linkable encapsulants that can be laminated to the back of solar the cell or solar module. In certain embodiments, the polymer that encapsulates the back of the solar cell or the solar module is a polymer sheet or board. In one embodiment, the polymer is polypropylene. In certain embodiments, the back of the solar cell or solar module is encapsulated with a polypropylene board. In certain embodiment, the polypropylene board has a thickness of about 0.5, 0.6, 0.7, 0.8, 0.9, 1.0, 1.1, 1.2, 1.3. 1.4, or 1.5 mm. In certain embodiments, the polypropylene board encapsulates the solar cell or solar module by coating the edges of the board with epoxy and contacting them with the cell or module.

In certain embodiments the conductive electrode layer has a thickness of about 1 nm to about 1000 μm, about 100 nm to about 500 nm, about 1 μm to about 500 μm, about 250 μm to about 1000 μm, or about 250 nm to about 250 μm. In certain embodiments, the metal electrode has a thickness of about 10 nm, 50 nm, 100 nm, 150 nm, 200 nm, 300 nm, 400 nm, 500 nm, 550 nm, 1 μm, 10 μm, 20 μm, 30 μm, 40 μm, 50 μm, 60 μm, 70 μm, 80 μm, 100 μm, 150 μm, 200 μm, 250 μm, 300 μm, 350 μm, 400 μm, 450 μm, 500 μm, 550 μm, 600 μm, 700 μm, 800 μm, 900 μm, or 100 μm.

In certain embodiments, the transparent conductive oxide layer has a thickness of about 1 nm to about 1000 μm, about 100 nm to about 500 nm, about 1 μm to about 500 μm, about 250 μm to about 1000 μm, or about 250 nm to about 250 μm. In certain embodiments, the transparent conductive layer has a thickness of about 10 nm, 50 nm, 100 nm, 150 nm, 200 nm, 300 nm, 400 nm, 500 nm, 550 nm, 1 μm, 10 μm, 20 μm, 30 μm, 40 μm, 50 μm, 60 μm, 70 μm, 80 μm, 100 μm, 150 μm, 200 μm, 250 μm, 300 μm, 350 μm, 400 μm, 450 μm, 500 μm, 550 μm, 600 μm, 700 μm, 800 μm, 900 μm, or 100 μm.

In certain embodiments, the first and second transport layers each individually have a thickness of about 0.1 nm to about 10 μm, about 0.5 nm to about 100 nm, about 10 nm to about 500 nm, about 300 nm to about 700 nm, about 100 nm to about 1 μm, about 1 μm to about 10 μm, or about 800 nm to about 5 μm. In certain embodiments, the first and second transport layers each individually have a thickness of about 0.1 nm, 0.5 nm, 1.0 nm, 2.0 nm, 5.0 nm, 10 nm, 20 nm, 30 nm, 40 nm, 50 nm, 60 nm, 70 nm, 80 nm, 90 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1000 nm, 1 μm, 2 μm, 3 μm, 4 μm, 5 μm, 6 μm, 7 μm, 8 μm, 9 μm, or 10 μm.

The Power Conversion Efficiency (PCE) of the solar cells as described herein ranges from about 15% to about 25%. In certain embodiments, the PCE is at least 17% 18%, 19%, 20%, 21%, 22%, 23%, or 24%.

In certain embodiments, the solar modules described herein have an aperture area of at least 20 $cm^2$, 21 $cm^2$, 22 $cm^2$, 23 $cm^2$, 24 $cm^2$, 25 $cm^2$, 26 $cm^2$, 27 $cm^2$, 28 $cm^2$, 29 $cm^2$, 30 $cm^2$, 35 $cm^2$, 40 $cm^2$, 41 $cm^2$, 42 $cm^2$, 43 $cm^2$, 44 $cm^2$, 45 $cm^2$, 46 $cm^2$, 47 $cm^2$, 48 $cm^2$, 49 $cm^2$, 50 $cm^2$, 55 $cm^2$, 60 $cm^2$, 65 $cm^2$, 70 $cm^2$, 75 $cm^2$, 80 $cm^2$, 85 $cm^2$, 90 $cm^2$, 95 $cm^2$, or 100 $cm^2$.

In certain embodiments, the solar modules described herein exhibit an aperture efficiency of at least 16%, 17%, or 18% when illuminated under simulated AM 1.5 G one sun illumination (100 $mW/cm^2$).

The aperture efficiency is defined as follows:

$$\text{Aperture efficiency} = \frac{\text{Solar module maximum power output}}{\text{Illuminated area} \times \text{simulated sun light power}}$$

where the illuminated area of the module is the aperture area. As such, the efficiency is defined as "aperture efficiency".

VII. Articles of Manufacture

In certain embodiments, the subject matter described herein is directed to a kit, comprising:

a) a first vial comprising a first precursor solution comprising:

a composition of formula $CsBX_3$;

at least one solvent selected from the group consisting of dimethyl sulfoxide, dimethylformamide, N,N-dimethylpropyleneurea, N-methyl-2-pyrrolidone, dimethylacetamide, formamide; and optionally, a composition of CsX, FAX, $REX_3$, or $REX_2$;

b) a second vial comprising a second precursor solution comprising:

a composition of formula $FABX_3$;

at least one solvent selected from the group consisting of γ-butyrolactone, 2-methoxyethanol, and acetonitrile; and optionally, a composition of FAX, CsX, $REX_3$, or $REX_2$;

wherein, FA is formamidinium;

RE is a rare earth metal;

B is at least one metal cation; and

X, in each instance is at least one halide;

wherein said first vial or said second vial comprises said composition of CsX, FAX, $REX_3$, or $REX_2$;

and c) instructions for use.

In certain embodiments of the above kit, the second vial comprises at least two solvents. In certain embodiments, the two solvents are 2-methoxyethanol and acetonitrile In certain embodiments of the above kit, the first vial comprises dimethyl sulfoxide.

In certain embodiments of the above kit, X, in each instance, is $I^-$.

In certain embodiments of the above kit, CsX, $REX_3$, $REX_2$ or FAX is added to the first or second vial in a range of 0.1 to 10 mol % relative to the formula of $CsBX_3$ or $FABX_3$. In certain embodiments of the above kit, CsX, $REX_3$, $REX_2$ or FAX is added to the first or second vial in a range of 0.1 to 2 mol % relative to the formula of $CsBX_3$ or $FABX_3$. In certain embodiments, CsX is added to the first vial. In certain embodiments, FAX is added to the second vial. In certain embodiments, each of CsX, $REX_3$, $REX_2$, FAX, $CsBX_3$, and $FABX_3$ are CsI, $REI_3$, $REI_2$, FAI, $CSPbI_3$, and $FAPbI_3$.

In certain embodiments of the above kit, the instructions may describe methods of combining the precursor solutions in the two vials, such as mixing the two solutions together. In an embodiment, the kit may provide instructions for mixing the solutions in a certain ratio, such as a ratio of about 21:1.

The subject matter described herein is directed to the following embodiments:

1. A non-stoichiometric perovskite ink solution comprising:
   a) a first composition of formula $FA_{1-x}Cs_xBX_3$, wherein,
      FA is formamidinium;
      x is between 0 and 1;
      B is at least one metal cation;
   b) a second composition of CsX, FAX, $REX_3$, or $REX_2$; wherein X, in each instance, is at least one halide; and
      RE is a rare earth ion;

and;
   c) two or more solvents selected from the group consisting of dimethyl sulfoxide, dimethylformamide, N,N-dimethylpropyleneurea, N-methyl-2-pyrrolidone, dimethylacetamide, formamide, γ-butyrolactone, 2-methoxyethanol, and acetonitrile.
2. The non-stoichiometric perovskite ink solution of embodiment 1, wherein B is selected from the group consisting of lead, tin, cadmium, germanium, zinc, nickel, platinum, palladium, mercury, titanium, silicon, and a mixture thereof.
3. The non-stoichiometric perovskite ink solution of embodiment 1 or 2, wherein B is lead.

3a. The non-stoichiometric perovskite ink solution of embodiment 1, wherein:
   a) said first composition is of formula $FA_{1-x}Cs_xPbI_3$; and
   b) said second composition is of formula CsI, FAI, $REI_3$, or $REI_2$, wherein said second composition is present in said non-stoichiometric ink solution in a molar ratio of about 0.01 mol % to about 10 mol % relative to said first composition.

3aa The non-stoichiometric perovskite ink solution of embodiment 1 or 3a, wherein said second composition is present in said non-stoichiometric ink solution in a molar ratio of about 0.10 mol % to about 5 mol % relative to said first composition.

3b. The non-stoichiometric perovskite ink solution of embodiment 1 or 3a, wherein said second composition is present in said non-stoichiometric ink solution in a molar ratio of about 0.10 mol % to about 2 mol % relative to said first composition.

3bb. The non-stoichiometric perovskite ink solution of embodiment 1 or 3a, wherein said second composition is present in said non-stoichiometric ink solution in a molar ratio of about 0.10 mol % to about 1 mol % relative to said first composition.

3c. The non-stoichiometric perovskite ink solution of embodiment 1, 3a, 3bb, or 3b, wherein said second composition is present in said non-stoichiometric ink solution in a molar ratio of about 0.25 mol % to relative to said first composition.

4. The non-stoichiometric perovskite ink solution of any one of embodiments 1-3, 3a, 3aa, 3b, 3bb, or 3c, wherein x is between 0.01 and 0.50.

5. The non-stoichiometric perovskite ink solution of any one of embodiments 1-4, 3a, 3aa, 3b, 3bb, or 3c, wherein x is between 0.01 and 0.10.

6. The non-stoichiometric perovskite ink solution of any one of embodiments 1-5, 3a, 3aa, 3b, 3bb, or 3c, wherein x is between 0.05 and 0.15.

7. The non-stoichiometric perovskite ink solution of any one of embodiments 1-6, 3a, 3aa, 3b, 3bb, or 3c, wherein x is between 0.07 and 0.35.

8. The non-stoichiometric perovskite ink solution of any one of embodiments 1-7, 3a, 3aa, 3b, 3bb, or 3c, wherein x is 0.08.

9. The non-stoichiometric perovskite ink solution of any one of embodiments 1-8, wherein said second composition of CsX, FAX, $REX_3$, or $REX_2$ is present in a molar ratio of about 0.01 mol % to about 10 mol % relative to said first composition.

10. The non-stoichiometric perovskite ink solution of any one of embodiments 1-9, wherein said second composition of CsX, FAX, $REX_3$, or $REX_2$ is present in a molar ratio of about 0.01 mol % to about 2 mol % relative to said first composition.

11. The non-stoichiometric perovskite ink solution of any one of embodiments 1-10, wherein said second composition of CsX, FAX, $REX_3$, or $REX_2$ is present in a molar ratio of about 0.25 mol % relative to said first composition.

12. The non-stoichiometric perovskite ink solution of any one of embodiments 1-11, 3a, 3aa, 3b, 3bb, or 3c, wherein said rare earth ion is selected from the group consisting of samarium, europium, terbium, cerium, and ytterbium.

13. The non-stoichiometric perovskite ink solution of any one of embodiments 1-12, 3a, 3aa, 3b, 3bb, or 3c, wherein said rare earth ion is samarium or ytterbium.

14. The non-stoichiometric perovskite ink solution of any one of embodiments 1-13, 3a, 3aa, 3b, 3bb, or 3c, wherein said second composition is CsX or FAX.

14a. The non-stoichiometric perovskite ink solution of any one of embodiments 1-13, 3a, 3aa, 3b, 3bb, or 3c, wherein said second composition is CsI or FAI.

15. The non-stoichiometric perovskite ink solution of any one of embodiments 1-14, wherein X, in each instance, is I.

16. The non-stoichiometric perovskite ink solution of any one of embodiments 1-15, 14a, 3aa, 3a, 3b, 3bb, or 3c, wherein said ink solution comprises:

at least one solvent selected from the group consisting of dimethyl sulfoxide, N,N-dimethylpropyleneurea, N-methyl-2-pyrrolidone, dimethylacetamide, formamide, and dimethylformamide; and at least one solvent selected from the group consisting of γ-butyrolactone, 2-methoxyethanol, and acetonitrile.

17. The non-stoichiometric perovskite ink solution of any one of embodiments 1-16, 3a, 3aa, 3b, 3bb, 14a, or 3c, wherein said ink solution comprises three or more solvents.

18. The non-stoichiometric perovskite ink solution of any one of embodiments 1-17, 14a, 3aa, 3a, 3b, 3bb, or 3c, wherein said three or more solvents are 2-methoxyethanol, acetonitrile, and dimethyl sulfoxide.

19. The non-stoichiometric perovskite ink solution of any one of embodiments 1-18, 14a, 3aa, 3a, 3b, 3bb, or 3c, wherein said ink solution comprises 80-99.9% by volume acetonitrile and 2-methoxyethanol and about 0.1-20% by volume dimethyl sulfoxide.

20. The non-stoichiometric perovskite ink solution of any one of embodiments 1-19, 3a, 3aa, 14a, 3b, 3bb, or 3c, wherein said first composition is $FA_{0.92}Cs_{0.08}PbI_3$, said second composition is FAI or CsI, wherein said second composition is present in a molar ratio of about 0.25 mol % relative to said first composition, and said two or more solvents are methoxyethanol, acetonitrile, and dimethyl sulfoxide.

20a. The non-stoichiometric perovskite composition of any one of embodiments 1-20, 4, 3aa, 3a, 14a, 3b, 3bb, or 3c, further comprising one or more additives selected from the group consisting of formamidinium chloride, phenylethylammonium chloride, and formamidinium hypophosphite.

21. A non-stoichiometric perovskite ink solution comprising:

a) a first composition of formula $FA_{1-x}Cs_xBX_3$, wherein,

FA is formamidinium;

x is between 0 and 1;

B is at least one metal cation;

b) a second composition of CsX, FAX, $REX_3$, or $REX_2$;

wherein said second composition is present in a molar ratio of about 0.01 mol % to about 10 mol % relative to said first composition;

X, in each instance, is at least one halide; and

RE is a rare earth ion;

and c) one or more solvents.

21a. The non-stoichiometric perovskite ink solution of embodiment 21, wherein:

a) said first composition is of formula $FA_{1-x}Cs_xPbI_3$; and b) said second composition is of formula CsI, FAI, $REI_3$, or $REI_2$.

22. The non-stoichiometric perovskite ink solution of embodiment 21 or 21a, wherein said one or more solvents are selected from the group consisting of dimethyl sulfoxide, dimethylformamide, N,N-dimethylpropyleneurea, N-methyl-2-pyrrolidone, dimethylacetamide, formamide, γ-butyrolactone, 2-methoxyethanol, and acetonitrile.

23. The non-stoichiometric perovskite ink solution of embodiment 21, 21a, or 22, wherein said ink solution comprises two or more solvents.

24. The non-stoichiometric perovskite ink solution of any one of embodiments 21-23, or 21a, wherein said ink solution comprises:

at least one solvent selected from the group consisting of dimethyl sulfoxide, N,N-dimethylpropyleneurea, N-methyl-2-pyrrolidone, dimethylacetamide, formamide, and dimethylformamide; and at least one solvent selected from the group consisting of γ-butyrolactone, 2-methoxyethanol, and acetonitrile.

25. The non-stoichiometric perovskite ink solution of any one of embodiments 21-24, or 21a, wherein said ink solution comprises three or more solvents.

26. The non-stoichiometric perovskite ink solution of embodiment 25, wherein said three or more solvents are 2-methoxyethanol, acetonitrile, and dimethyl sulfoxide.
27. The non-stoichiometric perovskite ink solution of any one of embodiments 21-26, or 21a, wherein said ink solution comprises 80-99.9% by volume acetonitrile and 2-methoxyethanol and about 0.1-20% by volume dimethyl sulfoxide.
28. The non-stoichiometric perovskite ink solution of any one of embodiments 21-27, wherein B is selected from the group consisting of lead, tin, cadmium, germanium, zinc, nickel, platinum, palladium, mercury, titanium, silicon, and a mixture thereof.
29. The non-stoichiometric perovskite ink solution of any one of embodiments 21-28, wherein B is lead.
30. The non-stoichiometric perovskite ink solution of any one of embodiments 21-29, or 21a, wherein x is between 0.01 and 0.50.
31. The non-stoichiometric perovskite ink solution of any one of embodiments 21-30, or 21a, wherein x is between 0.01 and 0.10.
32. The non-stoichiometric perovskite ink solution of any one of embodiments 21-31, or 21a, wherein x is between 0.05 and 0.15.
33. The non-stoichiometric perovskite ink solution of any one of embodiments 21-32, or 21a, wherein x is 0.08.
34. The non-stoichiometric perovskite ink solution of any one of embodiments 21-33, wherein said second composition of CsX, FAX, $REX_3$, or $REX_2$ (or CsI, FAI, $REI_3$, or $REI_2$) is present in a molar ratio of about 0.01 mol % to about 2 mol % relative to said first composition.
34a. The non-stoichiometric perovskite ink solution of any one of embodiments 21-33, wherein said second composition of CsX, FAX, $REX_3$, or $REX_2$ (or CsI, FAI, $REI_3$, or $REI_2$) is present in a molar ratio of about 0.01 mol % to about 1 mol % relative to said first composition.
35. The non-stoichiometric perovskite ink solution of any one of embodiments 21-34, wherein said second composition of CsX, FAX, $REX_3$, or $REX_2$ (or CsI, FAI, $REI_3$, or $REI_2$) is present in a molar ratio of about 0.25 mol % relative to said first composition.
36. The non-stoichiometric perovskite ink solution of any one of embodiments 21-35 or 21a, wherein said rare earth ion is selected from the group consisting of samarium, europium, terbium, cerium, and ytterbium.
37. The non-stoichiometric perovskite ink solution of any one of embodiments 21-36 or 21a, wherein said rare earth ion is samarium or ytterbium.
38. The non-stoichiometric perovskite ink solution of any one of embodiments 21-37, wherein said second composition is CsX or FAX.
38a. The non-stoichiometric perovskite ink solution of any one of embodiments 21-38 or 21a, wherein said second composition is CsI or FAI.
39. The non-stoichiometric perovskite ink solution of any one of embodiments 21-38, wherein X, in each instance, is $I^-$.
39a. The non-stoichiometric perovskite ink solution of any one of embodiments 21, 21a, 22-39, or 38a, wherein said first composition is $FA_{0.92}Cs_{0.08}PbI_3$, said second composition is FAI or CsI, wherein said second composition is present in a molar ratio of about 0.25 mol % relative to said first composition, and said two or more solvents are methoxyethanol, acetonitrile, and dimethyl sulfoxide.
39b. The non-stoichiometric perovskite composition of any one of embodiments 21, 21a, 22-39, and 38a, further comprising one or more additives selected from the group consisting of formamidinium chloride, phenylethylammonium chloride, and formamidinium hypophosphite.
40. A method of preparing a non-stoichiometric perovskite ink solution comprising, contacting a first precursor ink solution with a second precursor ink solution, wherein:
said first precursor ink solution comprises:
a) a first composition of $CsBX_3$;
b) at least one solvent selected from the group consisting of dimethyl sulfoxide, N,N-dimethylpropyleneurea, N-methyl-2-pyrrolidone, dimethylacetamide, formamide, and dimethylformamide; and
c) optionally, a second composition of CsX, FAX, $REX_3$, or $REX_2$;
said second precursor ink solution comprises:
d) a third composition of $FABX_3$;
e) at least one solvent selected from the group consisting of γ-butyrolactone, 2-methoxyethanol, and acetonitrile; and
f) optionally, a fourth composition of FAX, CsX, $REX_3$, or $REX_2$;
wherein,
FA is formamidinium;
B, in each instance, is at least one metal cation;
X, in each instance, is at least one halide; and
RE is a rare earth ion;
wherein:
i. said first precursor ink solution comprises said second composition; or
ii. said second precursor ink solution comprises said fourth composition; or,
iii. wherein said first precursor ink solution does not comprise said second composition and said second precursor ink solution does not comprise said fourth composition, and prior to preparing said non-stoichiometric perovskite ink solution, a mixed precursor ink solution is prepared, comprising:
contacting said first precursor ink solution with said second precursor ink solution to prepare said mixed precursor ink solution, and contacting a fifth composition of FAX, CsX, $REX_3$, or $REX_2$ with said mixed precursor ink solution to prepare said non-stoichiometric perovskite ink solution.
41. The method of embodiment 40, wherein B is selected from the group consisting of lead, tin, cadmium, germanium, zinc, nickel, platinum, palladium, mercury, titanium, silicon, and a mixture thereof.
42. The method of embodiment 40 or 41, wherein B is lead.
42a. The method of embodiment 40, wherein:
said first composition is $CsPbI_3$;
said second composition is CsI, FAI, $REI_3$, or $REI_2$;
said third composition is $FAPbI_3$;
said fourth composition is FAI, CsI, $REI_3$, or $REI_2$; and
said fifth composition is FAI, CsI, $REI_3$, or $REI_2$.

43. The method of any one of embodiments 40-42 or 42a, wherein said first precursor ink comprises dimethyl sulfoxide.
44. The method of any one of embodiments 40-43 or 42a, wherein said second precursor ink comprises at least two solvents.
45. The method of any one of embodiments 40-44 or 42a, wherein said second precursor ink comprises 2-methoxyethanol and acetonitrile.
46. The method of any one of embodiments 40-45 or 42a, wherein said 2-methoxyethanol and acetonitrile are mixed in a volume ratio of 1:0 to 1:5.
47. The method of any one of embodiments 40-46 or 42a, wherein said second precursor solution is contacted with said first precursor solution in a volume ratio of about 1:1 to about 100:1.
48. The method of any one of embodiments 40-47 or 42a, wherein said second precursor solution is contacted with said first precursor solution in a volume ratio of about 21:1.
49. The method of any one of embodiments 40-49 or 42a, wherein said first precursor ink solution comprises said second composition of CsX, FAX, $REX_3$, or $REX_2$ (or CsI, FAI, $REI_3$, or $REI_2$) or said second precursor ink solution comprises said fourth composition of CsX, FAX, $REX_3$, or $REX_2$ (or CsI, FAI, $REI_3$, or $REI_2$).
50. The method of any one of embodiments 40-49 or 42a, wherein said CsX, FAX, $REX_3$, or $REX_2$ (or CsI, FAI, $REI_3$, or $REI_2$) is added to said first precursor ink solution or said second precursor ink solution in about a 0.01 mol % to 10 mol % ratio relative to said $CsBX_3$ or $FABX_3$ (or $CsPbI_3$ or $FAPbI_3$).
51. The method of any one of embodiments 40-50 or 42a, wherein said CsX, FAX, $REX_3$, or $REX_2$ (or CsI, FAI, $REI_3$, or $REI_2$) is added to said first precursor ink solution or said second precursor ink solution in about a 0.01 mol % to 2 mol % ratio relative to said $CsBX_3$ or $FABX_3$ (or $CsPbI_3$ or $FAPbI_3$).
52. The method of any one of embodiments 40-51 or 42a, wherein said CsX, FAX, $REX_3$, or $REX_2$ (or CsI, FAI, $REI_3$, or $REI_2$) is added to said first precursor ink solution or said second precursor ink solution in about a 0.25 mol % ratio relative to said $CsBX_3$ or $FABX_3$ (or $CsPbI_3$ or $FAPbI_3$).
53. The method of any one of embodiments 40-52 or 42a, wherein said rare earth ion is selected from the group consisting of samarium, europium, terbium, cerium, and ytterbium.
54. The method of any one of embodiments 40-53 or 42a, wherein said rare earth ion is samarium or ytterbium.
55. The method of any one of embodiments 40-54 or 42a, wherein CsX is added to said first precursor ink solution or FAX is added to said second precursor ink solution.
56. The method of any one of embodiments 40-55 or 42a, wherein X, in each instance, is $I^-$.
57. The non-stoichiometric perovskite ink solution of any one of embodiments 1-39, 3a, 3aa, 14a, 3b, 21a, or 3c, having a vapor pressure of about 5 to 100 kPa, for use in a fast-coating process, wherein said fast coating process is selected from the group consisting of blade-coating, slot die coating, shear coating, gravure coating, brush coating, syringe coating, and screen printing.
58. A method for producing a polycrystalline perovskite film using the non-stoichiometric ink solution of any one of embodiments 1-39, 3a, 14a, 3aa, 3b, or 3c, said method comprising:
contacting said ink solution of any one of embodiments 1-39, 3a, 3aa, 14a, 3b, or 3c using a fast coating process onto a substrate to form a film, wherein said fast coating process is selected from the group consisting of blade coating, slot die coating, shear coating, gravure coating, brush coating, syringe coating, and screen printing.
59. The method of embodiment 58, wherein said fast-coating process is blade coating.
60. The method of embodiment 58 or 59, wherein said contacting of the ink solution onto said substrate using said fast coating process proceeds at about 99 mm/s.
61. The method of any one of embodiments 58-60, wherein said method produces a polycrystalline perovskite film with an area of at least 1 $cm^2$.
62. A non-stoichiometric polycrystalline film comprising:
a) a first composition of formula $FA_{1-x}Cs_xBX_3$; wherein,
FA is formamidinium;
x is between 0 and 1;
B is at least one metal cation; and
b) a second composition of CsX, FAX, $REX_3$, or $REX_2$; wherein RE is a rare earth ion; and
X, in each instance is at least one halide, and,
wherein said film comprises said second composition of CsX, FAX, $REX_3$, or $REX_2$ in about a 0.01 mol % to about 10 mol % ratio relative to said first composition of formula $FA_{1-x}Cs_xBX_3$.
62a. The non-stoichiometric polycrystalline film of embodiment 62, wherein
a) said first composition is of formula $FA_{1-x}Cs_xPbI_3$; and
b) said second composition is of formula CsI, FAI, $REI_3$, or $REI_2$.
63. The non-stoichiometric polycrystalline film of embodiment 62 or 62a, wherein said film has an area of at least 1 $cm^2$.
64. The non-stoichiometric polycrystalline film of embodiment 62, 62a, or 63, wherein said film has an area of at least 25 $cm^2$.
65. The non-stoichiometric polycrystalline film of any one of embodiments 62-64 or 62a, wherein said film comprises said second composition of CsX, FAX, $REX_3$, or $REX_2$ (or CsI, FAI, $REI_3$, or $REI_2$) in about a 0.01 mol % to about 2 mol % ratio relative to said first composition of formula $FA_{1-x}Cs_xBX_3$ (or $FA_{1-x}Cs_xPbI_3$).
66. The non-stoichiometric polycrystalline film of any one of embodiments 62-65 or 62a, wherein said film comprises said second composition of CsX, FAX, $REX_3$, or $REX_2$ (or CsI, FAI, $REI_3$, or $REI_2$) in about a 0.01 mol % to about 0.5 mol % ratio relative to said first composition of formula $FA_{1-x}Cs_xBX_3$ (or $FA_{1-x}Cs_xPbI_3$).
67. The non-stoichiometric polycrystalline film of any one of embodiments 62-66 or 62a, wherein said film comprises said second composition of CsX, FAX, $REX_3$, or $REX_2$ (or CsI, FAI, $REI_3$, or $REI_2$) in about a 0.25 mol % ratio relative to said first composition of formula $FA_{1-x}Cs_xBX_3$ (or $FA_{1-x}Cs_xPbI_3$).
68. The non-stoichiometric polycrystalline film of any one of embodiments 62-67 or 62a, wherein said rare earth ion is selected from the group consisting of samarium, europium, terbium, cerium, and ytterbium.
69. The non-stoichiometric polycrystalline film of any one of embodiments 62-68 or 62a, wherein said rare earth ion is samarium or ytterbium.

70. The non-stoichiometric polycrystalline film of any one of embodiments 62-69 or 62a, wherein said second composition is CsX or FAX.

70a. The non-stoichiometric polycrystalline film of any one of embodiments 62-70 or 62a, wherein said second composition is CsI or FAI.

71. The non-stoichiometric polycrystalline film of any one of embodiments 62-70, 62a, or 70a, wherein B is selected from the group consisting of lead, tin, cadmium, germanium, zinc, nickel, platinum, palladium, mercury, titanium, silicon, and a mixture thereof.

72. The non-stoichiometric polycrystalline film of any one of embodiments 62-71, 62a, or 70a, wherein B is lead.

73. The non-stoichiometric polycrystalline film of any one of embodiments 62-72, 62a, or 70a, wherein X, in each instance, is $I^-$.

74. The non-stoichiometric polycrystalline film of any one of embodiments 62-73, 62a, or 70a, wherein x is between 0.01 and 0.50.

75. The non-stoichiometric polycrystalline film of any one of embodiments 62-74, 62a, or 70a, wherein x is between 0.01 and 0.10.

76. The non-stoichiometric polycrystalline film of any one of embodiments 62-75, 62a, or 70a, wherein x is between 0.05 and 0.15.

77. The non-stoichiometric polycrystalline film of any one of embodiments 62-76, 62a, or 70a, wherein x is between 0.07 and 0.35.

78. The non-stoichiometric perovskite film of any one of embodiments 62-77, 62a, or 70a, wherein x is 0.08.

79. The non-stoichiometric polycrystalline film of any one of embodiments 62-78, 62a, or 70a, wherein said film has an area of at least 50 $cm^2$.

80. The non-stoichiometric polycrystalline film of any one of embodiments 62-79, 62a, or 70a, wherein said first composition is of formula $FA_{0.92}C_{0.08}PbI_3$, said second composition is of FAI or CsI, wherein said film comprises said second composition in about a 0.25 mol % ratio relative to said first composition of $FA_{0.92}C_{0.08}PbI_3$.

80a. The non-stoichiometric polycrystalline film of any one of embodiments 62-80, 62a, or 70a, further comprising one or more additives selected from the group consisting of formamidinium chloride, phenylethylammonium chloride, and formamidinium hypophosphite.

81. A semiconductor device comprising:
one or more anode layers;
one or more cathode layers; and
one or more active layers, wherein at least one of said one or more active layers comprises the non-stoichiometric polycrystalline film of any one of embodiments 62-79, 62a, 80a, or 70a.

82. The semiconductor device of embodiment 81, wherein said device is selected from the group consisting of solar cell, light emitting diode, photodiode, photoelectrochemical cell, photoresistor, phototransistor, photomultiplier, photoelectric cell, electrochromic cell, and radiation detector.

83. The semiconductor device of embodiment 81 or 82, wherein said solar cell is a single junction solar cell.

84. The semiconductor device of any one of embodiments 81-83, wherein said solar cell is a tandem solar cell.

85. A solar cell, comprising:
one or more transparent conductive oxide layers;
one or more conductive electrode layers;
one or more hole transport layers;
one or more electron transport layers; and
one or more active layers, wherein at least one of said one or more active layers comprises the non-stoichiometric polycrystalline film of any one of embodiments 62-79, 62a, 80a, or 70a.

86. The solar cell of embodiment 85, wherein said solar cell comprises:
one transparent conductive oxide layer;
one conductive electrode layer;
one hole transport layer;
one electron transport layer; and
one active layer, wherein said active layer comprises said non-stoichiometric polycrystalline film.

87. The solar cell of embodiment 86, wherein:
said hole transport layer is disposed directly on said transparent conductive oxide layer;
said active layer comprising said non-stoichiometric polycrystalline film is disposed directly on said hole transport layer;
said electron transport layer is disposed directly on said active layer; and
said conductive electrode layer is disposed on said electron transport layer.

88. The solar cell of embodiment 86, wherein:
said electron transport layer is disposed directly on said transparent conductive oxide layer;
said active layer comprising said non-stoichiometric polycrystalline film is disposed directly on said electron transport layer;
said hole transport layer is disposed directly on said active layer; and said conductive electrode layer is disposed directly on said hole transport layer.

89. The solar cell of any one of embodiments 85-88, wherein said one or more hole transport layers are selected from the group consisting of PTAA, Spiro-OMeTAD, PEDOT:PSS, NiO, $MoO_3$, $V_2O_5$, Poly-TPD, EH44, P3HT, and a combination thereof.

90. The solar cell of any one of embodiments 85-89, wherein said one or more electron transport layers are selected from the group consisting of C60, BCP, $TiO_2$, $SnO_2$, PCBM, ICBA, ZnO, ZrAcac, LiF, TPBI, PFN, $Nb_2O_5$, and a combination thereof.

91. The solar cell of any one of embodiments 85-90, wherein said one or more transparent conductive oxide layers are selected from the group consisting of ITO, FTO, ZITO, and AZO.

92. The solar cell of any one of embodiments 85-91, wherein said one or more conductive electrode layers are selected from the group consisting of Al, Au, Cu, Cr, Ca, Mg, Ag, and Ti.

93. The solar cell of claim of embodiment 87, wherein:
said transparent conductive oxide layer is indium tin oxide;
said hole transport layer is PTAA;
said electron transport layer is $C_{60}$; and
said conductive electrode layer is Cu.

94. The solar cell of any one of embodiments 85-93, further comprising a buffer layer of BCP disposed between said electron transport layer and said conductive electrode layer.

95. The solar cell of any one of embodiments 85-94, further comprising a glass layer, wherein said transparent conductive oxide layer is disposed on said glass layer.

96. The solar cell of any one of embodiments 85-95, having a Power Conversion Efficiency of at least 20%.

97. A solar module, comprising a plurality of the solar cell of any one of embodiments 85-96.
98. The solar module of embodiment 97, wherein said module has an aperture area of at least 20 $cm^2$.
99. The solar module of any one of embodiments 97-98, wherein said module has an aperture area of at least 29 $cm^2$.
100. The solar module of any one of embodiments 97-99, wherein said module has an aperture area of at least 44 $cm^2$.
101. The solar module of any one of embodiments 97-100, having an aperture efficiency of at least 17%.
102. The solar module of any one of embodiments 97-101, having an aperture efficiency of at least 18%.
103. A kit, comprising:
   a) a first vial comprising a first precursor solution comprising:
   a composition of formula $CsBX_3$;
   at least one solvent selected from the group consisting of dimethyl sulfoxide, dimethylformamide, N,N-dimethylpropyleneurea, N-methyl-2-pyrrolidone, dimethylacetamide, formamide, and;
   optionally, a composition of CsX, FAX, $REX_3$, or $REX_2$;
   b) a second vial comprising a second precursor solution comprising:
   a composition of formula $FABX_3$;
   at least one solvent selected from the group consisting of γ-butyrolactone, 2-methoxyethanol, and acetonitrile; and
   optionally, a composition of FAX, CsX, $REX_3$, or $REX_2$;
   wherein, FA is formamidinium;
   B is at least one metal cation;
   RE is a rare earth ion; and,
   X, in each instance is at least one halide;
   wherein said first or said second vial comprises a composition of CsX, FAX, $REX_3$, or $REX_2$;
   and
   c) instructions for use.

The following examples are offered by way of illustration and not by way of limitation.

EXAMPLES

Example 1: Preparation of $FA_{0.92}Cs_{0.08}PbI_3$

Figures 1A, 1B, 1C, 1D:
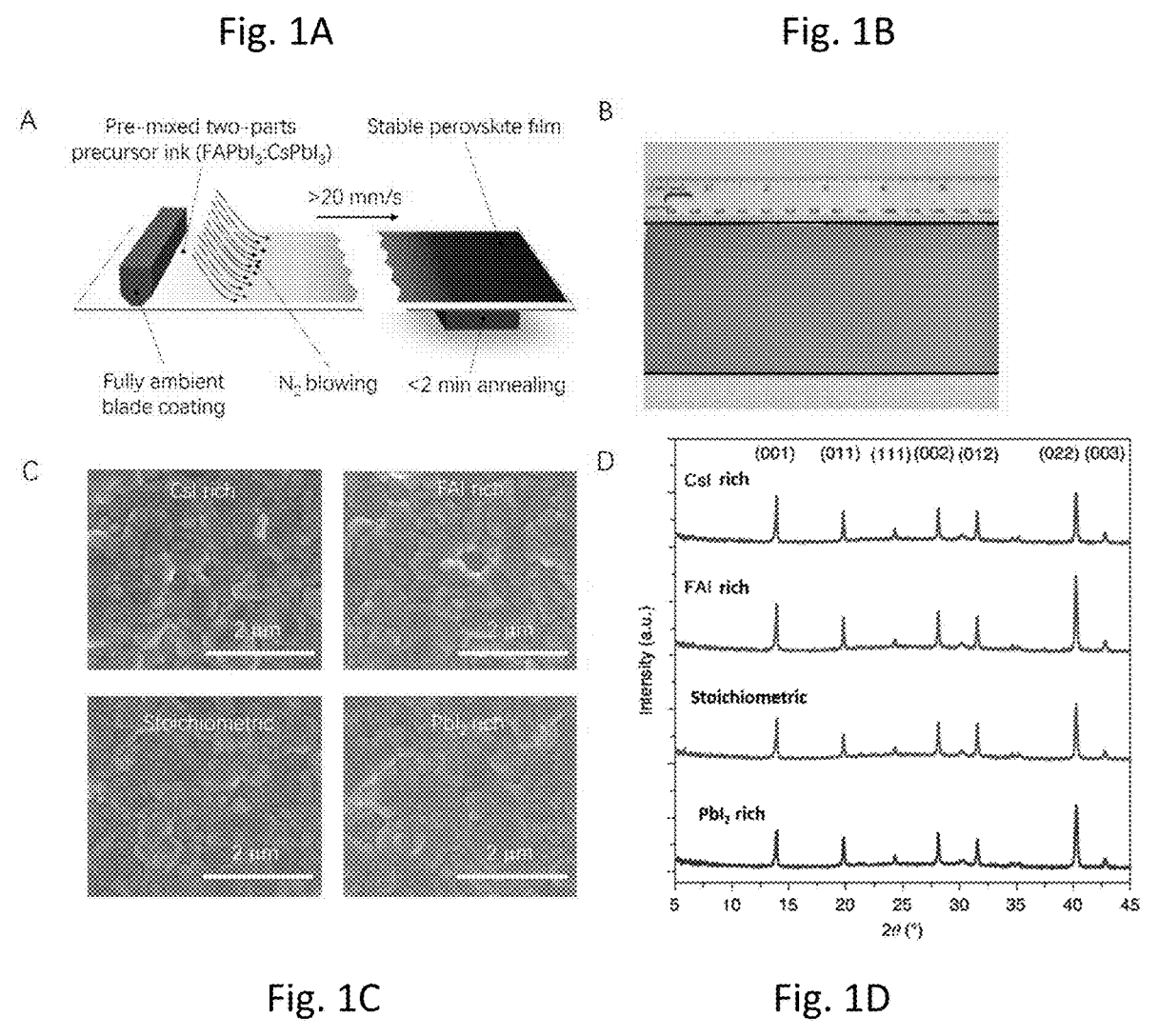

FIG. 1A illustrates the scalable fabrication of stable perovskite thin films. A combination of solvent formulation and nitrogen knife deposits and dries the precursor ink on the substrates. This method has been shown to successfully deposit methylammonium lead iodide ($MAPbI_3$) films at room temperature at a rate of 99 millimeters per second, and yield an aperture efficiency of 16.4% for an aperture area of 50 $cm^2$ certified by National Renewable Energy Laboratory (NREL).[9] However, MA-containing perovskites frequently exhibit problems with instability as a result of their volatile nature, and CsFA (FA: Formamidinium; Cs: Cesium) perovskites typically exhibit better stability under heat and illumination[4].

A MA-free perovskite composition of $FA_{0.92}Cs_{0.08}PbI_3$ was first investigated. However, this composition brought new challenges in scalable blade coating. It was discovered that the Cs-containing precursors had difficulty dissolving in 2-ME or acetonitrile (ACN). Fortunately, the Cs-containing precursors were still soluble in N,N-Dimethylformamide (DMF) and/or dimethyl sulfoxide (DMSO). However, the Cs-containing precursors could not be directly dissolved in a solvent system composed of a small fraction of DMSO and a larger fraction of 2-ME/ACN. To overcome this problem, two precursor inks were developed first, and only mixed right before the perovskite film coating. One precursor ink was $FAPbI_3$ dissolved in a mixed solvent of 2-methoxyethanol and acetonitrile at a ratio of ~1:1, and a concentration of ~1.1 M, and the other ink was $CsPbI_3$ dissolved in dimethyl sulfoxide at a saturated concentration of ~2.0 M. Before coating, the two parts were mixed at a ratio of 21:1 to obtain the designated composition. The mixed ink was stable at room temperature for at least 30 min, which was a sufficient time window for fabrication. The mixed ink could also be stored at cryogenic temperatures (e. g. −20° C.) for at least one month without any deterioration of the quality of the deposited thin films. The mixed ink was then blade coated on the substrate at a speed of over 20 mm/s at room temperature in an ambient environment without humidity control. After that, the dried precursor film was annealed for about 1-2 min at 150° C. to complete the formation of perovskite thin films.

Figure 17:
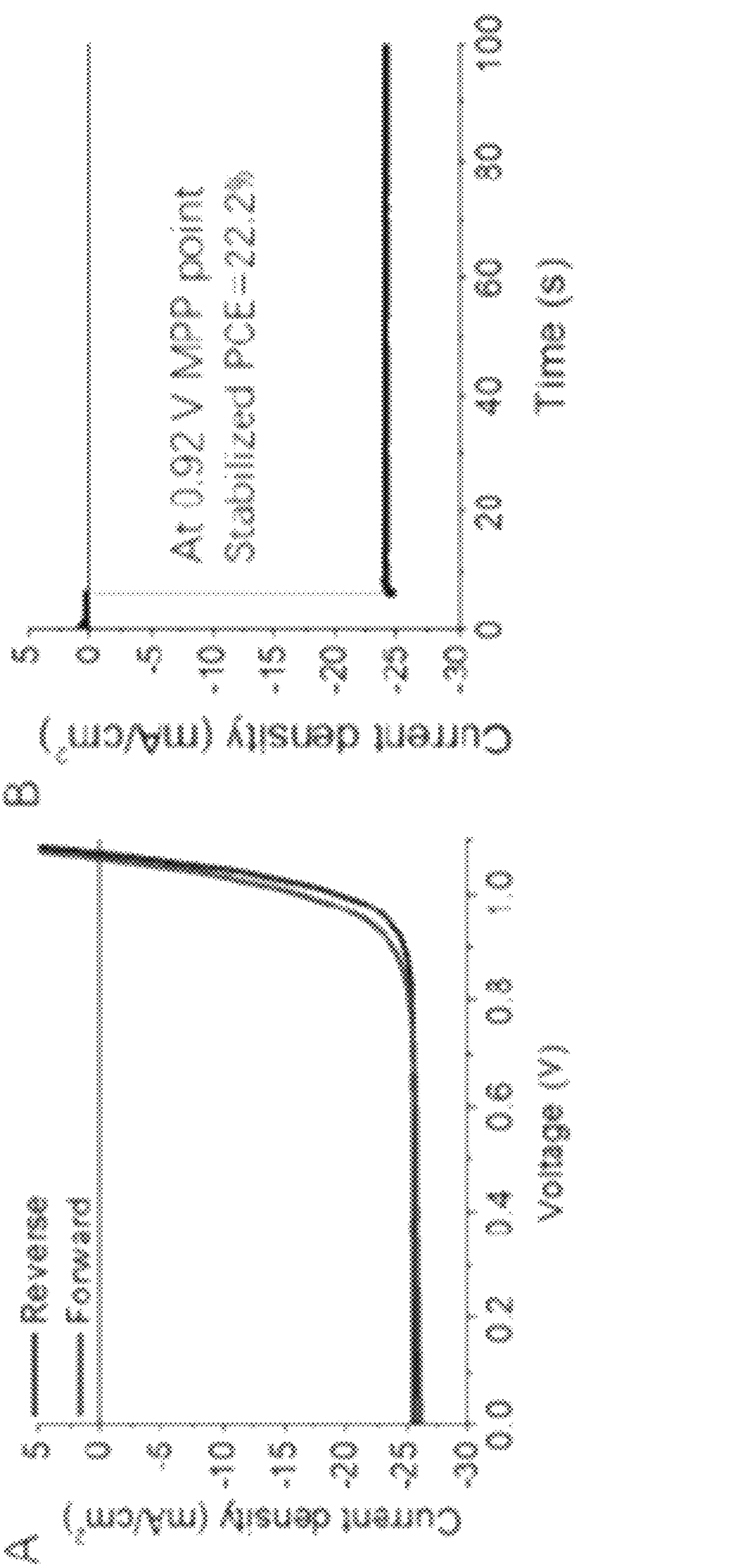
FIG. 17 shows current-voltage scanning curves (A) and stabilized photocurrent output (B) at the maximum power point of a small area stoichiometric FACs perovskite solar cell under simulated one sun illumination.

It was discovered that short annealing not only reduced the manufacturing throughput, but also enhanced the efficiency of $MAPbI_3$ modules due to the promoted de-doping during aging.[10] The photo of $FA_{0.92}Cs_{0.08}PbI_3$ films with an area of 84 $cm^2$ and good uniformity is shown in FIG. 1B. The scanning electron microscopy (SEM) images show that the perovskite films have grain sizes on the order of several hundred nanometers to one micrometer (FIG. 1C). X-ray (XRD) spectroscopy shows that the films are pure perovskite phase without notable lead iodide or "yellow phase" which are often reported in FA/Cs perovskite systems (FIG. 1D).[4,11] The films were thermally stable without a color change after annealing at 85° C. for 1,000 hours and remained black after illumination for one month in an inert environment. Small-area (8 $mm^2$) solar cells fabricated from these films could reach a champion efficiency of 22.2% (FIG. 17). However, the compositions did not yield a better device operational stability under 1 sun illumination compared with methylammonium-based perovskites, indicating that an electronic degradation likely occurs before the FACs perovskite decomposes.

Example 2: Preparation of Non-Stoichiometric Perovskite Compositions; Excessive AX Improves Device Photostability After establishing the blading of large area $FA_{0.92}Cs_{0.08}PbI_3$, the influence of non-stoichiometric perovskite compositions was investigated on the efficiency and stability of perovskite solar cells and modules. In the investigation of how metal ion additives impact the efficiency and stability of MHPs, it was discovered that $Cs^+$, samarium ions ($Sm^{2+}$), and ytterbium ions ($Yb^{2+}$) ions added from their respective iodide salts at a molar ratio of 0.25 mol % relative to lead ions ($Pb^{2+}$)improved the device stability, while other metal ions, such as calcium ions ($Ca^{2+}$), potassium ions ($K^+$), sodium ions ($Na^{2+}$), ferrous ions ($Fe^{2+}$), cerium ions ($Ce^{3+}$), magnesium ($Mg^{2+}$) added from their respective iodide salts at the same concentrations did not impact the stability and/or decreased the efficiency of the device, as shown in FIG. 2. Since $Cs^+$ is one A site cation, other major A site cations were investigated. After adding $FA^+$ through FAI, similar enhancements of the film stability and device performance were observed.

The non-stoichiometric perovskite films were produced by introducing more FAI, CsI (FAI/CsI rich), or $PbI_2$ ($PbI_2$ rich), at a molar ratio of 0.25 mol % relative to the initial Pb ions to the precursor ink. Without wishing to be bound by theory, it is understood that the addition of AX at a molar percentage of 0.25 mol % to lead ions residing at the grain boundaries increases the local chemical potential, preventing the generation and migration of iodide vacancies ($V_I$) from grain boundaries under illumination. The SEM and XRD data show that the non-stochiometric perovskite films are similar in quality to the stoichiometric film. This indicates that the slightly off-stoichiometries do not significantly change the perovskite crystallization or grain growth behavior in the blading process (FIG. 1C and FIG. 1D). Of note, all peaks from the films could be indexed to the perovskite phase except one peak at around 30°, which can be attributed to the indium tin oxide (ITO) layer underneath. These results indicate that all films are of a pure perovskite phase.

Example 3: Investigation of the Non-Stoichiometric Perovskite Films in Devices

Figures 3A, 3B, 3C, 3D, 3E, 3F, 3G:
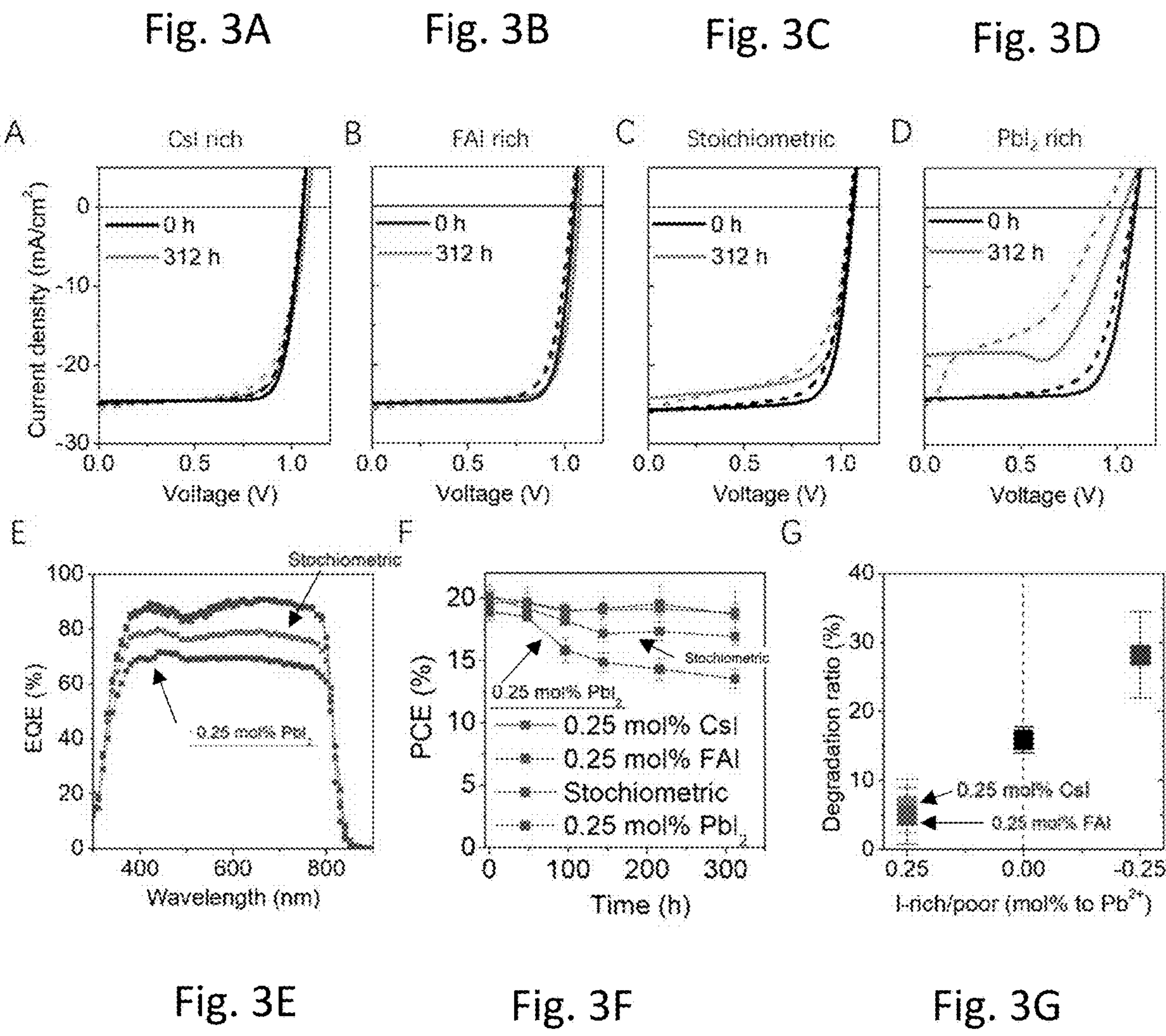
FIG. 3A shows current-voltage scanning curves of perovskite solar cells under simulated one sun illumination with a CsI rich composition before and after light soaking for over 300 h at open circuit conditions. Solid/dashed lines represent reverse/forward scanning direction.
FIG. 3B shows current-voltage scanning curves of perovskite solar cells under simulated one sun illumination with a FAI rich composition before and after light soaking for over 300 h at open circuit conditions. Solid/dashed lines represent reverse/forward scanning direction.
FIG. 3C shows current-voltage scanning curves of perovskite solar cells under simulated one sun illumination with a stoichiometric composition before and after light soaking for over 300 h at open circuit conditions. Solid/dashed lines represent reverse/forward scanning direction.
FIG. 3D shows current-voltage scanning curves of perovskite solar cells under simulated one sun illumination with a $PbI_2$ rich composition before and after light soaking for over 300 h at open circuit conditions. Solid/dashed lines represent reverse/forward scanning direction.
FIG. 3E shows a plot of the external quantum efficiencies of the devices shown in Figure A through Figure D after light soaking.
FIG. 3F shows the power conversion efficiency (PCE) of devices with different compositions as a function of time during light soaking.
FIG. 3G shows a plot of the degradation ratio of devices as a function of composition after light soaking.
Figures 8, 9:
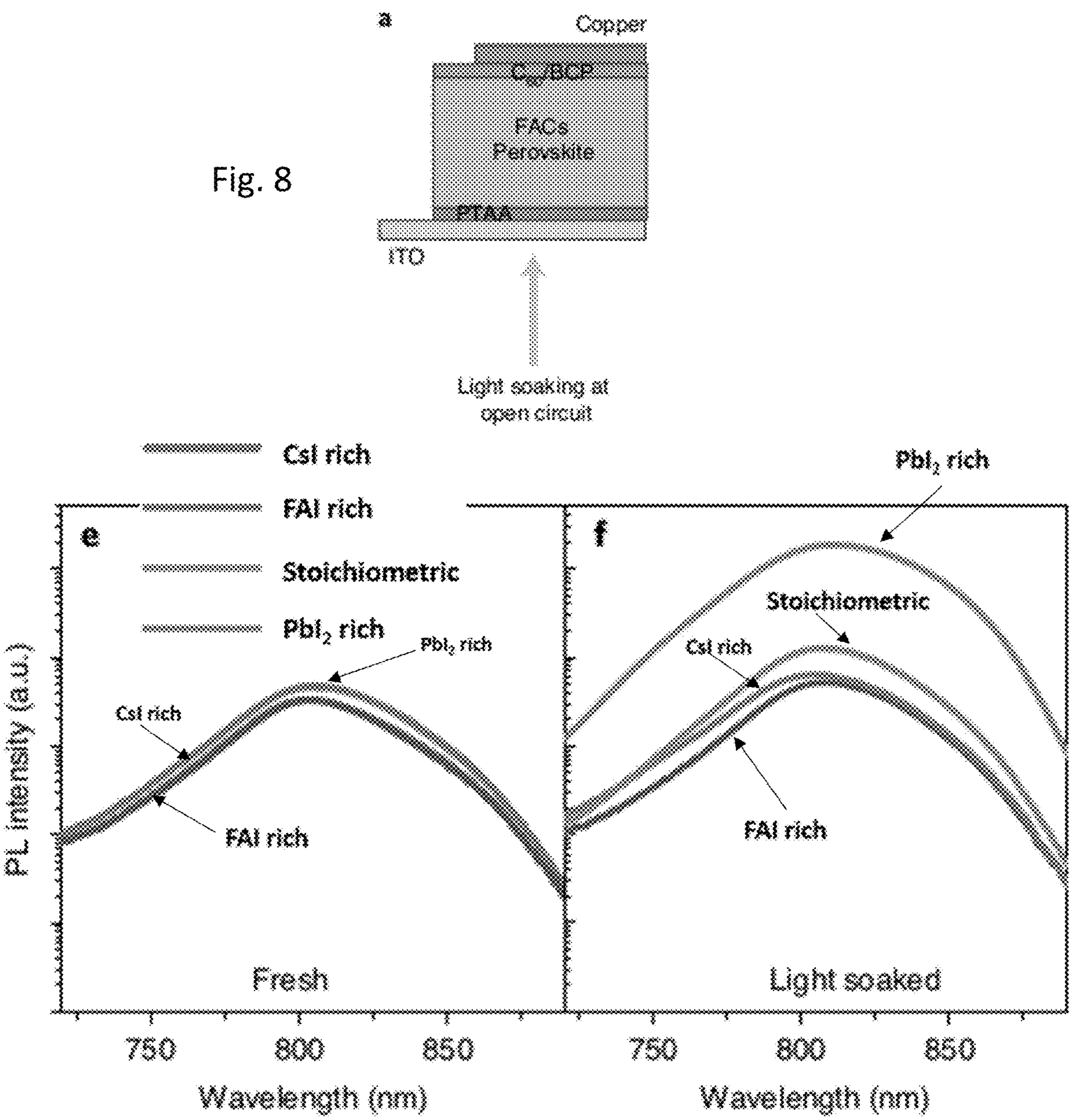
FIG. 8 shows a device structure of blade-coated small-area solar cells for accelerated photostability study under open circuit conditions.
FIG. 9 shows photoluminescence spectra of perovskite devices excited by a 640 nm laser before (left) and after (right) light soaking.

The stability of different perovskite stoichiometries in the films were compared on the device level. The device structure investigated was glass/indium tin oxide (ITO)/Poly[bis(4-phenyl)(2,4,6-trimethylphenyl)amine](PTAA)/perovskite/$C_{60}$/Bathocuproine (BCP)/Copper (Cu) (FIG. 8). Small area single cells were fabricated and encapsulated and aged under simulated one sun illumination at open circuit conditions. The J-V curves of devices before and after 300 h light soaking are shown in FIG. 3A through 3D. During this period, the FAI/CsI rich devices exhibited almost no changes in open circuit voltage ($V_{OC}$), short circuit current density ($J_{SC}$), and fill factor (FF) (FIGS. 3A and 3B). Conversely, the stoichiometric and $PbI_2$ rich devices both exhibited a reduction in FF and larger hysteresis (FIGS. 3C and 3D). A large difference in $J_{SC}$ values between the reverse and forward scanning was observed in the $PbI_2$ rich device. Consistently, the FAI/CsI rich devices maintained their high external quantum efficiencies, which matched the $J_{SC}$ values of fresh devices (FIG. 3E). The degradation of the efficiency of the devices with different compositions as a function of time during light soaking is shown in FIG. 3F and their degradation ratios (the percentage of lost efficiency to the initial efficiency) are summarized in FIG. 3G. Each device composition was statistically summarized by evaluating the performance of 3-5 devices. The results indicate that FAI/CsI rich devices are more stable than their stoichiometric counterpart. Additionally, the results are reproducible. Worthwhile noting is that the perovskite films in the degraded devices still appeared dark, indicating that the efficiency degradation is predominately due to defect generation that can lead to photo-carrier trapping, but not material decomposition.

Figure 18:
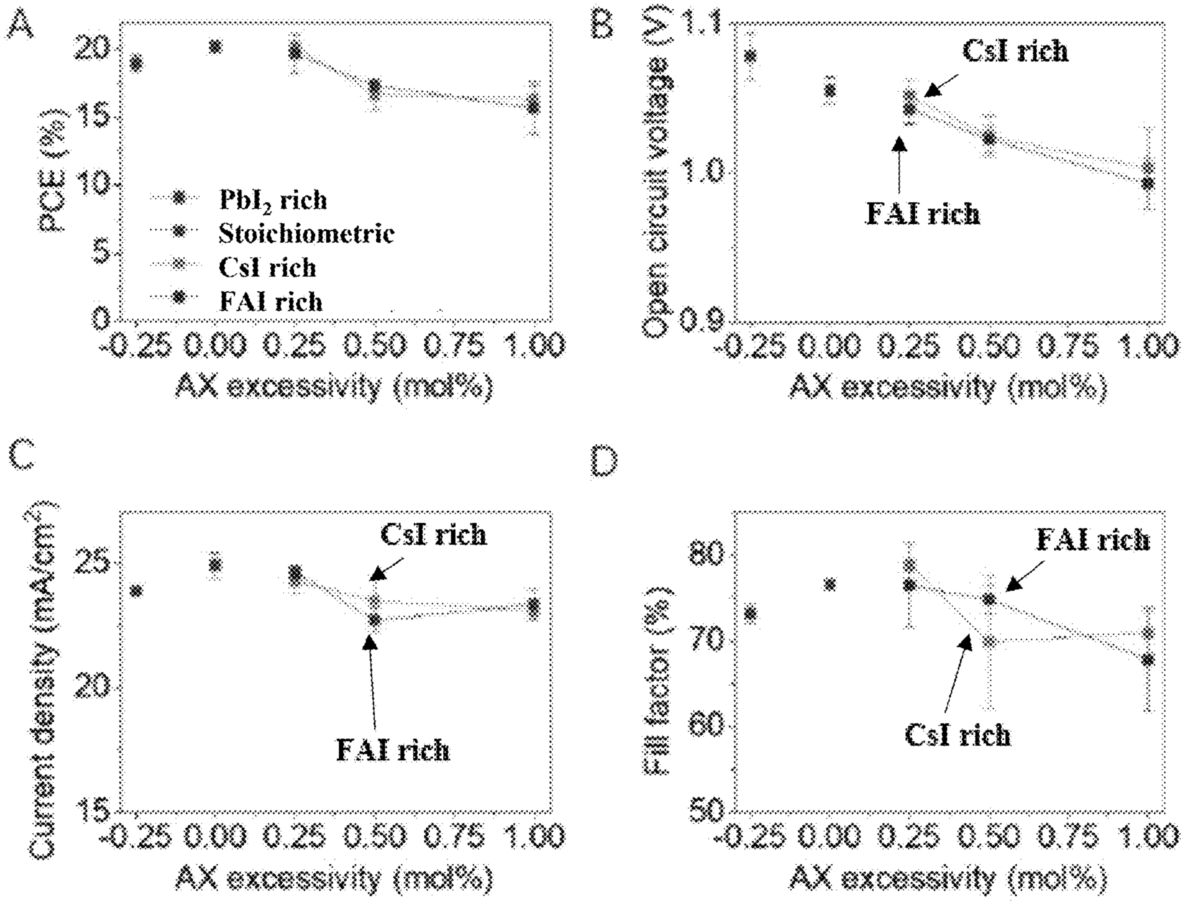
FIG. 18 shows plots of the performance of FACs-perovskite solar cells with different compositions. (A) PCE, (B) open circuit voltage, (C) short circuit current density, and (D) fill factor of FACs-perovskite solar cells as a function of different amounts of excessive AX. The error bars represent standard deviations of samples with different compositions of deficient AX ($PbI_2$-rich) (n=3), control (n=6), 0.25 mol % excessive CsI (n=5), 0.25 mol % excessive FAI (n=3), 0.50 mol % excessive CsI (n=4), 0.50 mol % excessive FAI (n=5), 1.00 mol % excessive CsI (n=6), 1.00 mol % excessive FAI (n=7). Lines are guides to the eye.
Figure 19:
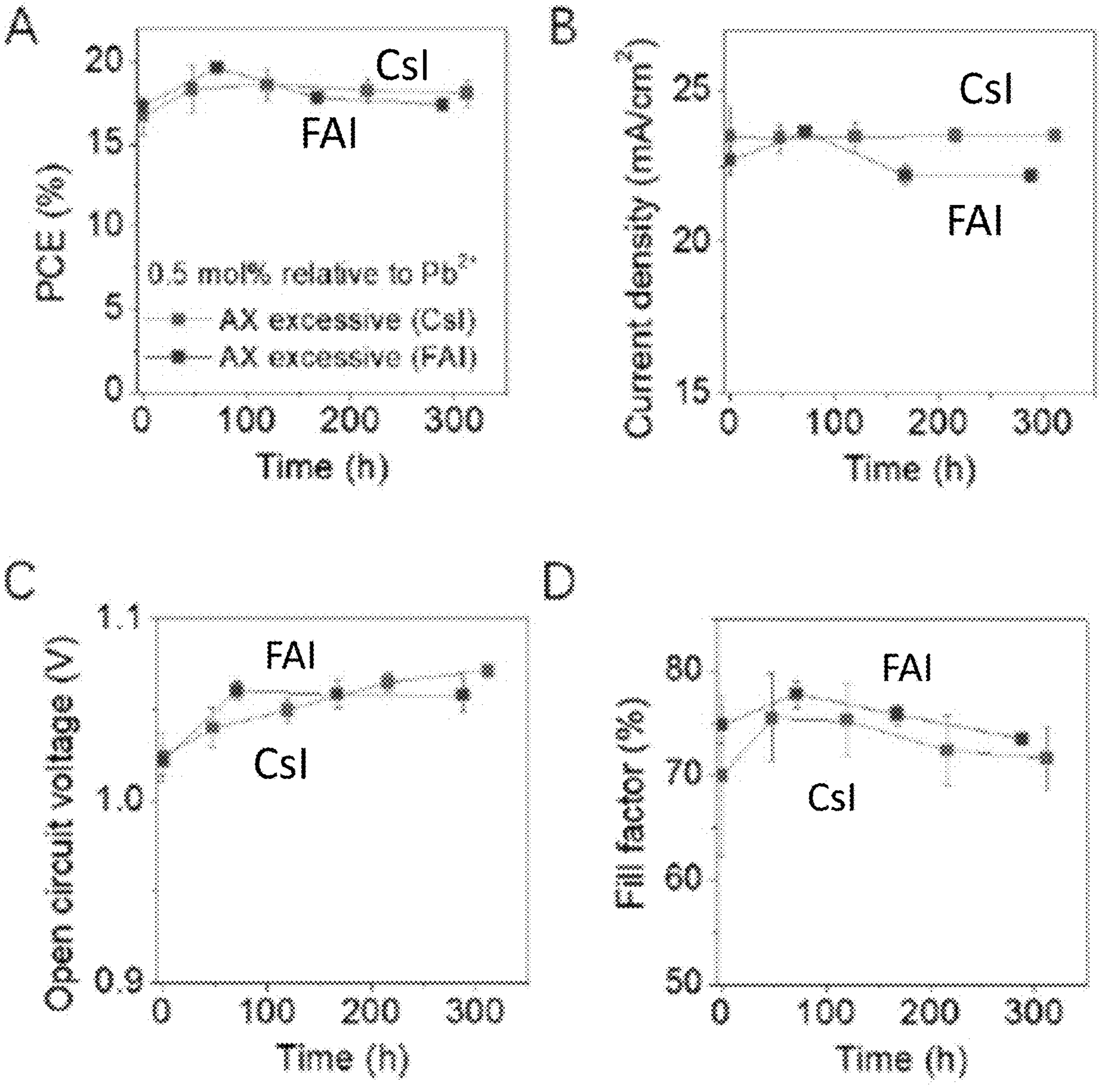
FIG. 19 shows plots of the photostability of FACs-perovskite solar cells with 0.5 mol % excessive FAI and CsI. Evolution of PCE (A), short circuit current density (B), open circuit voltage (C) and fill factor (D) of FACs-perovskite solar cells under simulated one sun illumination with 0.5 mol % excessive FAI and CsI after being light soaked at an open circuit conditions with increasing time. The number of CsI excessive devices was 4 and that of FAI excessive devices was 5. The error bars represent the standard deviation. Lines are guides to the eye.
Figure 20:
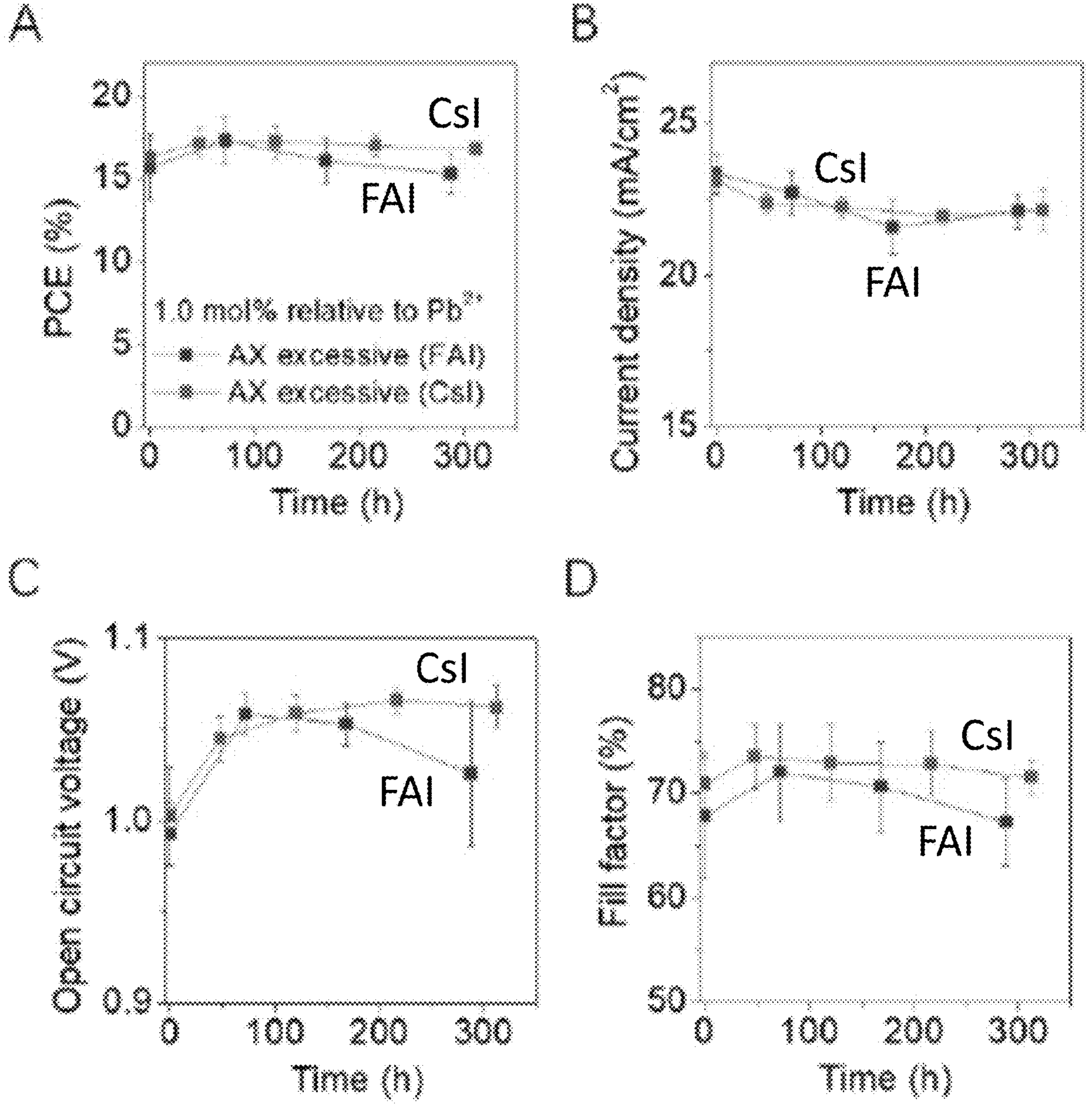
FIG. 20 shows plots of the photostability of FACs-perovskite solar cells with 1.0 mol % excessive FAI and CsI. Evolution of PCE (A), short circuit current density (B), open circuit voltage (C) and fill factor (D) of FACs-perovskite solar cells with 1.0 mol % excessive FAI and CsI under simulated one sun illumination after being light soaked at open circuit conditions with increasing time. The number of CsI excessive devices was 6 and that of FAI excessive devices was 7. The error bars represent the standard deviation. Lines are guides to the eye.

Of note, adding more AX additive (0.5 mol % and 1.0 mol % relative to $Pb^{2+}$ ions) into the perovskite solution resulted in similarly improved photostability as that with 0.25 mol %, though with reduced initial efficiencies, which could be induced by unreacted, insulating AX in the perovskite films (FIGS. 18, 19 and 20). It was discovered that higher concentrations of AX decreased the device efficiency.

Example 4: Excessive AX Maintains Fast Photocarrier Extraction

Figure 10:
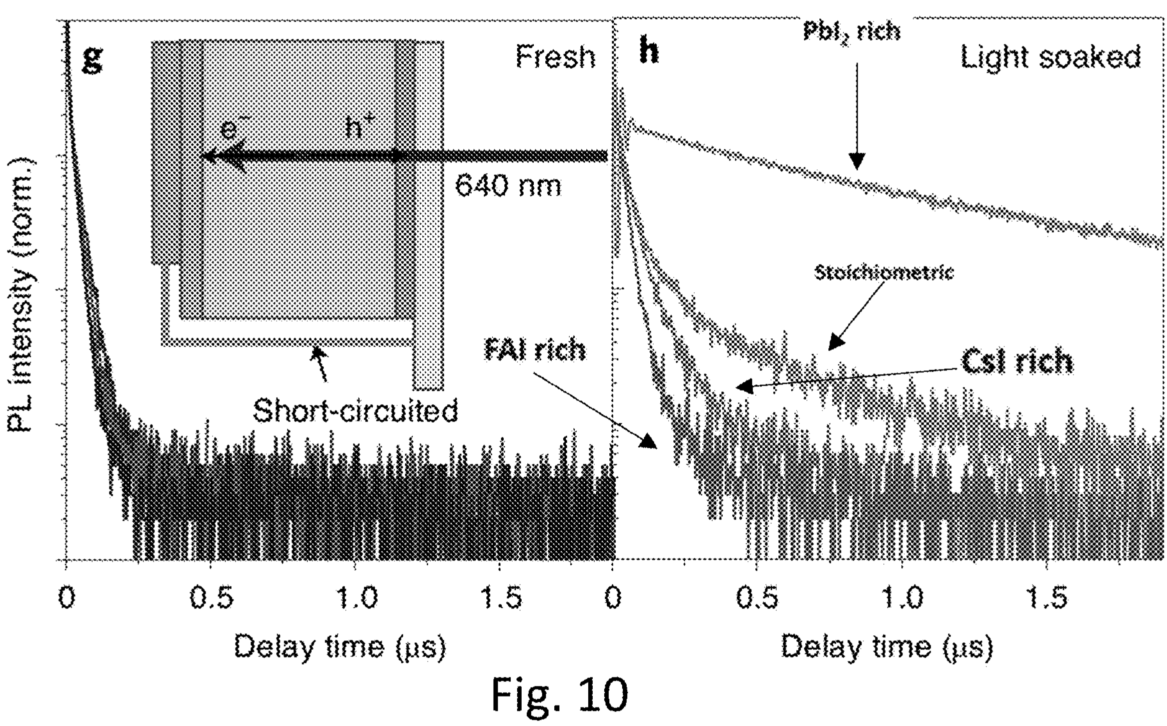
FIG. 10 shows TRPL spectra of perovskite devices excited by a 640 nm laser before (left) and after light soaking (right). The photoluminescence and TRPL studies were done when devices were at short-circuited condition.
Figure 22:
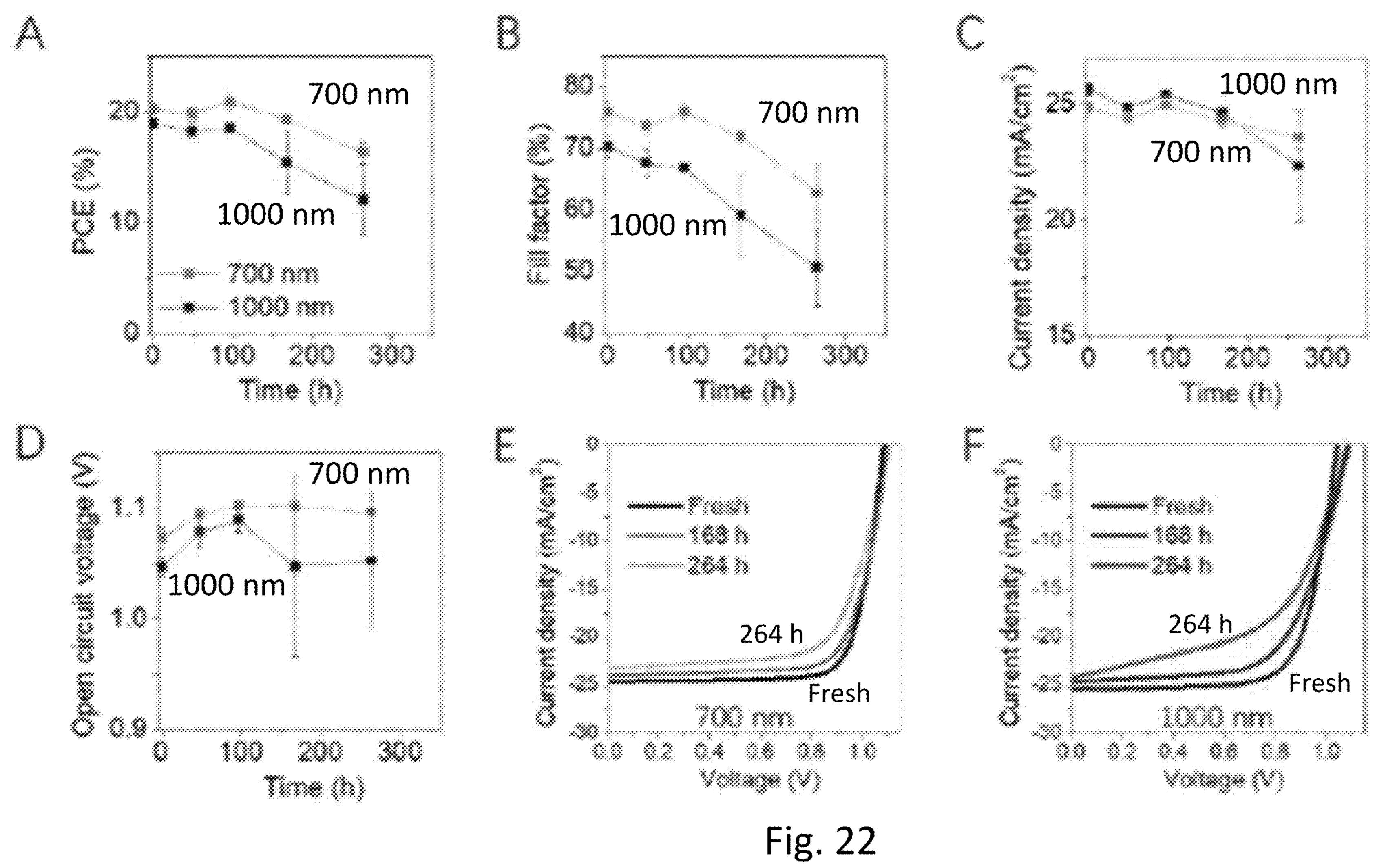
FIG. 22 shows a photostability study of FACs-perovskite solar cells with different thicknesses of the perovskite layer. (A-D) Evolution of PCE, fill factor, short circuit current density, and open circuit voltage of FACs-perovskite solar cells under simulated one sun illumination with control composition and thicknesses of about 700 nm and 1000 nm after being light soaked with increasing time. (E-F) Current-voltage scanning curves of the 700 nm and 1000 nm thick FACs-perovskite devices with control compositions before and after light soaking for different durations. The number of thick and thin perovskite devices was 3 of each. The error bars represent the standard deviation. Lines are guides to the eye.

To further understand the mechanism by which excessive AX improves photostability, FACs perovskite device degradation under light was investigated. It was discovered that degradation is mainly due to impeded transport of photogenerated carriers rather than increased non-radiative recombination. First, degraded devices with control and AX-deficient compositions exhibited stronger photoluminescence intensities and longer time-resolved photoluminescence (TRPL) decay lifetimes under an excitation laser of 640 nm wavelength compared with fresh devices when the devices were at either JSC (FIGS. 9 and 10) or VOC conditions (FIG. 21). It is noted that these optical measurements were conducted on devices, rather than films, where photogenerated charges could be extracted to electrodes, as the specific capacitance of the devices (~50 nF $cm^{-2}$) can host more charges than the number of photogenerated ones per laser pulse in the device (~0.02 nC $cm^{-2}$). A stronger photoluminescence and a longer photoluminescence lifetime therefore suggest that the degradation is due to less efficient carrier transport to the electrodes. Indeed, it was discovered that thinner perovskite films—which allow more efficient photogenerated carrier transport—result in better device stability (FIG. 22). The suppressed carrier transport after degradation is in accordance with the observation that PCE loss mainly results from the reduction in JSC and fill factor—which are linked to a low charge extraction efficiency—rather than a reduction in VOC (FIG. 3A-3G), which is related to non-radiative recombination. It is noted that the stronger photoluminescence and longer photoluminescence lifetime can be a result of better material quality. However, that is not the case here, as the defect concentration increased after light-soaking. The slight red-shift of the photoluminescence peak in the $PbI_2$ rich device provides further evidence that the material quality is not improved, but degraded (FIG. 9 and FIG. 21).

Figure 11:
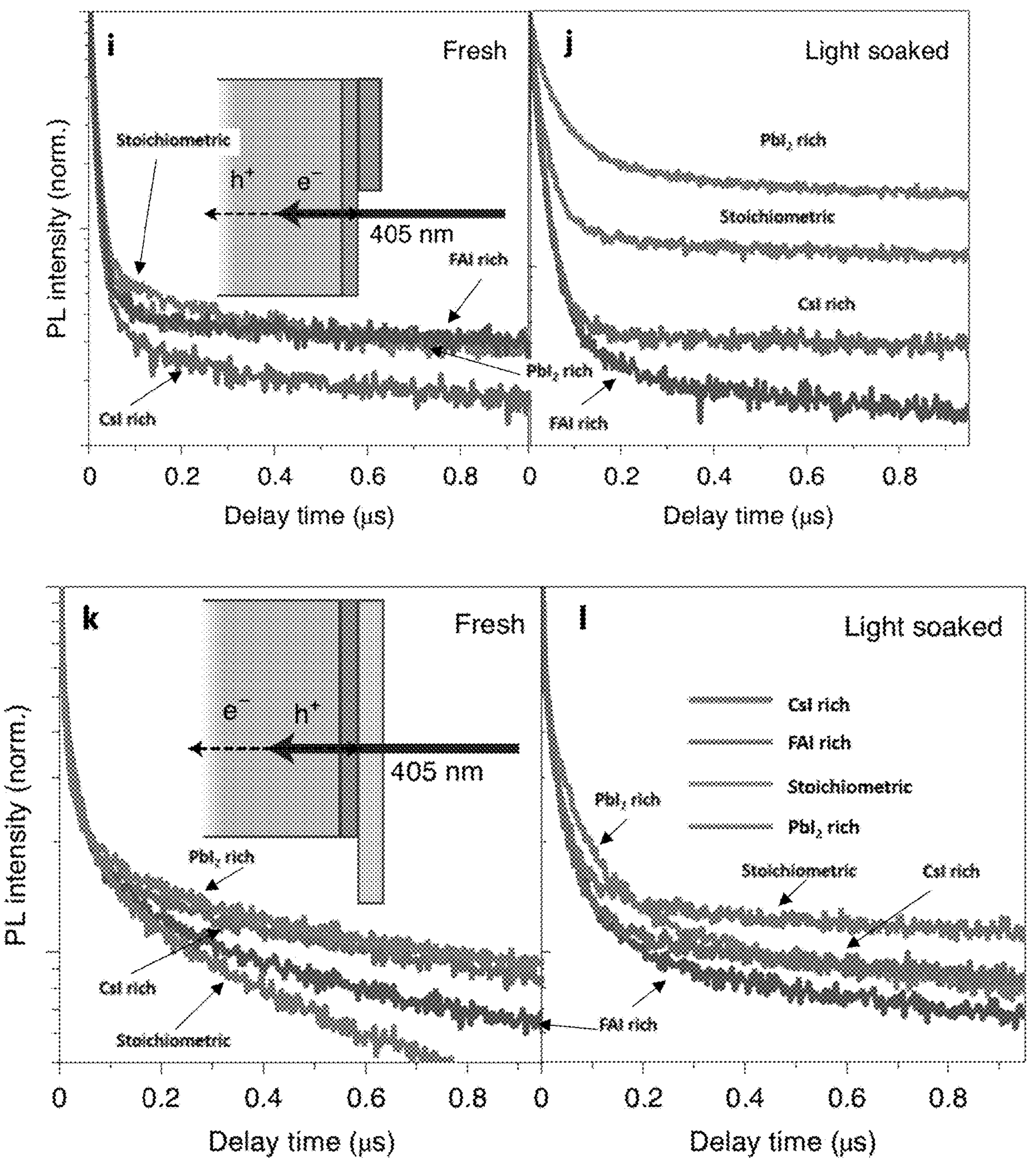
FIG. 11 shows TRPL spectra of perovskite devices excited by a 405 nm laser from the C60/BCP side (i and j) and from the PTAA side (k and l), before and after light soaking, respectively. The insets in g, i, and k show schematic illustrations of the measurements.

To further determine what type of photogenerated carriers in $FA_{0.92}Cs_{0.08}PbI_3$ were slowed after degradation, a 405 nm blue laser was used for the TRPL study. Due to the high absorption coefficient of these perovskites at 405 nm, the penetration depth of the blue laser was estimated to be <30 nm[30a]. The incident laser from the C60 side generates excessive carriers in perovskites predominately near the perovskite/C60 interface. Most of the photogenerated electrons should be extracted to C60 quickly, and the corresponding TRPL decay reflects the transport of photogenerated holes from perovskites to PTAA (inset of the left image in FIG. 11). Similarly, when an incident laser comes from the PTAA side, the transient photoluminescence signal indicates how efficiently electrons transport to C60. As shown in FIG. 11, when laser light came from the C60 side, a change in the photoluminescence lifetime occurred in the control and AX-deficient devices after light soaking, whereas the photoluminescence decay did not change significantly when laser light was incident from the PTAA side. These results show that the transport of holes, rather than electrons, was impeded after light soaking induced degradation in the control and AX-deficient devices. Conversely, AX-excessive devices maintained fast extraction of holes after light soaking.

Example 5: Degradation Mechanism of FACs Perovskite Devices

Figure 12:
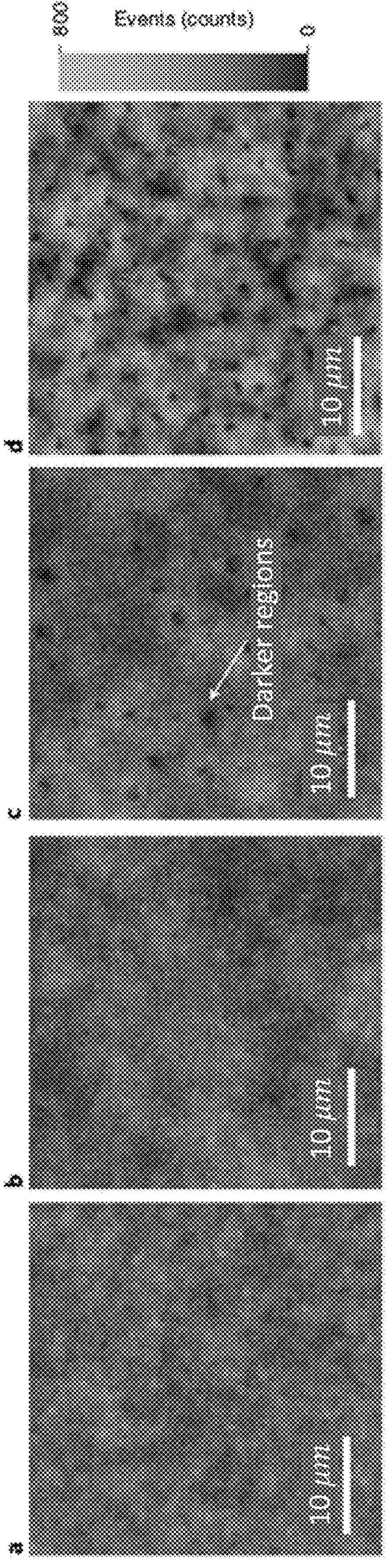
FIG. 12 shows photoluminescence intensity mapping of devices by a 405 nm laser for FAI-excessive (a), CsI-excessive (b), stoichiometric (c) and $PbI_2$-excessive (d) compositions after light soaking.
Figure 24:
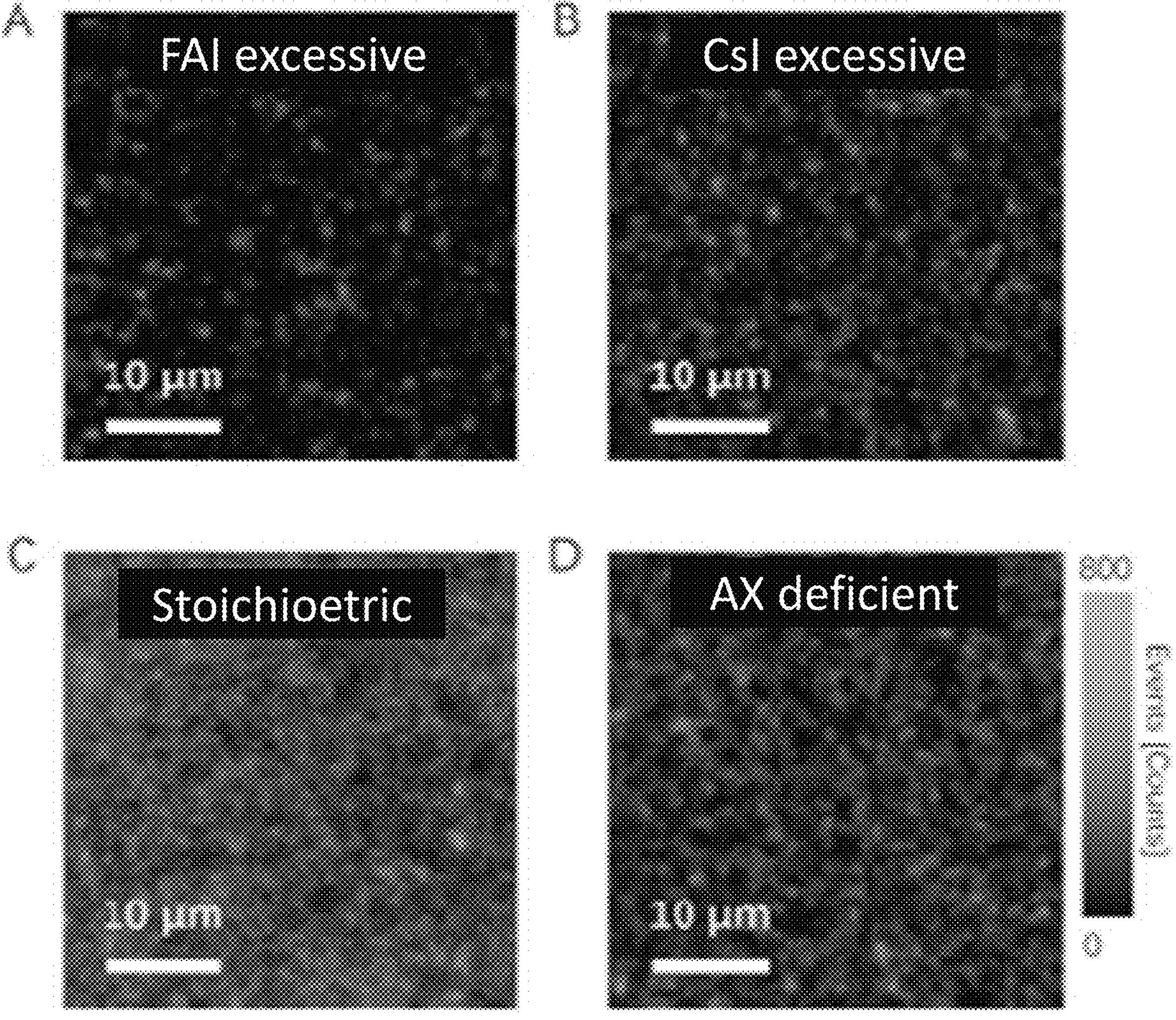
FIG. 24 shows photoluminescence intensity mapping images of fresh FACs-perovskite devices with different compositions. (A): 0.25 mol % excessive FAI; (B) 0.25 mol % excessive CsI; (C) control; (D) 0.25 mol % deficient AX.
Figure 25:
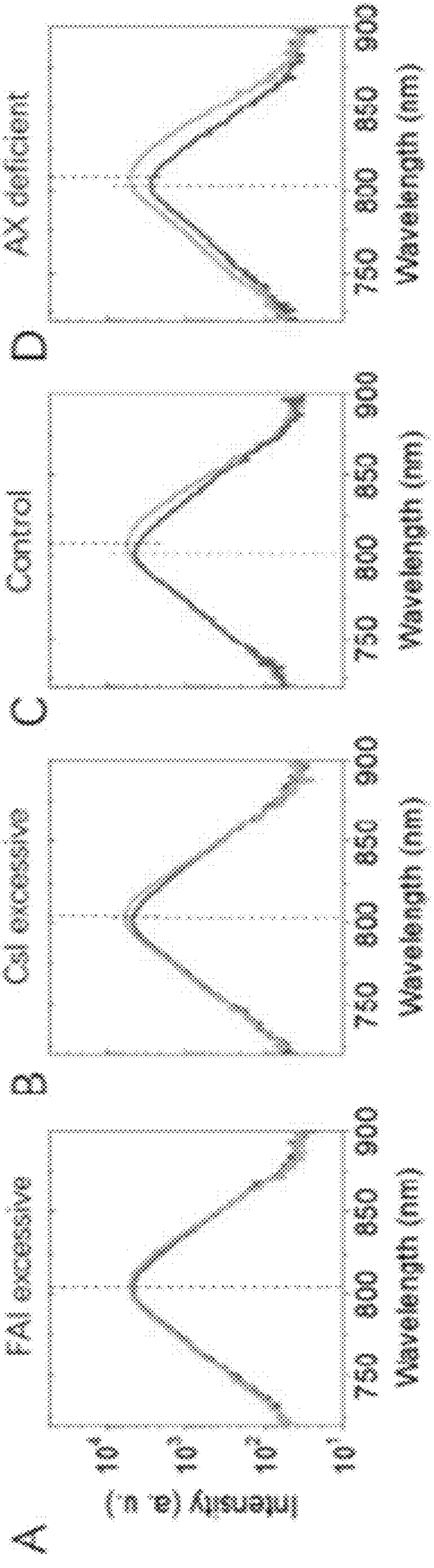
FIG. 25 shows a photoluminescence study of degraded FACs-perovskite solar cells with different compositions. (A): 0.25 mol % excessive FAI; (B) 0.25 mol % excessive CsI; (C) control; (D) 0.25 mol % deficient AX. The spectra were obtained on brighter (light blue line) and darker (dark blue line) regions selected from the mapping results in FIG. 12. The dashed vertical lines are guides to the eye showing the peak wavelength of each emission spectrum.

Next, to determine the origin of hole trapping, possible mechanisms, such as perovskite decomposition, phase transformation, phase segregation, and generation of point defects, were investigated. The devices were still black after degradation. The XRD pattern of the light-soaked samples did not show a yellow phase or $PbI_2$ phase (FIG. 23), indicating that perovskite phase transformation or decomposition was not evident at that degradation stage. This differs from other investigations where phase transformation was observed in formamidinium-containing perovskites[31a]. Possible phase segregation was then investigated by performing photoluminescence mapping of the devices with a 405 nm laser before and after light soaking for ~300 h at VOC conditions. Before light soaking, all compositions exhibited similar homogeneity within the equipment resolution limit (FIG. 24); however, after light soaking, highly dispersed darker spots on a brighter photoluminescence mapping background developed for the control and $PbI_2$-excessive devices (insets c and d in FIG. 12). These darker spots have diameters of ~1 μm and spacings of 1-5 μm (insets c and d in FIG. 12). When an excitation light was focused on these darker spots, their photoluminescence emission peaks showed a blue-shift compared with the brighter regions (FIG. 25), confirming phase segregation in the FACs perovskite. The AX-excessive composition suppressed cation migration-induced phase segregation, as no such darker spots were observed in insets a and b of FIG. 12; however, the dispersed regions with larger bandgaps (the cesium-richer regions) should not trap holes. The remaining formamidinium-richer regions also should not trap holes as they form a continuous carrier transportation network. Computations also indicate that $FA_xCs_{1-x}PbI_3$ perovskites with different values of x have almost the same valance band maximum[32a] which also goes against the scenario of hole trapping caused by phase segregation. Other observations confirmed that degradation is caused by iodide-related point defects. The transient photocurrent response of the degraded device was first measured. When the degraded device was placed under light at VOC conditions for several seconds and JSC tracking started, the initial JSC was as large as that of the fresh device (around $-25$ mA $cm^{-2}$), but degraded to approximately $-12$ mA $cm^{-2}$ within about 1 s (FIG. 13, left-hand image). Halide migration can typically only occur at such a high speed, whereas phase segregation by cation migration generally takes at least tens of minutes at room temperature due to their much higher ion migration activation energies[33a-35a]. Moreover, it was observed that greater hysteresis developed from the J-V curves after light soaking for the control and $PbI_2$-excessive devices (FIG. 3A-3D), which is generally caused by faster iodide migration. Furthermore, as phase segregation is most aggravated under VOC conditions when photogenerated carrier density is the highest in the film[35a,36a], the preillumination at VOC conditions should lead to the lowest JSC at the beginning of the JSC tracking if the phase segregation caused the loss of JSC. The result here is in contrast to the cation phase-segregation-induced device degradation scenario. The fact that the JSC of degraded devices can be fully recovered in seconds also indicates that there is no perovskite phase transformation or decomposition, which would reduce perovskite absorption and JSC permanently.

Figure 26:
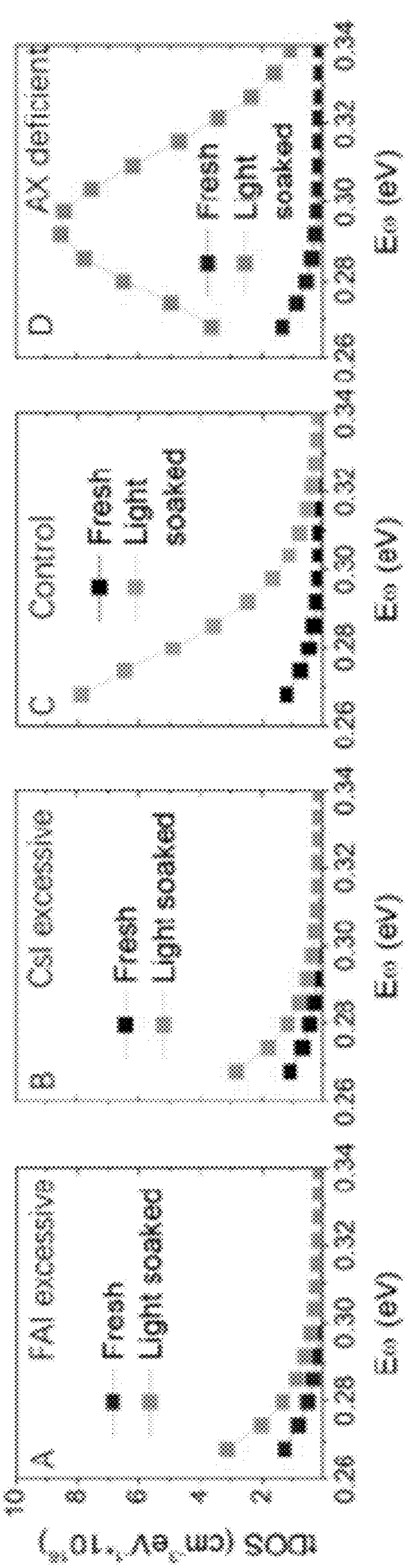
FIG. 26 shows plots of the trap density of states (t-DOS) of FACs-perovskite solar cells with different compositions before and after light soaking. (A): 0.25 mol % excessive FAI; (B) 0.25 mol % excessive CsI; (C) control; (D) 0.25 mol % deficient AX. Lines are the guide to eyes for each set of data points.

An increase in $I_i^-$ trap density was observed in the control and $PbI_2$-excessive devices when the change in trap density in the devices was investigated before and after light soaking. The trap density of states of the devices was measured by thermal admittance spectroscopy. The generation of traps with trap depths in the range of 0.27-0.34 eV was observed in the $PbI_2$-excessive and control devices, but was suppressed in the AX-excessive ones (FIG. 26). Both density functional theory calculations consider the spin-orbital interaction and experimental studies verify these traps could be assigned to negatively charged $I_i^-$[37a], which should trap holes, consistent with the above studies.

Example 6: Defect Compensation by Excessive AX

Figure 14:
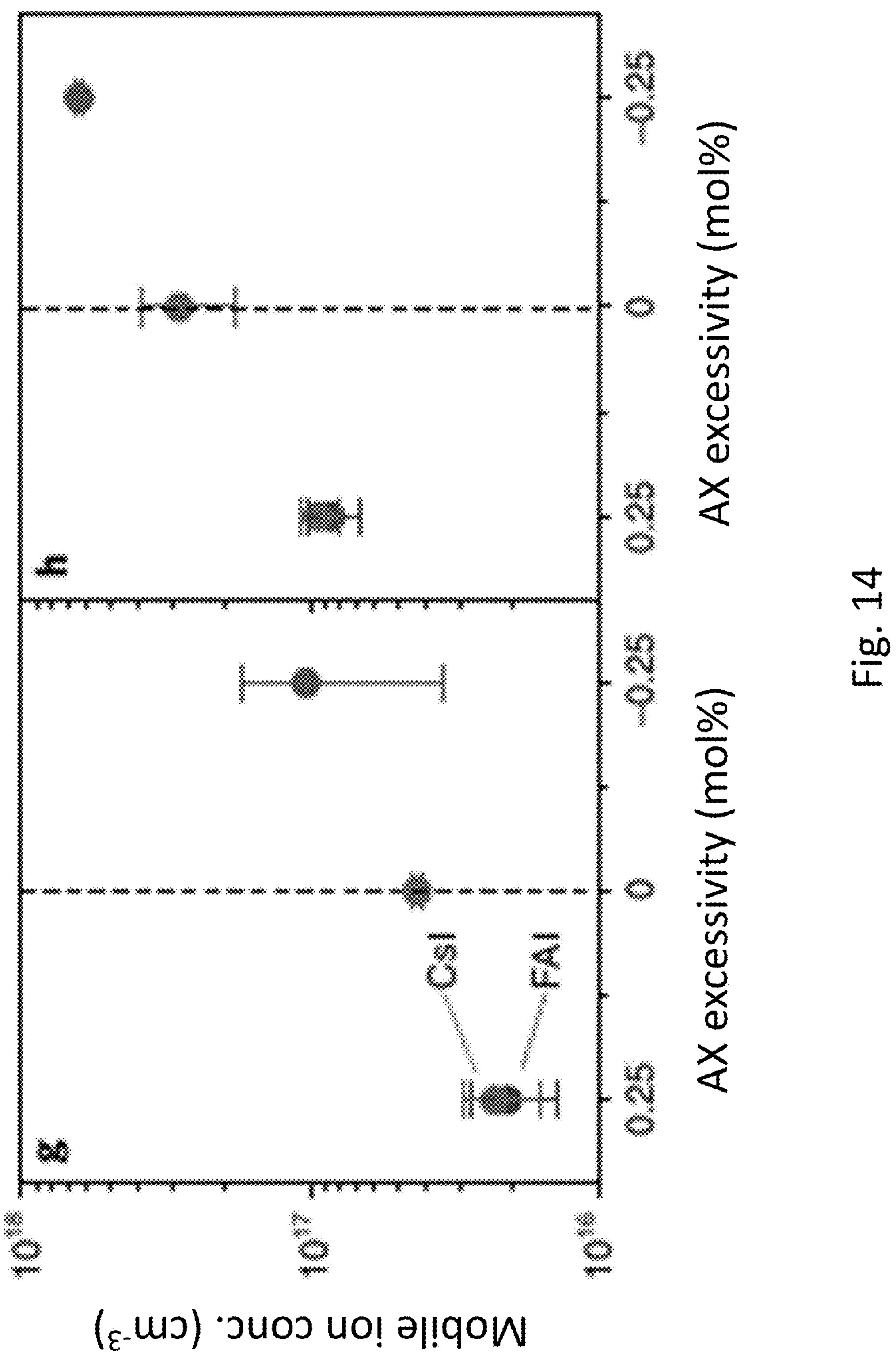
FIG. 14 shows plots of calculated mobile ion concentrations in the devices with different compositions before (g) and after (h) light soaking. The number of devices for each composition is three. The error bars represent the standard deviation. The dashed vertical lines are a guide to the eye, showing the 0% AX excessive composition.
Figure 15:
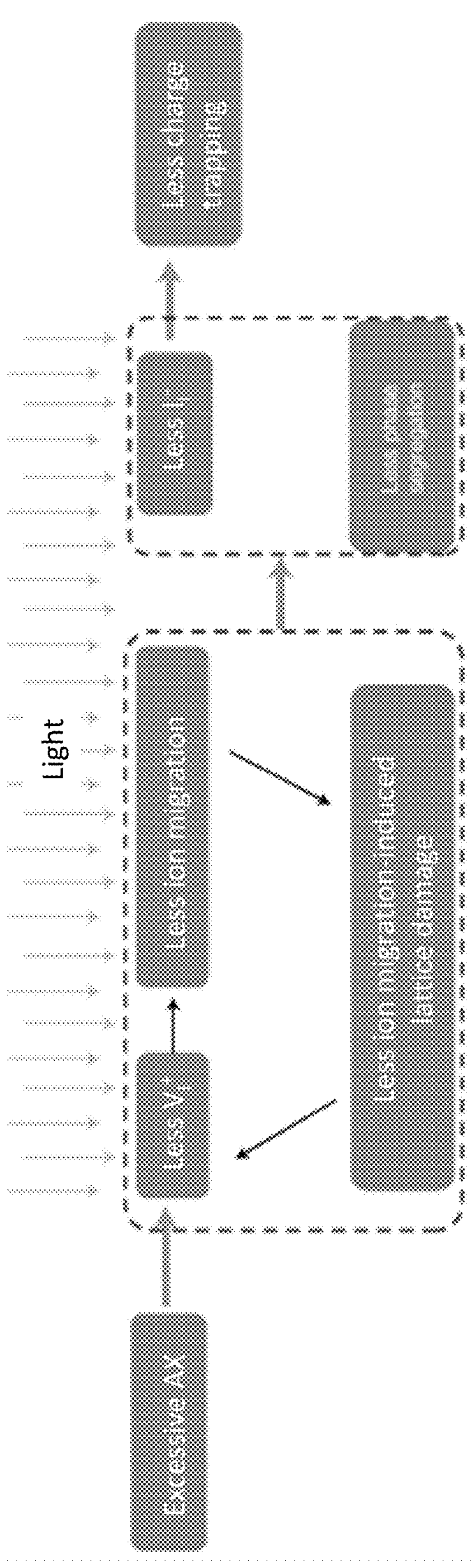
FIG. 15 shows a schematic of how excessive AX improves photostability of FACs perovskites.
Figure 27:
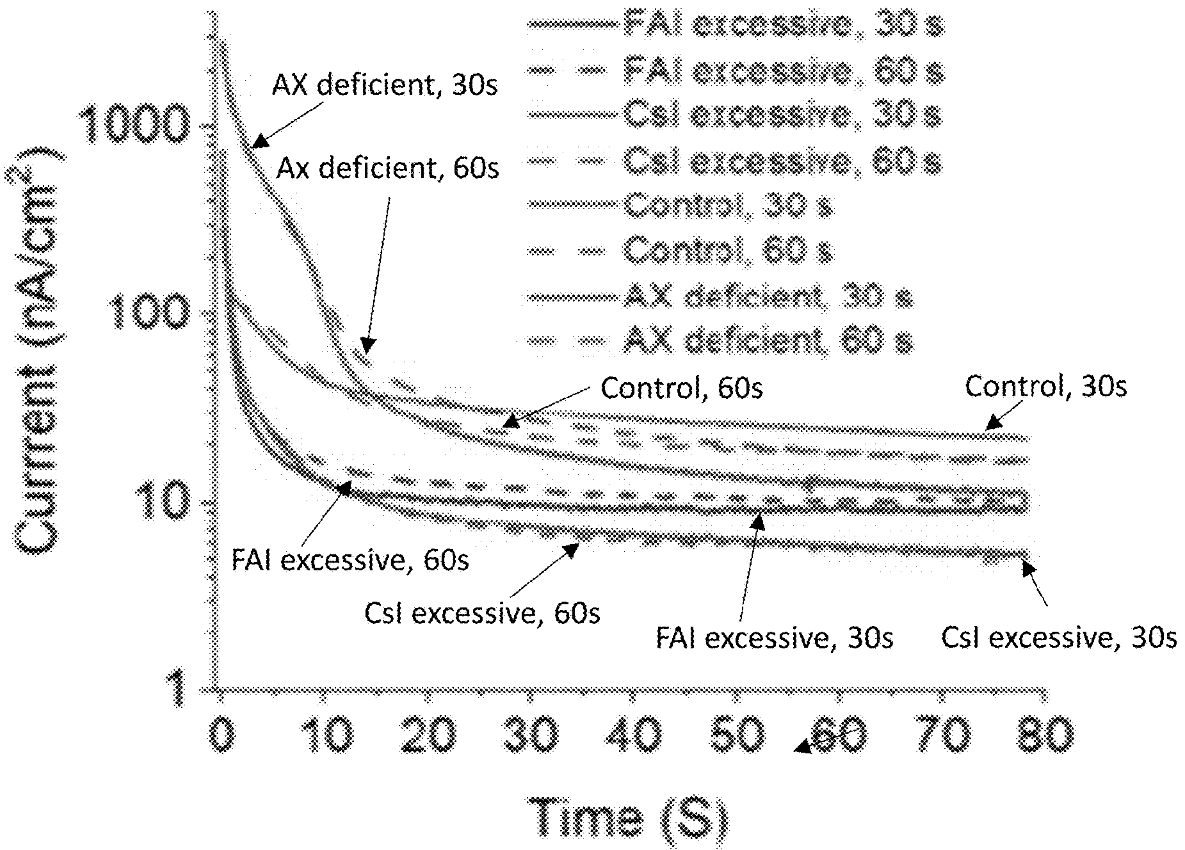
FIG. 27 shows ion back diffusion currents of the devices after being forwardly biased at 1.5 V for 30 s or 60 s for the devices with different compositions after light soaking.

It was investigated why AX-excessive compositions can suppress point defect generation to ensure fast charge transport in the devices after long-term light soaking. It is well established that the most mobile ions in perovskite are $V_I^+$ due to their small migration activation energy[39a]. With excessive $I^-$—or AX—in the perovskite film, the $V_I^+$ defects can be compensated and remain at a low concentration during film formation. Due to their low-lying electronic state near the conduction band minimum, $V_I^+$ defects are reported to not cause severe non-radiative recombination[40a,41a] which helps explains why excessive AX did not improve the device VOC or efficiency (FIG. 18); however, the migration of iodide ions such as $V_I^+$ causes damage to the perovskite lattice, which should generate more mobile ions[42a]. Therefore, it is important to have a small concentration of $V_I^+$ in the perovskite films at the initial stage. To test this, the concentration of mobile ions was estimated in these devices using a reported mobile ion charging-discharging method[33a]. In this measurement, a forward bias of 1.5 V was applied to the devices for 30 s to disturb the original distribution of mobile ions. Following this, the devices were set to a zero bias condition to allow ions to diffuse back to restore their positions. The ion back-diffusion-induced transient current was recorded and the measurements were conducted with devices in the dark. The integrated transient current with time divided by the perovskite volume and elementary charge gives the mobile ion concentration[33a]. It is noted that a longer biasing time of 60 s did not increase the back-flowing current, suggesting that 30 s was sufficient to drive most of the mobile ions to reach the equilibrium distribution at 1.5 V bias (FIG. 27). The typical transient currents in devices with different compositions before light soaking are shown in FIG. 13 (right image), and the calculated average mobile ion concentrations for all of the compositions before and after light soaking are summarized in FIG. 14. It was found that before light soaking, AX-excessive devices had the lowest mobile ion concentrations of ~2.5×1016 $cm^{-3}$, whereas the AX-deficient ($PbI_2$-rich) devices had the highest concentrations of 1.0×1017 $cm^{-3}$, which is consistent with previously reported investigations[43a,44a]. After light soaking, the mobile ion concentration in the $PbI_2$-rich devices increased by 5.5×1017 $cm^{-3}$, whereas that in AX-excessive devices increased by only 6.5×1016 $cm^{-3}$ (FIG. 14, right-hand image). These results indicate that the slightly excessive AX suppressed mobile ion generation by almost tenfold during light soaking. This mechanism by which excessive AX improves photostability of FACs perovskites can be summarized as follows. Under light in non-optimized compositions, the migration of mobile $V_I^+$ in the as-formed perovskite can be enhanced[35a,45a], which damages the perovskite lattice and generates more $V_I^+$, resembling the damage of electrodes in ion batteries[46a,47a]. The $V_I^+$ and ion migration therefore intensify and aggravate each other. This is a cyclic process, which generates more $I_i^-$ in the damaged perovskite lattice to maintain charge neutrality and material conservation, as shown by the thermal admittance spectroscopy results. The increased $V_I^+$ concentration results in more shunting to the device due to its doping effect, and more $I_i^-$ deep traps that impede charge extraction of photogenerated holes. In the optimized composition (FIG. 15), the excessive AX compensates and reduces the initial $V_I^+$ concentration fourfold, so that the cycle between ion migration and $V_I^+$ generation is largely delayed, thereby improving photostability. The cation phase separation is also suppressed, although charge traps are not formed. It is noted that even in $PbI_2$-rich films, the initial $V_I^+$ concentration is still lower than 1017 $cm^{-3}$. The optimized AX additive amount should therefore be high enough to compensate the $V_I^+$, but not so high that it causes adverse effects, such as forming insulating charge barriers or introducing more $I_i^-$ defects initially.

Figures 4A, 4B, 4C, 4D, 4E:
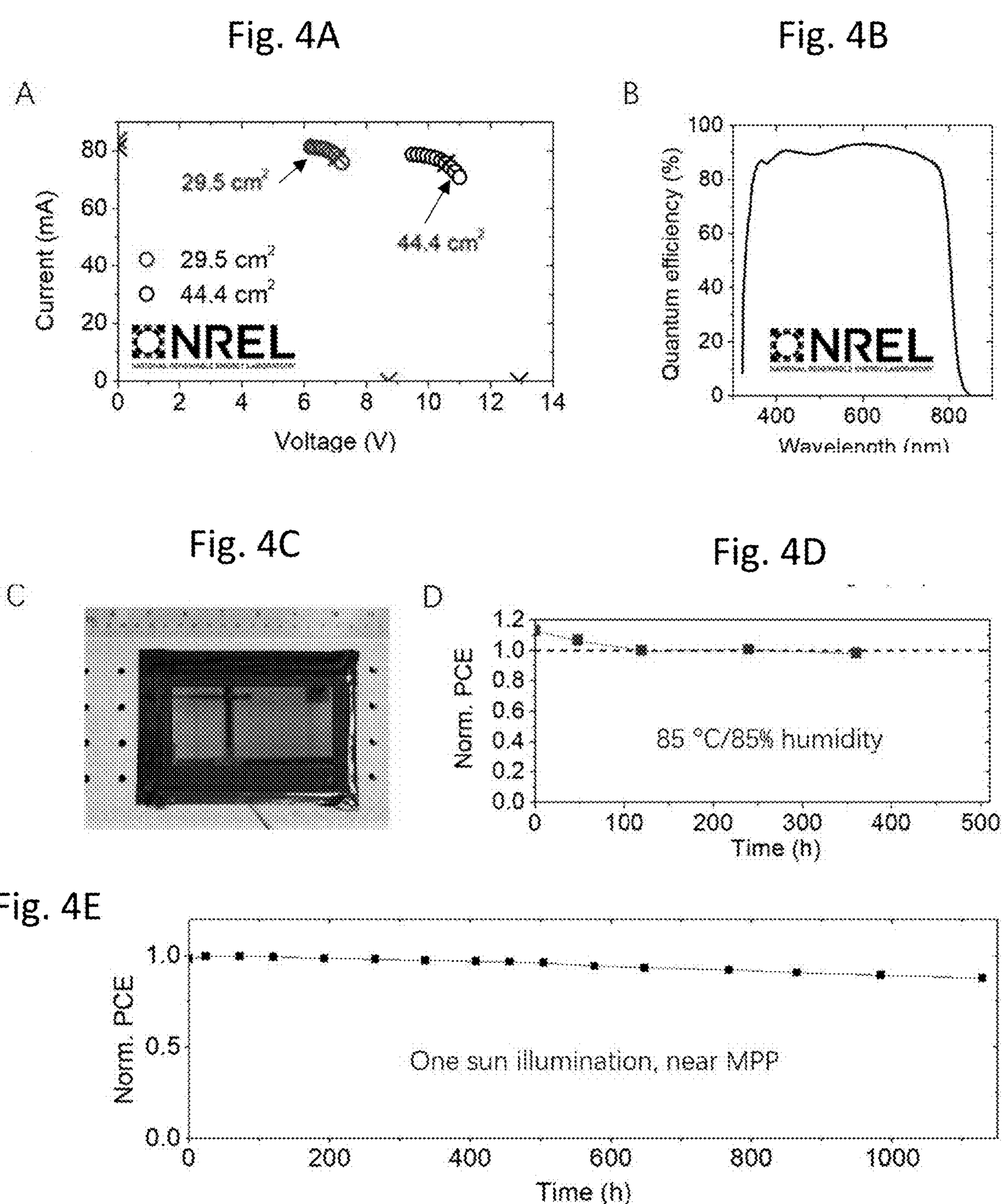
FIG. 4A shows a plots of NREL certified stabilized current-voltage curves around the MPP point of two modules with a 29.5 $cm^2$ and 44.4 $cm^2$ aperture area.
FIG. 4B shows a plot of a NREL tested quantum efficiency of a "single-cell module".
FIG. 4C shows a photo of a perovskite solar module with an aperture area defined by black tape.
FIG. 4D shows a plot of damp-heat stability of the perovskite module.
FIG. 4E shows a plot of the long term operational stability of a perovskite module under simulated one sun illumination. The module is connected to a resistor that set it working near the maximum power point and the power output is calculated by measuring the voltage across the resistor.
Figure 5:
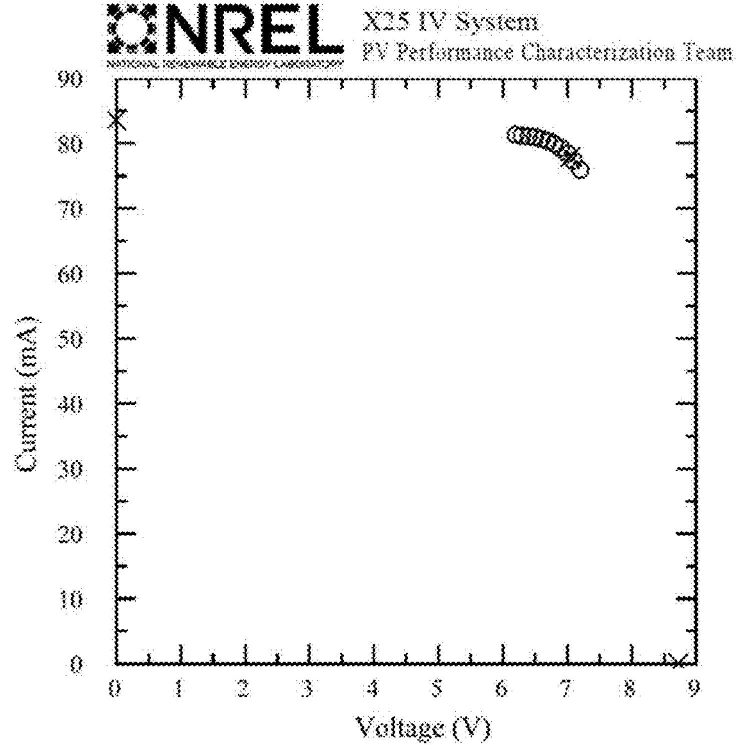
FIG. 5 shows a plot of NREL calibrated current-voltage curves around the MPP point of a module with an aperture area of 29.5 $cm^2$.
Figure 6:
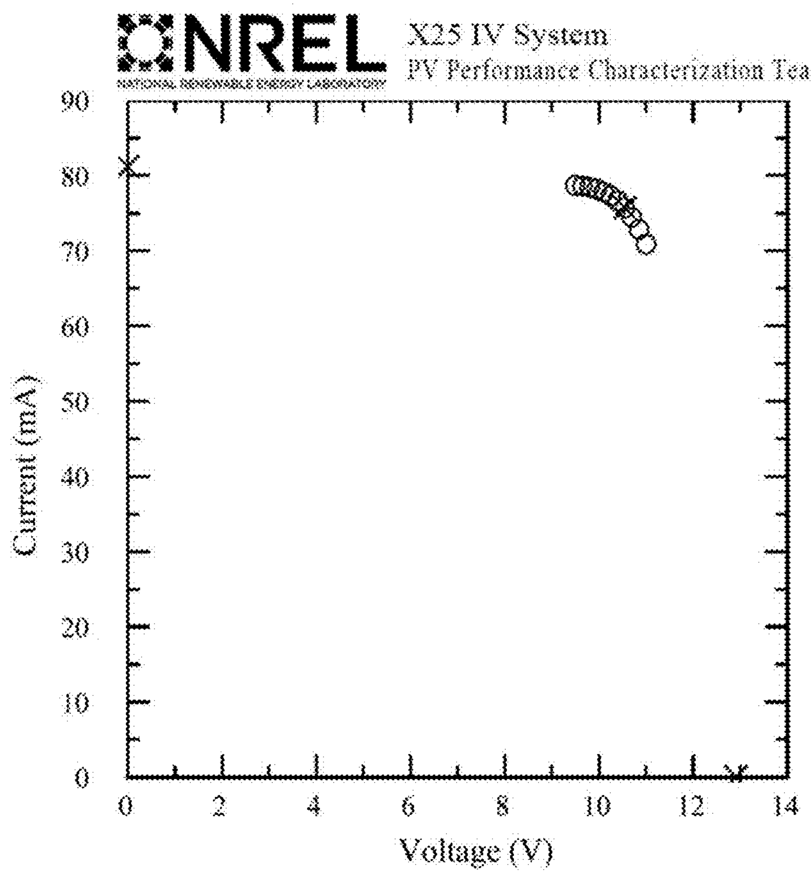
FIG. 6 shows a plot of NREL calibrated current-voltage curves around the MPP point of a module with an aperture area of 44.4 $cm^2$.
Figure 7:
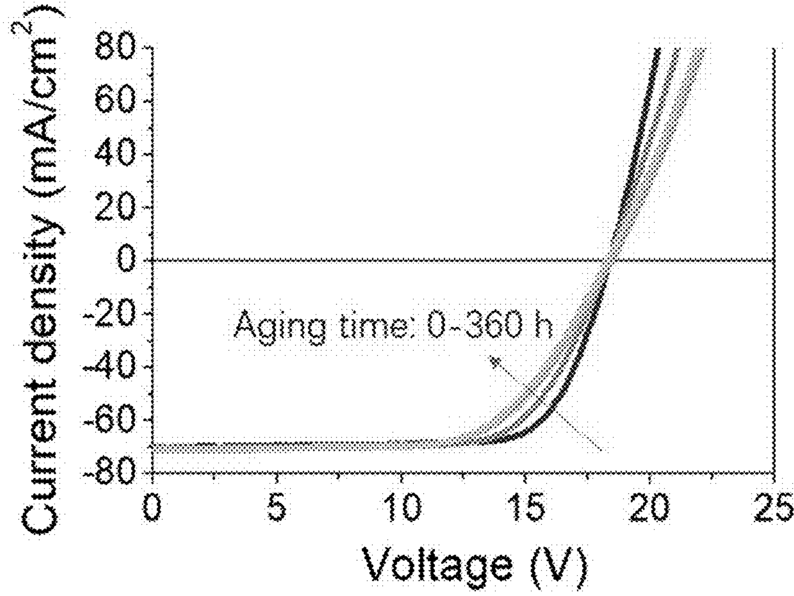
FIG. 7 shows a plot of the light stability of FAC-based perovskites with different metal ion additives.
Figure 16:
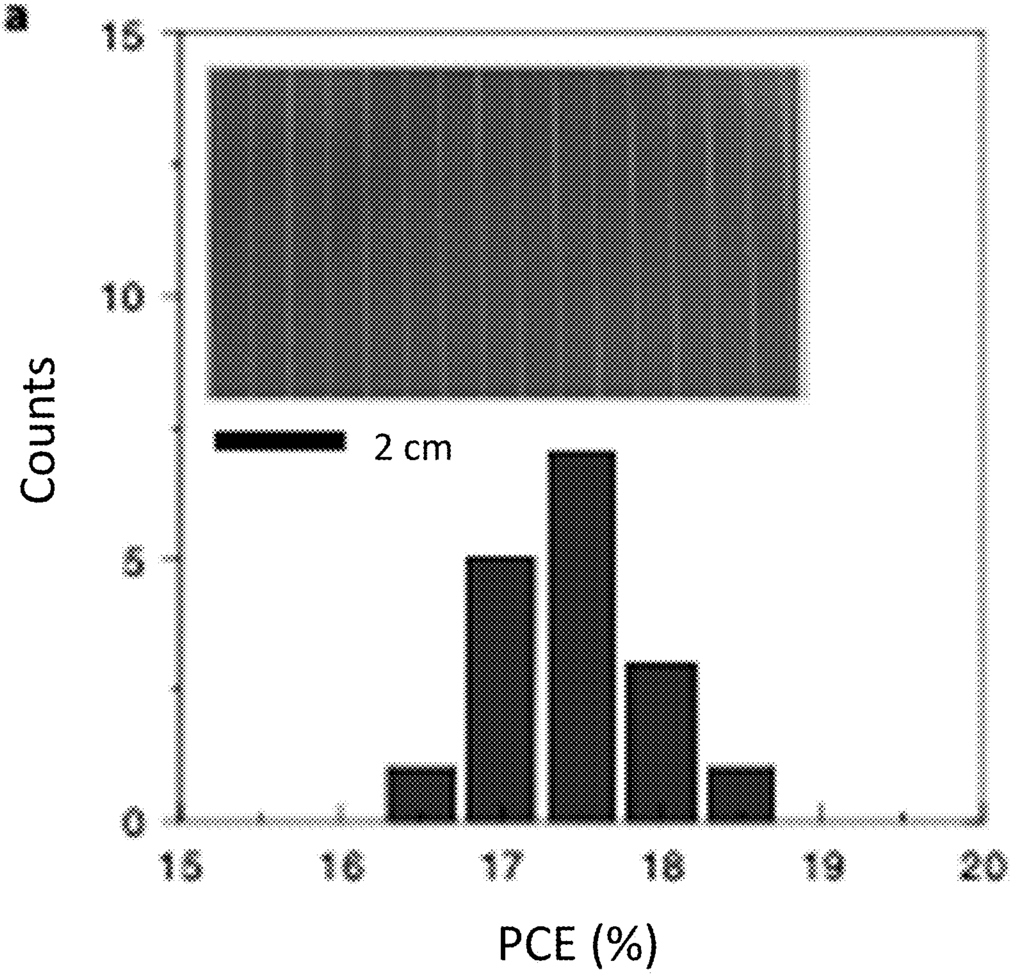
FIG. 16 shows a plot of the device efficiency statistics of 17 mini-modules fabricated using nonstoichiometric FACs perovskites. The inset is a photograph of a perovskite solar mini-module.
Figure 28:
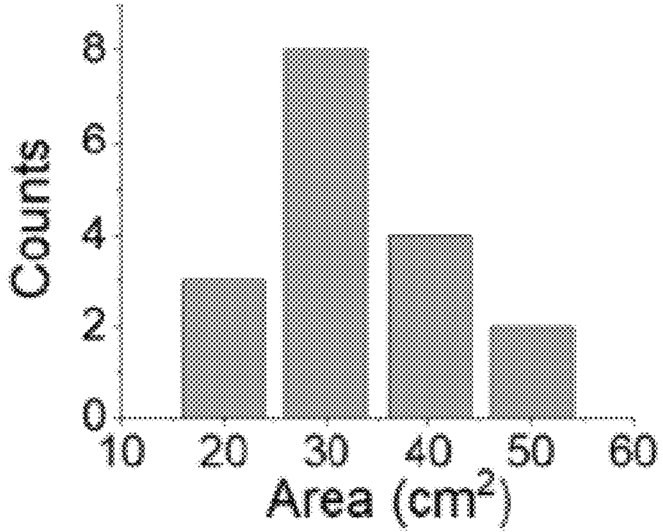
FIG. 28 shows a bar graph of the area of 17 mini-modules fabricated and investigated herein.

Example 7: Fabrication of Solar Modules Using the Non-Stoichiometric Perovskite Films A photograph of a typical mini-module is shown in the inset of FIG. 16. The efficiency distribution of 17 mini-modules is shown in FIG. 16 and their aperture areas are summarized in FIG. 28. More than 94% of the mini-modules exhibited efficiencies higher than 17.0%, showing good reproducibility. Stable solar modules were fabricated based on the non-stoichiometric perovskite compositions and then sent for certification by NREL. A typical module is shown in FIG. 4C. A module with a 29.5 $cm^2$ aperture area exhibited a stabilized aperture efficiency of 18.6% and another larger module with a 44.4 $cm^2$ aperture area exhibited a stabilized aperture efficiency of 18.0% (FIG. 4A, FIG. 5, and FIG. 6). 5 modules with aperture areas >20 $cm^2$ were sent to NREL for analysis, each of which exhibited stabilized efficiencies >17.7%. These results further indicate the reproducibility of the non-stoichiometric perovskite module fabrication. The quantum efficiency measured by NREL is consistent with the original measurements, showing an absorption edge of 820 nm, corresponding to a bandgap of 1.51 eV, which is typical of an FA-based perovskite bandgap (FIG. 4B). The non-stoichiometric perovskite module's stability was then tested under thermal and light stress after encapsulation (FIG. 4D). By aging under 85° C./85% relative humidity conditions, the efficiency of the module dropped in the first 100 h (burn-in), and then stabilized over 260 h. Without wishing to be bound by theory, it is understood that the burn-in is due to increased series resistance (FIG. 7), which is considered to originate from the recrystallization of the BCP layer at elevated temperatures.[14] It has been shown that replacing the BCP layer, for example, with a tin oxide layer by atomic layer deposition, can improve the device's thermal stability.[15] The module maintained 99% of its initial efficiency after 500 h of continuous working near the maximum power point and 92% after 1100 h (FIG. 4E).

MATERIALS AND METHODS

All chemicals were purchased from Sigma-Aldrich without further purification unless otherwise specified. The molecular weight of PTAA from Sigma-Aldrich was 7,000-10,000 g $mol^{-1}$. Formamidinium iodide was purchased from GreatCell Solar. Formamidinium hypophosphite was synthesized via a method that was based on, and modified from, a previously published methods[51a].

Device Fabrication

Indium tin oxide/glass substrates were washed with detergent, deionized water, isopropanol, and acetone sequentially and dried in an oven at 60° C.; 2.2 mg ml-1 PTAA/toluene solution was first blade-coated on ultraviolet-ozone-treated ITO/glass substrate without any post-treatment for the PTAA film. The perovskite layer was then blade-coated with $N_2$ knife blowing at room temperature by using a pre-mixed "A-B ink." A-ink was prepared by dissolving 2.2 M FAI and $PbI_2$ in 2-ME overnight at room temperature and then further diluted by 2-ME and/or ACN to obtain a concentration of 1.1 M and in turn a suitable thickness of perovskite films by blade coating, in accordance with a previously-reported solvent system procedure[17a]. The B-ink was prepared by dissolving CsI and $PbI_2$ (at a ratio of 1:1) into DMSO and stirring the solution at 70° C. for at least 30 min to get the precursor materials fully dissolved at a concentration of 2.0 M. No filtration was performed for both inks after preparation. Formamidinium chloride, phenylethylammonium chloride and formamidinium hypophosphite were added to the A ink as additives at molar percentages of 1.5%, 0.15% and 1.0% relative to $Pb^{2+}$ ions, respectively. Formamidinium chloride and formamidinium hypophosphite have been reported to optimize the grain size and film morphology of perovskite films and passivate non-radiative recombination defects[19a]. Phenylethylammonium chloride has been used to passivate non-radiative recombination defects and stabilize the perovskite phase[20a,21a]. Excessive FAI, CsI or $PbI_2$ at molar percentages of 0.25-1.0% relative to $Pb^{2+}$ ions were also added in the A-ink for tuning the composition. The as-coated ~700-nm-thick film was annealed at 150° C. for 2 min to obtain the perovskite phase. The perovskite film was thermally evaporated with C60 (50 nm) and BCP (6 nm). Laser scribing was then performed before and after electrode deposition to complete the mini-module fabrication. Finally, the as-fabricated mini-modules were encapsulated with glass with the edges sealed by A-B glue (epoxy) and silicone. The A-B glue (epoxy) was pre-mixed before use and aged for 12 h before further handling. The silicone was applied and aged in air for about 24 h.

Device Characterization

The J-V curves of perovskite devices were obtained with a Keithley-2400 Source-meter under simulated AM1.5G irradiation produced by a xenon-lamp-based solar simulator (Oriel Sol3A, Class AAA Solar Simulator). The light intensity was calibrated by a silicon reference cell (Newport 91150V-KG5). The scan rate was about 0.15 V $s^{-1}$ and both forward and reverse scans were performed. The device temperature was not controlled during measurement. To measure the long-term operational stability of perovskite mini-modules, the mini-modules were encapsulated, applied with the aperture masks, illuminated by a 1-sun-equivalent metal halide lamp without an ultraviolet filter, and loaded near the MPP by connecting them to resistors. To measure the damp heat stability, the encapsulated mini-modules were placed in an environmental chamber with controllable humidity (~85%) and temperature (~85° C.). The capacitive-frequency data for generating the trap density of states spectra of devices were obtained by measuring the devices with an E4980A Precision LCR Meter. The photoluminescence, TRPL, and photoluminescence mapping studies were conducted with a FluoTime 300/MicroTime 300 combined system by PicoQuant. The SEM images were taken by a FEI Helios 600 Nanolab. The XRD patterns were obtained with a Rigaku MiniFlex X-ray diffractometer.

REFERENCES

1 Laboratory, N. R. E. (NREL Golden, CO, 2019).
2 Rong, Y et al. Challenges for commercializing perovskite solar cells. *Science* 361, eaat8235 (2018).
3 Khenkin, M. V. et al. Consensus statement for stability assessment and reporting for perovskite photovoltaics based on ISOS procedures. *Nature Energy* 5, 35-49 (2020).
4 Turren-Cruz, S.-H., Hagfeldt, A. & Saliba, M. Methylammonium-free, high-performance, and stable perovskite solar cells on a planar architecture. *Science* 362, 449-453 (2018).
5 Jung, E. H. et al. Efficient, stable and scalable perovskite solar cells using poly (3-hexylthiophene). *Nature* 567, 511-515 (2019).

6 Bi, E. et al. Efficient perovskite solar cell modules with high stability enabled by iodide diffusion barriers. *Joule* 3, 2748-2760 (2019).

7 Wang, Y et al. Stabilizing heterostructures of soft perovskite semiconductors. *Science* 365, 687-691 (2019).

8 Yang, S. et al. Stabilizing halide perovskite surfaces for solar cell operation with wide-bandgap lead oxysalts. *Science* 365, 473-478 (2019).

9 Deng, Y et al. Tailoring solvent coordination for high-speed, room-temperature blading of perovskite photovoltaic films. *Science advances* 5, eaax7537 (2019).

10 Deng, Y et al. Reduced Self-doping of Perovskites Induced by Short Annealing for Efficient Solar Modules *Joule*, In press (2020).

11 Eperon, G. E. et al. Formamidinium lead trihalide: a broadly tunable perovskite for efficient planar heterojunction solar cells. *Energy & Environmental Science* 7, 982-988 (2014).

12 Wu, W. Q., Rudd, P. N., Wang, Q., Yang, Z. & Huang, J. Blading Phase-Pure Formamidinium-Alloyed Perovskites for High-Efficiency Solar Cells with Low Photovoltage Deficit and Improved Stability. *Advanced Materials,* 2000995 (2020).

13 Xiao, Z. et al. Unraveling the hidden function of a stabilizer in a precursor in improving hybrid perovskite film morphology for high efficiency solar cells. *Energy & Environmental Science* 9, 867-872 (2016).

14 Hong, Z., Huang, Z. & Zeng, X. Utilization of copper phthalocyanine and bathocuproine as an electron transport layer in photovoltaic cells with copper phthalocyanine/buckminsterfullerene heterojunctions: Thickness effects on photovoltaic performances. *Thin Solid Films* 515, 3019-3023 (2007).

15 Zheng, X. et al. Managing grains and interfaces via ligand anchoring enables 22.3%-efficiency inverted perovskite solar cells. *Nature Energy* 5, 131-140 (2020).

17a Deng, Y. et al. Tailoring solvent coordination for high-speed, room-temperature blading of perovskite photovoltaic films. *Sci. Adv.* 5, eaax7537 (2019).

12a Slotcavage, D. J., Karunadasa, H. I. & McGehee, M. D. Light-induced phase segregation in halide-perovskite absorbers. *ACS Energy Lett.* 1, 1199-1205 (2016).

13a Brivio, F., Caetano, C. & Walsh, A. Thermodynamic origin of photoinstability in the $CH_3NH_3Pb\ (I_{1-x}Br_x)_3$ hybrid halide perovskite alloy. *J. Phys. Chem. Lett.* 7, 1083-1087 (2016).

14a Li, Z. et al. Stabilizing perovskite structures by tuning tolerance factor: formation of formamidinium and cesium lead iodide solid-state alloys. *Chem. Mater.* 28, 284-292 (2016).

15a Lee, J. W. et al. Formamidinium and cesium hybridization for photo- and moisture-stable perovskite solar cell. *Adv. Energy Mater.* 5, 1501310 (2015).

19a Chen, B. et al. Grain engineering for perovskite/silicon monolithic tandem solar cells with efficiency of 25.4%. *Joule* 3, 177-190 (2019).

20a Lee, J.-W. et al. 2D Perovskite stabilized phase-pure formamidinium perovskite solar cells. *Nat. Commun.* 9, 3021 (2018).

21a Jiang, Q. et al. Surface passivation of perovskite film for efficient solar cells. *Nat. Photon.* 13, 460-466 (2019).

23a Lee, M. M., Teuscher, J., Miyasaka, T., Murakami, T. N. & Snaith, H. J. Effcient hybrid solar cells based on meso-superstructured organometal halide perovskites. *Science* 338, 643-647 (2012).

24a Jahandar, M. et al. High-performance $CH_3NH_3PbI_3$-inverted planar perovskite solar cells with fill factor over 83% via excess organic/inorganic halide. *ACS Appl. Mater. Interfaces* 9, 35871-35879 (2017).

25a Son, D.-Y. et al. Self-formed grain boundary healing layer for highly efficient $CH_3NH_3PbI_3$ perovskite solar cells. *Nat. Energy* 1, 1-8 (2016).

30a De Wolf, S. et al. Organometallic halide perovskites: sharp optical absorption edge and its relation to photovoltaic performance. *J. Phys. Chem. Lett.* 5, 1035-1039 (2014).

31a Fu, F. et al. $I_2$ vapor-induced degradation of formamidinium lead iodide based perovskite solar cells under heat-light soaking conditions. *Energy Environ. Sci.* 12, 3074-3088 (2019).

32a Tao, S. et al. Absolute energy level positions in tin- and lead-based halide perovskites. *Nat. Commun.* 10, 2560 (2019).

33a Game, O. S., Buchsbaum, G. J., Zhou, Y., Padture, N. P. & Kingon, A. I. Ions matter: description of the anomalous electronic behavior in methylammonium lead halide perovskite devices. *Adv. Funct. Mater.* 27, 1606584 (2017).

34a Domanski, K. et al. Migration of cations induces reversible performance losses over day/night cycling in perovskite solar cells. *Energy Environ. Sci.* 10, 604-613 (2017).

35a Lin, Y. et al. Excess charge-carrier induced instability of hybrid perovskites. *Nat. Commun.* 9, 4981 (2018).

36a Draguta, S. et al. Rationalizing the light-induced phase separation of mixed halide organic-inorganic perovskites. *Nat. Commun.* 8, 200 (2017).

37a Motti, S. G. et al. Controlling competing photochemical reactions stabilizes perovskite solar cells. *Nat. Photon.* 13, 532-539 (2019).

39a Eames, C. et al. Ionic transport in hybrid lead iodide perovskite solar cells. *Nat. Commun.* 6, 7497 (2015).

40a Motti, S. G. et al. Defect activity in lead halide perovskites. *Adv. Mater.* 31, 1901183 (2019)

41a Du, M.-H. Density functional calculations of native defects in $CH_3NH_3PbI_3$: effects of spin-orbit coupling and self-interaction error. *J. Phys. Chem. Lett.* 6, 1461-1466 (2015).

42a Di Girolamo, D. et al. Ion migration-induced amorphization and phase segregation as a degradation mechanism in planar perovskite solar cells. *Adv. Energy Mater.* 10, 2000310 (2020).

43a Almora, O. et al. Capacitive dark currents, hysteresis, and electrode polarization in lead halide perovskite solar cells. *J. Phys. Chem. Lett.* 6, 1645-1652 (2015).

44a Bertoluzzi, L. et al. Mobile ion concentration measurement and open-access band diagram simulation platform for halide perovskite solar cells. *Joule* 4, 109-127 (2020).

45a Kim, G. Y. et al. Large tunable photoeffect on ion conduction in halide perovskites and implications for photodecomposition. *Nat. Mater.* 17, 445-449 (2018).

51a Xiao, Z. et al. Unraveling the hidden function of a stabilizer in a precursor in improving hybrid perovskite film morphology for high efficiency solar cells. *Energy Environ. Sci.* 9, 867-872 (2016).

Efforts have been made to ensure accuracy with respect to numbers used (e.g., amounts, temperature, etc.) but some experimental errors and deviations should be accounted for.

One skilled in the art will recognize many methods and materials similar or equivalent to those described herein, which could be used in the practicing the subject matter described herein. The present disclosure is in no way limited to just the methods and materials described.

Unless defined otherwise, technical and scientific terms used herein have the same meaning as commonly understood by one of ordinary skill in the art to which this subject matter belongs.

Throughout this specification and the claims, the words “comprise,” “comprises,” and “comprising” are used in a non-exclusive sense, except where the context requires otherwise. It is understood that embodiments described herein include “consisting of” and/or “consisting essentially of” embodiments.

Where a range of values is provided, it is understood that each intervening value, to the tenth of the unit of the lower limit, unless the context clearly dictates otherwise, between the upper and lower limit of the range and any other stated or intervening value in that stated range, is encompassed. The upper and lower limits of these small ranges which may independently be included in the smaller rangers is also encompassed, subject to any specifically excluded limit in the stated range. Where the stated range includes one or both of the limits, ranges excluding either or both of those included limits are also included.

Many modifications and other embodiments set forth herein will come to mind to one skilled in the art to which this subject matter pertains having the benefit of the teachings presented in the foregoing descriptions and the associated drawings. Therefore, it is to be understood that the subject matter is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A polycrystalline film comprising:

a) a first composition of formula $FA_{1-x}Cs_xBX_3$; wherein,

FA is formamidinium;

x is between 0 and 1; and

B is at least one metal cation; and b) a second composition of CsX, FAX, $REX_3$, or $REX_2$; wherein, RE is a rare earth ion; and X, in each instance, is at least one halide.

2. The polycrystalline film of claim 1, wherein:

a) said first composition is of formula $FA_{1-x}Cs_xPbI_3$; and b) said second composition is of formula CsI, FAI, $REI_3$, or $REI_2$.

3. The polycrystalline film of claim 1, wherein said film comprises said second composition of CsX, FAX, $REX_3$, or $REX_2$ in about a 0.01 mol % to about 10 mol % ratio relative to said first composition of formula $FA_{1-x}Cs_xBX_3$.

4. The polycrystalline film of claim 3, wherein said film comprises said second composition in about a 0.01 mol % to about 2 mol % ratio relative to said first composition.

5. The polycrystalline film of claim 3, wherein said film comprises said second composition in about a 0.01 mol % to about 0.5 mol % ratio relative to said first composition.

6. The polycrystalline film of claim 3, wherein said film comprises said second composition in about a 0.25 mol % ratio relative to said first composition.

7. The polycrystalline film of claim 1, wherein said rare earth ion is selected from the group consisting of samarium, europium, terbium, cerium, and ytterbium.

8. The polycrystalline film of claim 7, wherein said rare earth ion is samarium or ytterbium.

9. The polycrystalline film of claim 1, wherein said second composition is CsX or FAX.

10. The polycrystalline film of claim 1, wherein B is selected from the group consisting of lead, tin, cadmium, germanium, zinc, nickel, platinum, palladium, mercury, titanium, silicon, and a mixture thereof.

11. The polycrystalline film of claim 10, wherein B is lead.

12. The polycrystalline film of claim 1, wherein X, in each instance, is $I^{-1}$.

13. The polycrystalline film of claim 1, wherein x is between 0.01 and 0.50.

14. The polycrystalline film of claim 1, wherein x is between 0.01 and 0.10.

15. The polycrystalline film of claim 1, wherein x is 0.08.

16. The polycrystalline film of claim 1, wherein said first composition is of formula $FA_{0.92}Cs_{0.08}PbI_3$, wherein said second composition is of FAI or CsI, and wherein said film comprises said second composition in about a 0.25 mol % ratio relative to said first composition of $FA_{0.92}Cs_{0.08}PbI_3$.

17. The polycrystalline film of claim 1, further comprising one or more additives selected from the group consisting of formamidinium chloride, phenylethylammonium chloride, and formamidinium hypophosphite.

* * * * *